US012699486B2

(12) United States Patent
Lahutsik et al.

(10) Patent No.: US 12,699,486 B2
(45) Date of Patent: Aug. 4, 2026

(54) KEYBOARD

(71) Applicant: Clevetura LTD, Limassol (CY)

(72) Inventors: Yury Lahutsik, Limassol (CY);
Dzmitry Zakreuski, Limassol (CY);
Mikhail Krupiankou, Limassol (CY);
Yury Litvak, Limassol (CY); **Vasily
Borysyonok, Limassol (CY); Raman
Sakovich, Limassol (CY); Siarhei
Kostevitch**, Limassol (CY)

(73) Assignee: Clevetura LTD, Limassol (CY)

( * ) Notice: Subject to any disclaimer, the term of this
patent is extended or adjusted under 35
U.S.C. 154(b) by 0 days.

(21) Appl. No.: 19/380,607

(22) Filed: Nov. 5, 2025

(65) Prior Publication Data

US 2026/0064228 A1     Mar. 5, 2026

Related U.S. Application Data

(63) Continuation of application No. 17/777,005, filed as
application No. PCT/EP2020/082166 on Nov. 13,
2020.

(30) Foreign Application Priority Data

| | | | |
|---|---|---|---|
| Nov. 15, 2019 | (BY) | .................................... | 20190285 |
| Nov. 15, 2019 | (BY) | .................................... | 20190325 |
| Oct. 19, 2020 | (GB) | .................................... | 2016579 |
| Oct. 19, 2020 | (GB) | .................................... | 2016585 |
| Oct. 19, 2020 | (GB) | .................................... | 2016586 |
| Oct. 19, 2020 | (GB) | .................................... | 2016587 |
| Oct. 19, 2020 | (GB) | .................................... | 2016589 |

(51) Int. Cl.

| | |
|---|---|
| *G06F 3/041* | (2006.01) |
| *G06F 3/02* | (2006.01) |
| *G06F 3/0354* | (2013.01) |
| *G06F 3/044* | (2006.01) |
| *H03K 17/96* | (2006.01) |

(52) U.S. Cl.
CPC ........ *G06F 3/04186* (2019.05); *G06F 3/0213*
(2013.01); *G06F 3/03547* (2013.01); *G06F
3/0446* (2019.05); *H03K 17/9622* (2013.01);
*G06F 3/0443* (2019.05); *G06F 2203/04103*
(2013.01)

(58) Field of Classification Search
CPC .. G06F 3/04186; G06F 3/0446; G06F 3/0213;
G06F 3/03547; G06F 3/0443; G06F
2203/04103; H03K 17/9622
See application file for complete search history.

(56) References Cited

U.S. PATENT DOCUMENTS

| | | |
|---|---|---|
| 8,754,854 B1 | 6/2014 | Hamburgen et al. |
| 8,760,273 B2 | 6/2014 | Casparian et al. |
| | (Continued) | |

FOREIGN PATENT DOCUMENTS

| | | |
|---|---|---|
| CN | 201465031 U | 5/2010 |
| CN | 202694270 U | 1/2013 |
| | (Continued) | |

*Primary Examiner* — Deeprose Subedi
(74) *Attorney, Agent, or Firm* — Hodgson Russ LLP

(57) ABSTRACT

There is described a touch sensor for a keyboard, the touch
sensor comprising one or more holes. Also described is a
keyboard comprising the touch sensor as well as methods of
manufacturing the touch sensor and the keyboard.

20 Claims, 37 Drawing Sheets

(56) References Cited

U.S. PATENT DOCUMENTS

| | | | |
|---|---|---|---|
| 9,230,753 B2 | 1/2016 | Chen | |
| 10,353,485 B1 | 7/2019 | Zhang et al. | |
| 10,732,728 B1 | 8/2020 | Sunshine et al. | |
| 11,150,741 B1 | 10/2021 | Stoeckli et al. | |
| 11,221,683 B2 | 1/2022 | Kamepalli et al. | |
| 11,221,715 B2 | 1/2022 | Nam et al. | |
| 11,463,090 B2 | 10/2022 | You et al. | |
| 2003/0025679 A1 | 2/2003 | Taylor et al. | |
| 2008/0309638 A1 | 12/2008 | Tatehata | |
| 2009/0046065 A1 | 2/2009 | Liu et al. | |
| 2011/0298699 A1 | 12/2011 | Goto et al. | |
| 2012/0306756 A1 | 12/2012 | Lin et al. | |
| 2013/0063285 A1 | 3/2013 | Elias | |
| 2013/0135211 A1 | 5/2013 | Chiang et al. | |
| 2014/0092060 A1 | 4/2014 | Hsieh et al. | |
| 2015/0153838 A1 | 6/2015 | Wang | |
| 2015/0185869 A1 | 7/2015 | Chng et al. | |
| 2018/0217668 A1 | 8/2018 | Ligtenberg et al. | |
| 2018/0284904 A1 | 10/2018 | Chen et al. | |
| 2020/0012354 A1* | 1/2020 | Cho | G09G 5/08 |
| 2020/0371626 A1 | 11/2020 | Mugiraneza et al. | |
| 2022/0147156 A1 | 5/2022 | Hyun et al. | |
| 2022/0252471 A1 | 8/2022 | Liimatta et al. | |

FOREIGN PATENT DOCUMENTS

| | | | |
|---|---|---|---|
| CN | 202720583 U | 2/2013 | |
| CN | 102778958 B | 5/2015 | |
| CN | 106330163 A | 1/2017 | |
| EP | 1832961 A2 | 9/2007 | |
| EP | 3327555 A1 | 5/2018 | |
| KR | 20130092267 A | 8/2013 | |
| KR | 20140063149 A | 5/2014 | |
| WO | 2016183510 A1 | 11/2016 | |
| WO | 2019181086 A1 | 9/2019 | |

* cited by examiner

2000

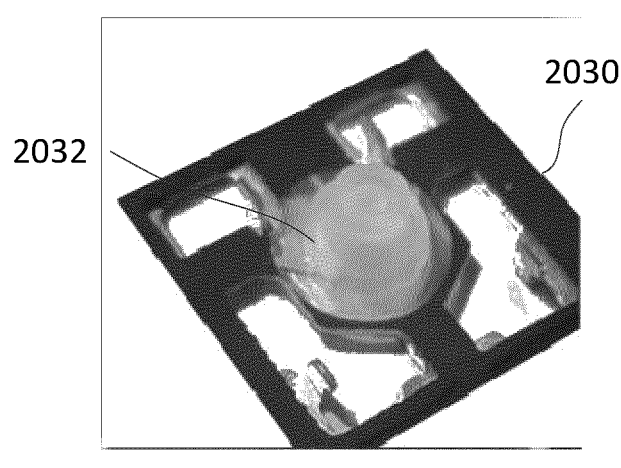
Figure 5b
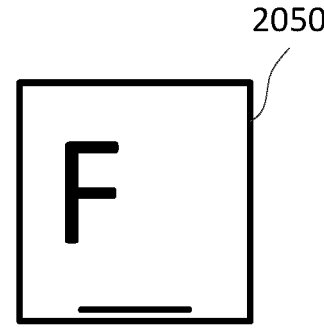
Figure 5c
Figure 5d

2060 shift

2060

2050

2068-1

2066

2068-2

2068-3

110

2010

2010

2010

2060

2070

2040

2050

2060

2060

2060

2060

2020

6000

6002 6004 6006     6008

6002

6008

6008

6002

KEYBOARD

CROSS-REFERENCE TO RELATED APPLICATIONS

The present application is a continuation of U.S. patent application Ser. No. 17/777,005, filed on May 13, 2022, which is a National Phase entry of International Patent Application No. PCT/EP2020/082166, filed on Nov. 13, 2020, which claims priority to United Kingdom Application No. GB 2016585.8, filed on Oct. 19, 2020, United Kingdom Application No. GB 2016586.6, filed on Oct. 19, 2020, United Kingdom Application No. GB 2016587.4, filed on Oct. 19, 2020, United Kingdom Application No. GB 2016579.1, filed on Oct. 19, 2020, United Kingdom Application No. GB 2016589.0, filed on Oct. 19, 2020, Belarus Application No. 20190285, filed on Nov. 15, 2019, and Belarus Application No. 20190325 filed on Nov. 15, 2019, the disclosures of each of which are incorporated herein by reference.

FIELD OF THE DISCLOSURE

The present disclosure relates to a keyboard. In particular the present disclosure relates to a touch sensor for a keyboard, a key pressing mechanism, a keyboard, a method of manufacturing a touch sensor and a keyboard, and methods of using a keyboard.

BACKGROUND TO THE DISCLOSURE

A typical method of controlling the operation of computer devices is to use a keyboard and/or a touchpad. These components enable a user to interact with a computer, e.g. to send instructions to a processor. Ideally, these components are user-friendly; however, present keyboards and touchpads have a number of flaws.

A particular problem is that in order to use a conventional touchpad after typing a user must move a hand from the keyboard to the touchpad. In order to begin typing again at full speed, the user must move this hand back from the touchpad to the keyboard. While this movement can be quite quick, it is likely to be repeated thousands of times over the course of a year, which can lead to a significant cumulative time and focus requirement. Therefore, it can be beneficial to integrate a touch sensor with a keyboard to reduce the need for this movement. However, this integration can lead to a keyboard that lacks user friendliness and is bulky.

A solution to this problem is desired.

SUMMARY OF THE DISCLOSURE

Cams

According to an aspect of the present disclosure, there is described: a key pressing mechanism comprising: a first lever comprising a pin; a second lever comprising a hole; wherein the first lever and the second lever are arranged to be attached by placing the pin of the first lever in the hole of the second lever; wherein the hole of the second lever is of an elongated shape, so that the pin of the first lever is able to move along the hole of the second lever in the direction of a first axis A-A.

Preferably, the hole is of an oblong and/or oval shape.

Preferably, the hole is sized so as to prevent movement of the pin along the direction of a second axis B-B, the second axis B-B being perpendicular to the first axis A-A.

Preferably, the first lever and the second lever are arranged to form an angle of less than 180 degrees in a raised state and an angle of greater than 180 degrees in a depressed state.

Preferably, the hole is sized so that the pin abuts a side of the hole when a/the keycap is in a/the depressed state.

Preferably, the hole and/or the pin comprises a low friction material.

Preferably, the hole and/or the pin are arranged so that the friction between the hole and the pin varies as the pin moves along the hole.

According to another aspect of the present disclosure, there is described: a key pressing mechanism comprising: a mounting plate; a first lever attached to the mounting plate at a first plate mounting point; and a second lever attached to the mounting plate at a second plate mounting point; wherein the first lever and the second lever are joined by a neck; and wherein the first lever and the second lever are arranged to rotate respectively about the first plate mounting point and the second plate mounting point.

Preferably, the neck is arranged to deform as the first lever and the second lever rotate. Preferably, the neck is arranged to elastically deform.

Preferably, the neck has a smaller cross-sectional area than the first lever and/or the second lever.

Preferably, the neck comprises a material of a stiffness lower than the stiffness of a material of the first lever and/or the second lever.

Preferably, the first lever, the second lever, and the neck comprise an integral component.

Preferably, the first lever, the second lever, the neck, and the mounting plate comprise an integral component.

Preferably, the neck comprises a hole for the passage of a transmittal mechanism.

Preferably, the first plate mounting point and the second plate mounting point are located at and/or along an edge of the first lever and the second lever respectively. Preferably, the edge is an edge opposite the neck.

Preferably, the mounting plate is arranged to restrict and/or prevent translational movement about the first plate mounting point and the second plate mounting point Preferably, the neck is arranged to deform as the first lever and the second lever are moved away from a raised position. Preferably, the neck is arranged to provide a resistive force as the first lever and the second lever are moved away from the raised position.

Preferably, the neck is arranged to resist movement away from the raised position for a first range of positions and then not to resist movement away from the raised position for a second range of positions. Preferably, the second range of positions is further from the raised position than the first range of positions.

Preferably, the key pressing mechanism comprises an intermediate position between the first range of positions and the second range of positions. Preferably, the key pressing mechanism is arranged to provide an audible sound and/or a change in feel in relation to the key pressing mechanism passing through the intermediate position.

Preferably, the key pressing mechanism is arranged to provide a return force that acts to move the first lever and the second lever to a raised position. Preferably, the return force is lower in the second range of positions than in the first range of positions.

Preferably, the return force increases as the first lever and the second lever are moved away from the raised position through the first range of positions. Preferably, the return force decreases as the first lever and the second lever are moved away from the raised position through the second range of positions.

Preferably, the first plate mounting point and the second plate mounting point are located in proximity to an edge of a/the keycap.

Preferably, the first lever and the second lever are located between the keycap and the mounting plate in both a/the raised state and a/the depressed state.

Preferably, the first lever and the second lever are located between a plane of keycap and a plane of the mounting plate in both a/the raised state and a/the depressed state.

Preferably, the key pressing mechanism further comprises a keycap. Preferably, a first keycap attachment of the first lever is attached to the keycap at a first keycap mount and a second keycap attachment of the second lever is attached to the keycap at a second keycap mount.

Preferably, a/the keycap is arranged to be moveable between a raised state and a depressed state. Preferably, the key pressing mechanism is biased towards the raised state.

Preferably, in the raised position, the first lever and the second lever define an acute angle in the direction of the base of key pressing mechanism.

Preferably, in the depressed position the first lever and the second lever define an obtuse angle in the direction of the base of key pressing mechanism.

Preferably, the keycap comprises a protrusion. Preferably, the protrusion is arranged to activate a keypress sensor.

Preferably, the protrusion comprises a conductive material.

Preferably, the first keycap mount and the second keycap mount are arranged so as to prevent translational movement of the elements of the first keycap attachment and the second keycap attachment.

Preferably, the first keycap mount and/or the second keycap mount is arranged so as allow translational movement of the first keycap attachment and/or the second keycap attachment in a single direction. Preferably, the single direction is a direction parallel to the surface of the keycap.

Preferably, the first lever and the second lever are arranged to rotate respectively about the first keycap mount and the second keycap mount.

Preferably, the first keycap mount and the second keycap mount are located no more than 1 mm from the edge of the keycap along the radial axis, and preferably no more than 0.2 mm from the edge.

Preferably, the keypress mechanism comprises a mounting plate wherein a first plate attachment of the first lever is attached to the mounting plate at a first plate mount and a second plate attachment of the second lever is attached to the mounting plate at a second plate mount.

Preferably, the first plate attachment and the second plate attachment are fixed respectively at the first plate mount and the second plate mount so as to prevent translational movement.

Preferably, the first plate mount and/or the second plate mount comprises a non-continuous hole.

Preferably, the first plate attachment and the first mount are arranged to fit together via a snap-fit and/or an interference fit.

Preferably, the attachments between the first plate mount and the first plate attachment and the second plate mount and the second plate attachment comprise continuous attachments.

Preferably, the first plate attachment and/or the second plate attachment comprises a material of different stiffness and/or cross-section than the remainder of the first lever and/or the second lever.

Preferably, the first plate mount and/or the second plate mount is arranged to provide a resistive force as the first lever and the second lever are moved away from a raised position.

Preferably, the first plate mount and/or the second plate mount is arranged to bias the first lever and the second lever towards the raised position.

Preferably, the first plate mount and/or the second plate mount is arranged to enable translation movement of the first plate attachment and/or the second plate attachment in a single direction. Preferably, the single direction is a direction parallel to the surface of a/the keycap.

Preferably, the first lever and the second lever are arranged to rotate respectively about the first plate mount and the second plate mount.

Preferably, the first plate mount is located closer to the centre of the keycap than the first keycap mount in the radial axis of the keycap and/or the second plate mount is located closer to the centre of the keycap than the second keycap mount in the radial axis of the keycap.

Preferably, the first plate mount and the second plate mount are located no more than 1 mm from the centre of the keycap along the radial axis, and preferably no more than 0.2 mm from the centre of the keycap.

Preferably, the first lever and the second lever are arranged so that throughout the travel of the keycap the only points of contact of the first lever and the second lever on the mounting plate are respectively at the first plate attachment point and the second plate attachment point.

Preferably, the first plate mount and the second plate mount are raised above the mounting plate.

Preferably, the keypress mechanism further comprises a movement sensor arranged to detect a movement of the a/keycap.

Preferably, the movement sensor comprises a dome (e.g. a silicone dome) that is arranged to be impacted by the keycap when pressure is applied to the keycap.

Preferably, the movement sensor comprises a/the protrusion on the keycap. Preferably, the protrusion is arranged to interact with one or more of: a touch sensor; a proximity sensor; and a capacitive sensor to operate a movement sensor.

Preferably, the movement sensor is arranged to bias the keycap towards the raised position.

Preferably, the key first lever and the second lever are arranged to be spaced from a/the mounting plate in both of a raised position and a depressed position.

Preferably, in a depressed position the first plate mount is arranged to be further from a/the mounting plate than the first keycap mount.

Preferably, a/the mounting plate comprises recesses arranged to receive a part of a/the keycap.

Preferably, the key pressing mechanism is arranged to bias a/the keycap towards a/the raised position.

Preferably, the key pressing mechanism further comprises reinforcement. Preferably, the reinforcement comprises a metal bracket.

According to another aspect of the present disclosure, there is described a keyboard comprising the aforesaid key pressing mechanism.

According to another aspect of the present disclosure, there is described an apparatus comprising a plurality of the aforesaid key pressing mechanisms, wherein the key pressing mechanisms have different dimensions and/or sizes.

Preferably, the total contact area of the first plate mounting point and/or the second plate mounting point is substantially the same for each key pressing mechanisms.

Preferably, the total neck area is substantially the same for each key pressing mechanism.

Preferably, the key pressing mechanisms comprise different material compositions and/or different cross-sections to provide a consistent return force for differently sized and/or shaped keycaps.

Touch Sensor

According to another aspect of the present disclosure, there is described a touch sensor for a keyboard, wherein the touch sensor comprises one or more holes.

Preferably, the holes are arranged so as to allow the passage of light from a backlight layer.

Preferably, the holes are arranged so as to allow the passage of a transmittal mechanism that is depressed when one of the keys is pressed.

Preferably, the holes are arranged so as to allow the passage of a connection structure for connecting components to either side of the touch sensor. Preferably, the holes are arranged so as to allow the passage of a connection structure for connecting a keypress mechanism to a base plate.

Preferably, the holes are arranged so as to allow the drainage of water.

Preferably, the keyboard comprises a plurality of holes, the holes preferably being of different sizes. Preferably, the size of each hole depends on a purpose of that hole.

Preferably, the touch sensor comprises a capacitive touch sensor.

Preferably, the touch sensor comprises a plurality of rows and columns of sensor elements. Preferably, the sensor elements are electrodes.

Preferably, the holes are arranged in dependence on the sensor elements. Preferably, the holes are arranged so as not to disrupt the operation of the sensor elements.

Preferably, the holes are arranged so as to not overlap the edges of the sensor elements.

Preferably, the holes are arranged so as to be contained entirely within the sensor elements.

Preferably, the holes are arranged so as to not overlap any intersection of two or more sensor elements.

Preferably, the holes are arranged in a regular pattern. Preferably, the holes are arranged in a rhombus pattern.

Preferably, the holes are arranged in a regular pattern across the entirety of the touch sensor.

Preferably, the holes are arranged in a regular pattern across a part of the touch sensor.

Preferably, the holes are arranged in dependence on a pattern of keys on a keyboard.

Preferably, the touch sensor further comprises one or more transmittal mechanisms arranged to deform when pressed. Preferably, the transmittal mechanisms are arranged in dependence on the sensor elements and/or the holes. Preferably, the transmittal mechanisms are located on top of at least a subset of the holes. Preferably, a part of each transmittal mechanism is arranged to pass through a hole when a corresponding keycap is depressed.

Preferably, the holes and/or sensor elements are arranged in dependence on the transmittal mechanisms.

Preferably, the touch sensor comprises a single sheet of material. Preferably, the single sheet is sized so as to cover a plurality of keys on a/the keyboard.

According to another aspect of the present disclosure, there is described a keyboard comprising the aforesaid touch sensor.

Preferably, the keyboard further comprises a base layer. Preferably, the base layer comprises one or more mounts. Preferably, the mounts, and/or components arranged to connect to the mounts, are arranged to pass through at least a subset of the holes of the touch sensor.

Preferably, the keyboard further comprises a backlight. Preferably, light from the backlight is arranged to pass through at least a subset of the holes of the touch sensor.

Preferably, the keyboard further comprises one or more transmittal mechanisms. Preferably, the transmittal mechanisms are arranged to pass through at least a subset of the holes of the touch sensor. Preferably, each transmittal mechanism is arranged to pass through a corresponding hole of the touch sensor.

Preferably, the keyboard further comprises at least one of: one or more keypress sensors; one or more keypress mechanisms; and one or more keycaps.

Preferably, the keyboard further comprises a keypress sensor layer. Preferably, the keypress sensor layer comprises holes. Preferably, the holes of the keypress sensor layer are concentric with the holes of the touch sensor layer.

KFC

According to another aspect of the present disclosure, there is described: a keyboard comprising: a plurality of keys; wherein each of the keys comprises a keypress mechanism that is operated when the key is pressed.

Preferably, the keyboard further comprises a base layer comprising a plurality of mounts; wherein the keypress mechanisms are attached to the base layer via the mounts.

Preferably, the mounts comprise hook mounts and/or holes for receiving an attachment structure.

Preferably, the keyboard further comprises a keypress sensor layer for detecting the movement of the keys.

Preferably, the keypress sensor layer is located between the base layer and the keypress mechanisms;

Preferably, the mounts pass through the keypress sensor layer.

According to another aspect of the present disclosure, there is described a keyboard comprising: a plurality of keys, wherein each of the keys comprises a keypress mechanism that is operated when the key is pressed; a keypress sensor layer for detecting the movement of the keys; and a touch sensor located between the keypress sensor layer and the keypress mechanisms.

Preferably, the keyboard comprises a base layer. Preferably, the keypress sensor layer is located between the base layer and the touch sensor.

According to another aspect of the present disclosure, there is described a keyboard comprising: a plurality of keys, wherein each of the keys comprises a keypress mechanism that is operated when the key is pressed; a base layer comprising a plurality of mounts; and a keypress sensor layer for detecting the movement of the keys, wherein the keypress sensor layer is located between the base layer and the keypress mechanisms.

Preferably, the keyboard further comprises a touch sensor.

Preferably, the touch sensor comprises a capacitive sensor. Preferably, the touch sensor comprises a projected capacitive sensor.

Preferably, the capacitive sensor comprises a plurality of rows and columns of electrodes.

Preferably, the touch sensor is located between the keys and the base layer.

Preferably, the keypress mechanisms are attached to the base layer via the mounts Preferably, the mounts are arranged to pass through the touch sensor.

Preferably, the touch sensor comprises holes arranged to allow passage of a transmittal mechanism attached to the keys.

Preferably, the touch sensor is arranged so that the holes do not interrupt the rows or columns of the electrodes. Preferably, the holes are located entirely internally to the electrodes.

Preferably, the and/or a keypress mechanism is mounted on a keypress mounting layer, the keypress mounting layer being located between the touch sensor and the keys.

Preferably, a/the transmittal mechanism is mounted on the touch sensor.

Preferably, the keyboard further comprises a ground layer. Preferably, the ground layer is between the keypress sensor layer and a/the touch sensor.

Preferably, the keyboard further comprises a protective layer above the touch sensor. Preferably, the protective layer comprises double-sided tape.

Preferably, the keyboard comprises a keypress mechanism mounting layer. Preferably, the keypress mechanism mounting layer is located above a/the touch sensor. Preferably, the keypress mounting layer is attached to the touch sensor using double-sided tape.

Backlight

According to another aspect of the present disclosure, there is described the aforesaid keyboard, further comprising a backlight layer.

Preferably, the backlight layer is integrated with, and/or is a part of, the touch sensor. Preferably the touch sensor comprises one or more lighting elements arranged to provide a backlight.

Preferably, the touch sensor is integrated with, and/or is a part of, the backlight layer.

According to another aspect of the present disclosure, there is described a keyboard comprising: a plurality of keys; and a backlight layer; wherein the backlight layer is integrated with the touch sensor.

According to another aspect of the present disclosure, there is described a keyboard comprising: a plurality of keys; and a backlight layer; wherein the backlight layer is located above the touch sensor so as to protect the touch sensor.

Preferably, the backlight layer comprises a transparent material.

Preferably, the backlight layer comprises a rigid material.

Preferably, the backlight layer comprises one or more optical elements arranged to provide light. Preferably, the optical elements are located internally to backlight layer.

Preferably, the backlight layer comprises one or more light guiding elements arranged to direct light through and/or around the keys.

Preferably, the backlight layer comprises an opaque portion arranged to block the passage of light.

Preferably, the backlight layer is located adjacent the base layer. Preferably, the backlight layer is located further from the keys than the base layer.

Preferably, the backlight layer is located between the base layer and the keys.

Preferably, the backlight layer is located between the touch sensor and the keys.

Preferably, the backlight layer is located above the touch sensor so as to protect the touch sensor.

According to another aspect of the present disclosure, there is described a keyboard comprising: a plurality of keys; a touch sensor for detecting the touch of a user on the keys; and a backlight layer comprising one or more optical elements.

Preferably, the backlight layer is located above the touch sensor so as to protect the touch sensor.

Preferably, the mounts pass through the backlight layer.

Preferably, the backlight layer comprises holes arranged to allow passage of a transmittal mechanism attached to the keys.

Preferably, the touch sensor comprises a plurality of holes. Preferably, the holes are arranged to enable the passage of light through the touch sensor and/or the passage of a/the transmittal mechanism attached to the keys.

Preferably, the touch sensor is arranged so that the holes do not interrupt the rows or columns of the electrodes. Preferably, the holes are located entirely internally to the electrodes.

PTL

Preferably, the touch sensor is arranged so that each keycap relates to an integer number of rows and columns electrodes.

According to another aspect of the present disclosure, there is described a keyboard comprising: a plurality of keys; and a touch sensor for detecting the touch of a user on the keys comprising rows and columns of electrodes; wherein the touch sensor is arranged so that each keycap relates to an integer number of rows and columns electrodes.

Preferably, the keyboard is arranged such that there are gaps between two or more of the keys and/or keycaps. Preferably, each key and/or keycap and a corresponding gap relates to an integer number of rows and columns of electrodes.

Preferably, the touch sensor is suitable for a keyboard that comprises gaps between two or more keys of the keyboard. Preferably, the touch sensor is arranged so that each key and a corresponding gap relates to an integer number of rows and columns of electrodes.

Preferably, the touch sensor is arranged so that the edges of one or more keycaps of the keyboard do not overlap an intersection of the electrodes Preferably, the touch sensor is arranged so that a shift between two rows of the keyboard is equal to a multiple of an electrode interval and/or to an integer number of electrode intervals.

Preferably, two or more of the keycaps of the keyboard relate to the same pattern of electrodes.

Preferably, the pattern of electrodes is dependent on the size of the keycaps of the keyboard.

Preferably, the sensor elements are arranged in a plurality of regular patters, preferably wherein the plurality of patterns relate to different arrangements of keys on the keyboard.

Preferably, the sensor elements are arranged in different patterns in different areas of the keyboard, preferably wherein the spacing of the electrodes is dependent on the size of the keys in each area.

Preferably, the touch sensor is arranged so that in use a transmittal mechanism relating to a keycap is aligned with the centre of an electrode.

Preferably, the touch sensor is arranged so that in use a transmittal mechanism relating to a keycap is aligned with an intersection of the rows and columns of electrodes.

Preferably, the touch sensor is arranged so that in use a coating relating to a keycap is aligned with the centre of an electrode.

Preferably, the touch sensor is arranged so that in use a transmittal mechanism relating to a keycap is aligned with an intersection of the rows and columns of electrodes.

MOS

Preferably, the keyboard is arranged to detect a keypress relating to the keys using the touch sensor.

According to another aspect of the present disclosure, there is described a keyboard comprising: a plurality of keys; and a touch sensor for detecting the touch of a user on the keys; wherein the keyboard is arranged to detect a keypress relating to the keys using the touch sensor.

According to another aspect of the present disclosure, there is described a method of detecting a keypress on a keyboard comprising a touch sensor, the method comprising detecting a keypress relating to the keys using the touch sensor.

Preferably, the touch sensor comprises a capacitive sensor.

Preferably, the touch sensor comprises a mutual capacitance sensor. Preferably, the touch sensor comprises a plurality of rows and columns of electrodes.

Preferably, the touch sensor is arranged so that the intersections of the rows and columns are beneath the keys.

Preferably, the keyboard comprises a coating, wherein the coating is arranged to move relative to the touch sensor when a key is pressed. Preferably the coating is arranged on a component of the keyboard. Preferably the coating is arranged on a key of the keyboard.

Preferably, each key comprises a coating such that when a key is pressed the corresponding coating moves relative to the touch sensor. Preferably each key relates to and/or comprises a plurality of coating elements.

Preferably, the touch sensor is arranged to detect a movement of the coating. Preferably, the touch sensor is arranged to detect a change in a local electric field caused by the movement of the coating.

Preferably, the coating is arranged on a/the transmittal mechanism of the keys.

Preferably, the coating is arranged on: an exterior surface, an interior surface, and/or a tip of the transmittal mechanism, preferably wherein the transmittal layer comprises a dome.

Preferably, the coating comprises a conductive coating and/or a metal coating.

Preferably the keyboard is arranged to detect a keypress based on a movement of the coating and/or based on a change in conductivity caused by a movement of the coating.

Preferably, the coating is arranged to interact with the touch sensor so as to enable the detection of the keypress.

Preferably, the coating is arranged to cause a substantial alteration in the local electric field around the touch sensor when the key is depressed so as to enable the detection of the keypress.

Preferably, the touch sensor is arranged so that the keys approach and/or impact the touch sensor when the keys are depressed.

Preferably, the touch sensor is arranged so that the coating approaches and/or impacts the touch sensor when the keys are depressed.

Preferably, the keyboard further comprises a controller for distinguishing between the touch of a user and the keypress.

Preferably, in order to distinguish between the touch of a user and the keypress, the controller is arranged to determine at least one of: a magnitude of a change measured by the touch sensor; a duration of a change measured by the touch sensor; a rate of a change measured by the touch sensor; a direction of a movement measured by the touch sensor; and a mode of the keyboard.

Preferably, the controller is calibrated to determine at least one of: a baseline output; an output corresponding to a touch input; and an output corresponding to a keypress.

SLS

According to another aspect of the present disclosure there is described a keyboard as aforesaid, further comprising: a touch sensor for detecting a touch of the user on the keys; and a controller for detecting and/or driving a signal for another component of the keyboard in dependence on a signal relating to the touch sensor.

According to another aspect of the present disclosure, there is described a keyboard, comprising: a touch sensor for detecting a touch of the user on the keys; and a controller for detecting and/or driving a signal for another component of the keyboard in dependence on a signal relating to the touch sensor.

Preferably, the other component comprises a keypress sensor for detecting a depression of one or more keys of the keyboard.

Preferably, the controller is arranged to drive the signal in relation to a frequency and/or time period of the signal of the touch sensor.

Preferably, the controller is arranged to detect a signal in relation to the other component at a time not overlapping with a time of driving a signal for the touch sensor.

Preferably, the controller is arranged to alternately detect a signal in relation to the other component and drive a signal in relation to the touch sensor.

Preferably, the controller is arranged to detect a signal in relation to a row and/or column of the other component at a time not overlapping with a time of driving a signal for a corresponding row and/or column of the touch sensor.

Preferably, the controller is arranged to alternately detect a signal in relation to a row and/or column of the other component and drive a signal in relation to a corresponding row and/or column of the touch sensor.

Preferably, the controller is arranged to alternately detect a signal in relation to a row and/or column of the other component and drive a signal in relation to a corresponding row and/or column of the touch sensor.

Preferably, the controller is arranged to: drive a signal to a line of the touch sensor at a first time, and detect a signal in another line of the touch sensor that depends on the driven signal; and detect a signal from a line of the other component at a second time, wherein the second time is different to the first time.

Preferably, the driven signal is arranged to induce and/or affect a signal in the other line of the touch sensor.

Preferably, the first time and the second time are selected so that the driven signal does not substantially affect a reading taken in relation to the line of the keypress sensor. Preferably, the first time and the second time are selected so that a current induced in the line of the other component by the driven signal is beneath a current threshold, preferably a threshold of 1 Amps, more preferably 0.1 Amps, yet more preferably 0.01 Amps, still more preferably 0.001 Amps.

Preferably, the first time and the second time are separated by at least 0.5 s, at least 0.1 s, at least 0.05 s, at least 0.01 s, at least 0.005 s, at least 0.001 s, at least 0.0005 s, and/or at least 0.0001 s.

Preferably, the controller is arranged to: drive a signal to a line of the touch sensor at a third time, and detect a signal in another line of the touch sensor that depends on the driven signal; and detect a signal from a line of the other component at a fourth time, wherein the second time is different to the first time.

Preferably, the difference between the third time and the first time is the same as the distance between the fourth time and the second time.

Preferably, the other component comprises an optical element and/or a backlight.

Preferably, the keyboard is arranged to drive a signal in relation to a further component in dependence on the signal relating to the touch sensor.

Preferably, the keyboard further comprises one or more buttons for executing a function of a pointer. Preferably, the buttons are separated from a/the touch sensor.

Preferably, the keyboard further comprises a controller for determining a mode of the keyboard.

Preferably, the touch sensor and the keypress sensor are provided in a single component, preferably a PCB component.

Preferably, the keycaps comprise transmittal mechanisms.

Preferably, the keycaps comprise a flexible and/or deformable material.

Preferably the keyboard comprises a first, preferably rigid, part and a second, preferably deformable, part, the first part comprising a/the touch sensor and the second part comprising a/the keycaps.

Preferably, the first part comprises the keypress sensor.

Preferably, the second part comprises a/the transmittal mechanisms. Preferably, the transmittal mechanisms are a part of the keycaps.

NOD

Preferably, the keyboard comprises a key plate comprising one or more keys.

According to another aspect of the present disclosure, there is described a key plate comprising one or more keys.

Preferably, the key plate comprises a plurality of keys.

Preferably, each key is attached to the key plate along a subset of the perimeter of said key.

Preferably, each key is attached to the key plate along only a single side of said key.

Preferably, each key is attached to the key plate along a short side of said key.

Preferably, each key is attached to the key plate along each short side of said key.

Preferably, each key is attached to the key plate along a plurality of sides of said key, preferably a plurality of opposing sides.

Preferably, each key is attached to the key plate along each of the sides of said key, preferably along a subset of each of the sides of said key Preferably, the key plate is arranged such that each key remains level with or beneath an upper plane of the key plate in both a raised position and a depressed position.

Preferably, the key plate is arranged such that each key is level with an upper plane of the key plate in a raised position.

Preferably, the attachment between each key and the key plate comprises one or more of: a section of decreased cross sectional area, e.g. as compared to the remainder of the key plate and/or the key; a section of different material; and a section of reduced stiffness.

Preferably, each key is arranged to be resiliently depressible, such that the key can be moved between a/the raised position and a/the depressed position without substantial plastic deformation.

Preferably, the key plate comprises a plurality of keys, preferably wherein the attachment between a first subset of the keys and the key plate differs from the attachment between a second subset of the keys and the key plate.

Preferably, the key plate comprises a flat plate.

Preferably, the key plate comprises a flat plate when each of the keys is in a raised position.

Preferably, the keys are formed as an integral part of the key plate.

Preferably, the keys are removably attached to the key plate.

Preferably, the keys are arranged to be biased towards a raised position.

Preferably, the keys are arranged to provide a return force that acts to move said keys to a/the raised position if moved away from the raised position.

Preferably, the keys are resiliently deformable away from a/the raised position.

Preferably, the key plate is formed of plastic and/or metal.

Preferably, the keyboard comprises one or more key stops arranged to limit the travel of the one or more keys.

According to another aspect of the present disclosure, there is described a key plate comprising one or more integral keys, wherein the key plate comprises a flat plate; and wherein each key is attached to the key plate along only a single side of said key.

Mode Switching

Preferably, the keyboard further comprises a means for enabling a user to define a function and/or mode of the keyboard. Preferably, the function is dependent on a mode of the keyboard.

According to another aspect of the present disclosure there is described a keyboard comprising: a plurality of keys; a touch sensor for detecting the touch of a user on the keys; and a controller for detecting an input from one of the keys and/or the touch sensor based on a mode of the keyboard.

Preferably, the controller is arranged to determine a mode of the keyboard based on a list of possible modes. Preferably, the list of possible modes comprises at least one of: a touch mode; a pointer input mode; a keypress mode; a scrolling mode; a word processing mode; a graphics editing mode; and a gaming mode.

Preferably, the controller is arranged to switch the keyboard between a plurality of modes based on a user input.

Preferably, the user input is one or more of: a keypress; a plurality of keypresses; a combination of keypresses; and a touch input.

Preferably, the user input comprises a gesture.

Preferably, switching the mode comprises determining whether an input relates to a mode switching input.

Preferably, switching the mode comprises determining whether an input relates to a function in the current mode.

Preferably, switching the mode comprises determining whether an input relates to a function in a mode other than the current mode.

Preferably, switching the mode comprises determining that an input relates to a function in a mode other than the current mode and also that the input does not relate to a function in the current mode.

According to another aspect of the present disclosure, there is described a keyboard as aforesaid comprising a key pressing mechanism as aforesaid.

Method of Manufacture

According to another aspect of the present disclosure, there is described a keyboard comprising a touch sensor as aforesaid.

According to another aspect of the present disclosure, there is described a method of manufacturing a touch sensor as aforesaid.

According to another aspect of the present disclosure, there is described a method of manufacturing a key pressing mechanism as aforesaid.

According to another aspect of the present disclosure, there is described a method of manufacturing a keyboard as aforesaid.

According to another aspect of the present disclosure, there is described a method of manufacturing a touch sensor comprising: forming a touch sensor; and forming holes in the touch sensor.

According to another aspect of the present disclosure, there is described a method of manufacturing a keyboard comprising: providing a plurality of keys, wherein each of the keys comprises a keypress mechanism that is operated when the key is pressed; providing a base layer; and providing a keypress sensor layer for detecting the movement of the keys; wherein the keypress sensor layer is located between the base layer and the keypress mechanisms.

Preferably, forming the touch sensor comprises forming a grid of sensor elements. Preferably, forming the touch sensor comprises forming a grid of electrodes.

Preferably, forming the holes comprises forming the holes in dependence on the location of the sensor elements. Preferably, the holes are formed so as to not overlap the edges of the sensor elements sensor elements.

Preferably, forming the holes comprises forming holes of different sizes.

Preferably, the method further comprises affixing one or more transmittal mechanisms to the touch sensor.

According to another aspect of the present disclosure, there is described a method of manufacturing a keyboard comprising a base plate and a touch sensor.

Preferably, the method comprise adding an adhesive layer to the base plate and/or the touch sensor.

Preferably, the method comprises heating the base plate and/or the touch sensor.

Preferably, the method comprises removing air bubbles from the touch sensor.

Preferably, the method comprises pressing together two or more layers of the keyboard.

Preferably, the method comprises passing an attachment mechanism through a hole in the touch sensor. Preferably, the method comprises passing an attachment mechanism through the hole so as to mount a/the keypress mechanism of the keyboard on the base plate of the keyboard.

Preferably, the method comprises mounting one or more keypress mechanisms to a component of the keyboard, preferably mounting one or more keypress mechanisms to the base plate and/or a mechanism mounting plate.

Preferably, the method comprises attaching one or more keycaps to the keypress mechanisms.

Preferably, the method comprises aligning the keycaps with the transmittal mechanisms.

Preferably, the method comprises aligning a backlight with at least a subset of the holes of the touch sensor.

Preferably, the method comprises forming a key plate comprising a plurality of keys.

According to another aspect of the present disclosure, there is described a method of manufacturing a key plate comprising a plurality of keys.

Preferably, the method comprises forming a key plate comprising a plurality of integral keys.

Preferably, the method comprises cutting a key plate so as to form a plurality of keys.

Preferably, the method comprises engraving characters on one or more keys.

Mode Switching

According to an aspect of the present disclosure, there is described a method of switching a keyboard between modes, comprising: identifying an input relating to at least one of: a keypress; a gesture; and an action relating to a computer device connected to the keyboard; determining whether the input relates to a function for a current mode; determining whether the input relates to a function for a further mode; and switching the keyboard to the further mode in dependence on the input.

Preferably, determining whether the input relates to a function for a further mode comprises determining whether the input relates to a mode-switching function for the further mode.

Preferably, the method comprises determining whether the input relates to a function for a plurality of further modes, and switching the keyboard to one of the further modes in dependence on the input.

Preferably, switching the mode depends on at least one of: the present mode; a position of a hand and/or finger of the user; a previous mode; a previous activity of the user; a previous input; an application open on the computer device; and a time of day.

Preferably, the input comprises at least one of: a signal relating to an application on the computer device; a signal indicating an application has been opened; a signal indicating an application has been closed; a signal indicating an application has been maximized; and a signal indicating an application has been minimized.

Preferably, the input comprises at least one of: a combination of keypresses; a series of keypresses; a combination of gestures; a series of gestures; and a gesture relating to a movement of a hand of a user.

Preferably, the method comprises identifying a user of the keyboard and switching the keyboard to the further mode in dependence on the user.

Preferably, identifying a user comprises detecting a login relating to the user.

Preferably, the method comprises determining whether the input comprises an unintended or inadvertent input. Preferably, the determination comprises analysis of a time, direction, and/or speed of a gesture. Preferably, the determination comprises analysis of a pattern of gestures and/or a number of fingers used for a gesture.

Preferably, the determination comprises use of an artificial intelligence and/or machine learning algorithm.

According to another aspect of the present disclosure, there is described a method of defining a mode of a keyboard comprising a touch sensor, the method comprising: defining one or more conditions for entering the mode; defining one or more touch areas that are useable in the mode; and defining one or more gestures that operate functions in the mode.

Preferably, the method comprises defining an indication that shows the locations of the touch areas.

Preferably, the indication comprises a colour of a backlight.

Preferably, the conditions comprise at least one of: a signal received from an application associated with the mode; an input by a user; and a gesture by a user.

Preferably, defining one or more gestures comprises detecting a movement using the touch sensor and recording this movement.

Preferably, defining one or more touch areas comprising defining a starting area and a finishing area for each touch area.

Preferably, the method comprises providing feedback to the user. Preferably, the method comprises providing visual feedback and/or tactile feedback. Preferably, the method comprises providing vibration.

Preferably, feedback is provided before the input is registered and/or following the registering of the input.

Preferably, the feedback comprises an indication of a magnitude of a gesture. Preferably, the feedback comprises a slider and/or a range indicator.

Preferably, the feedback is dependent on a current mode of the keyboard.

Preferably, the method further comprises providing one or more operable elements on a display of the keyboard. Preferably, the method comprises providing visual feedback to the user, wherein the function of the one or more operable elements depends on the feedback.

Preferably, the gestures include one or more of: a half-circle gesture, preferably to open a tool menu; a swiping menu, preferably to select an option from a list or range; and a combination and/or sequence of gestures.

Preferably, the function of a gesture depends on one or more of: an area and/or a key on which a gesture is performed; a current mode of the keyboard; a direction of the gesture; a speed of the gesture; the object and/or finger performing the gesture.

According to another aspect of the present disclosure, there is described a combined input device having a composite unit, a control unit, a power supply unit, and a transceiver unit, located in one housing, wherein the composite unit consists of the following layers: bottom substrate, keyboard membrane, sensor, domes, adhesive, keyboard scissors fixation, keyboard scissors and keycaps, moreover the sensor layer is connected by an adhesive layer with the layer of keyboard scissors mount, and located above the layer of the keyboard membrane, and in all layers there are concentric holes, and the first rows is form by the electrodes located on the upper layer of the sensor along the wide side of the keyboard, moreover the electrical connection of which is located on the lower layer of the sensor, and the second rows is form by the second electrodes, located together with the electrical connection lines on the upper layer of the sensor along the narrow side of the keyboard.

The bottom substrate may comprise a base layer. The keyboard scissors may, more generally, comprise a keypress mechanism.

Preferably, the keyboard unit is made as a plurality of keys with at least one control unit, which are designed to fix the pressing of, at least, one key, each of which is movable to act on the layer of the keyboard membrane, and contains a corresponding key cap and sensor layer.

Preferably, the sensor unit is a matrix of receiving and transmitting channels, formed by electrodes and interconnected by electric lines.

Preferably, the layer of the keyboard membrane is made in the form of at least one dielectric substrate with a printed pattern of conductive lines.

Preferably, the control unit consists of at least one processor for scanning the keyboard membrane layer and/or the sensor layer and processing the received data and transmitting it to the receiving device.

According to the present disclosure, there is described a device that is a keyboard comprising a keyboard module and a control unit. The purpose of the device is to detect when one or several moving keys of the keyboard module are pressed, to detect one or several touches of the key surface done by user, and to transfer information to the endpoint device.

According to the present disclosure, there is described a combined information input device that contains a case that contains a composite unit, a control unit, a receiving unit, and a power supply. The composite unit contains a layer of keyboard caps, a layer of keyboard scissors, a layer of keyboard scissors, an adhesive layer, a layer of keyboard domes, a touch layer, a layer of keyboard membranes, and a layer of the bottom substrate. The first electrodes are located along the wide side of the sensor layer, and the second electrodes are located along the narrow side of the sensor layer. In all layers of the composite block there are concentric holes.

In an example of a combined information input device all of the keys are moveable, and the touch layer is located under the layer of key caps. Typically, every layer above the touch layer does not contain metallic parts. The keyboard membrane layer in combination with a control unit captures the pressing of each of the keys. All of the blocks and layers of the device are fastened into a single structure. The touch layer is made using the technology of the membrane sensor and together with the control unit is designed to detect the position or movement of at least one body part of touch device.

The keyboard membrane is located under the touch sensor; in order to enable operation of the device, every layer of the device comprises concentric holes (e.g. to allow the keyboard membrane to be operated thorough these layers). On the upper surface of the sensor layer is a matrix of rows and columns of electrodes, made in the form of diamonds except for the first and last electrodes in a row or column, these are made in the form of half a diamond. This location of the receiving and transmitting electrodes enables the use of a high sensor scanning frequency, which improves the quality of the sensor. The control unit is responsible for processing data from the keyboard membrane layer and touch layer. The control unit consists of a processor that scans the keyboard and/or touch layer, processes the data and transmits it to the receiving device.

When a key is pressed, the pressure on the key cap moves a silicone dome underneath the key cap. The dome presses on the layer of the keyboard membrane, which is a dielectric material with a conductive pattern applied thereon. The control unit scans the keyboard membrane layer and detects key presses based on the pressure applied by the domes.

In the absence of a user pressing the keys, there is no transmission on the keyboard membrane. When the key of the transmitting and receiving lines of the keyboard membrane is mimicked, the control unit alerts the signal on the receiving line. Next the control unit processes the received signal to eliminate false positives.

When released, the silicone dome works as a return spring returning the key cap to the original position.

The touch layer comprises electrodes connected to channels that form transmitting and receiving channels. Before operation, the control unit is calibrated. The control unit scans the touch sensor by sending a signal to the transmitting channels. An electromagnetic field is formed around the transmitting electrodes, which is imposed on the receiving electrodes. The control unit registers the level of the signal on the receiving electrodes, which is fixed as a calibration measure. When a touch occurs on the surface of the keys, the level of the signal on the receiver electrodes changes at the touch point. The control unit captures signal changes, compares these to calibration data, processes them, and generates a signal that is interpretable by the receiver; this is transmitted to the data channel.

The control unit is arranged to identify a signal from the touch layer and choose an appropriate mode for the keyboard. When the user accidentally presses the keys, the control unit handles (e.g. disregards) this action.

When the user deliberately presses a key, the control unit identifies this press, blocks the signals from the touch sensor, and transmits only the signal of the relevant keypress to the receiver. If the control unit detects short movements on the surface of the keys that do not correspond to the control pattern of the touchpad, it blocks them and does not transmit control signals to the receiver.

All keyboard module keys can move and can be pressed. A touch-sensitive part (touch sensor) is located under the keys and key scissors. The sensor's area of detection is determined by specifics of the keyboard module (presence of large metallic parts in keys, etc.), and by work logic (for example, whether the touch area is specified to be under all keys or only under right or left hand, etc.).

The control unit receives and processes data from the keyboard membrane and touch sensor layer. The control unit can consist of specialized microcircuits that perform scanning of keyboard membrane and/or touch sensor, processing of received data, and transfer of received data to the endpoint device, or the control unit can consist of a microcontroller or other microprocessor performing all functions described earlier in the sentence. The control unit can perform sequential scanning of a single or multiple lines of keyboard membrane, and of one or several lines of the sensor, or it can scan them simultaneously.

The keyboard module is a set of layers, which are connected between each other, are made of different materials, and serve different functional purposes.

As an example, the layers may include

1. Base plate
2. Keyboard membrane
3. Touch Sensor
4. Keyboard domes
5. Adhesive layer
6. Mounts of keyboard scissor (plastic plate)
7. Keyboard scissors
8. Keycaps The lowest layer is a rigid plate. It can be made of various hard materials, such as metal, plastic, textolite, etc. It provides rigidity to the entire construction. It can also bind all layers of the keyboard module. If needed, it can contain multiple holes to provide backlight for the keyboard module.

The keyboard membrane, in combination with the microcircuit (that is part of the control unit), serves the purpose of registering the state of being pressed for each of the keys of the keyboard. The keyboard membrane consists of a single or multiple layers of polyethylene film (PET) or other material with a pattern of conducting lines traced on it, joined and bound to form a single unit. The conducting lines form transmitting and receiving channels. For connection with the control unit, conducting lines are traced on a flexible PCB connected to a printed circuit board, or, alternatively, a microcircuit (that is part of the control unit) can be installed directly on the keyboard membrane. If needed, the membrane can contain multiple holes to provide backlight for the keyboard module.

The keyboard membrane in combination with the control unit scans for key presses. In order to do this, the microchip sequentially sends voltage pulses to transmitting conducting lines of the keyboard membrane. The action of silicone dome striker causes transmitting and receiving conducting lines to close. Closing of one or several transmitting and receiving conducting lines causes voltage impulses on receiving lines, which are processed by the microchip. In accordance with the position of the key on the keyboard field and membrane, the processing unit identifies the key that is pressed. The control unit processes the incoming signals and makes a decision on sending a symbol to the endpoint device, based on the closed key.

The touch sensor is a single or multilayer flexible circuit board, or something different, made from polyethylene film or a different material. The purpose of the touch sensor is, together with the control unit, to determine the position of the touch points above/on the surface of the keys of the keyboard module. The touch sensor layer has multiple holes, some of which provide normal operation of the keyboard membrane (holes for silicone dome strikers), others allow to bind the entire keyboard unit together, and, if needed, it can have multiple additional holes for illumination of the keyboard module.

The touch sensor consists of a matrix of electrodes, which are bound together in channels, which comprise transmitting and receiving channels. In combination with the sensor, the control unit operates using projected-capacitive technology. Before starting operation, the control unit is calibrated. The control unit scans the sensor matrix. It sends a signal, channel-by-channel, to the transmitting channels. An electromagnetic field is formed around the transmitting electrodes and is induced on the receiving electrodes. The control unit registers a signal on the receiving electrodes that is registered as a calibration signal. During operation, as the user moves their finger over the surface of the keys, the level of signal on receiving electrodes changes. The control unit registers the signal changes, compares them with calibration data, processes them, and generates a sequence that will be understood by the endpoint device.

Over the layer of domes is placed a plastic plate. This is a plate made from non-conducting material that is attached, non-removably, to the sensor layer, using, for example, glue or double-sided adhesive tape. The plastic plate can contain special constructions, such as hooks and holes, and fulfill the function of holding the keyboard scissors and/or other keyboard pressing mechanisms.

Each keyboard key comprises: a keycap, a silicone dome, and keyboard scissors. When a user presses a key, the keycap transmits pressure to the silicone dome, which interacts with the keyboard membrane.

Silicon domes are installed on the touch sensor layer. They fulfill the function of a return mechanism (aka spring) for keys, and close (connect or press top layer to bottom layer) the circuit on the keyboard membrane. Closing of circuits happens either due to the dome striker pushing through membrane layers, or by closing conducting lines of keyboard membrane with the conducting striker of silicone dome. Generally, the keyboard domes are made from silicon.

Keyboard scissors are a mechanism made from plastic or other non-conducting material for the purpose of holding and moving keycaps. Each keyboard scissors consist of a flat outside frame (matching in form to the corresponding cell of the plastic plate grid), spring-connected with a flat internal frame, which connects to the internal surface of the keycap in order to provide the keycap's springy return to its initial position after it is stopped being pressed, and in order to keep it in an un-pressed state.

Keycaps are caps, made from plastic or another non-conducting material, with fixtures for the flat internal frame of the keyboard scissors, situated on their internal surface, and made for convenient key pressing and sliding of fingers over the surface of keys.

The keyboard module, if needed, can contain a layer that provides backlight. The backlight layer can be placed under the bottom plate, or membrane layer, or touch sensor layer, or plastic plate. The backlight can also be a part of the plastic plate layer.

Any feature described as being carried out by an apparatus, an application, and a device may be carried out by any of an apparatus, an application, or a device. Where multiple apparatuses are described, each apparatus may be located on a single device.

Any feature in one aspect of the disclosure may be applied to other aspects of the invention, in any appropriate combination. In particular, method aspects may be applied to apparatus aspects, and vice versa.

Furthermore, features implemented in hardware may be implemented in software, and vice versa. Any reference to software and hardware features herein should be construed accordingly.

Any apparatus feature as described herein may also be provided as a method feature, and vice versa. As used herein, means plus function features may be expressed alternatively in terms of their corresponding structure, such as a suitably programmed processor and associated memory.

It should also be appreciated that particular combinations of the various features described and defined in any aspects of the disclosure can be implemented and/or supplied and/or used independently.

The disclosure also provides a computer program and a computer program product comprising software code adapted, when executed on a data processing apparatus, to perform any of the methods described herein, including any or all of their component steps.

The disclosure also provides a computer program and a computer program product comprising software code which, when executed on a data processing apparatus, comprises any of the apparatus features described herein.

The disclosure also provides a computer program and a computer program product having an operating system which supports a computer program for carrying out any of the methods described herein and/or for embodying any of the apparatus features described herein.

The disclosure also provides a computer readable medium having stored thereon the computer program as aforesaid.

The disclosure also provides a signal carrying the computer program as aforesaid, and a method of transmitting such a signal.

The disclosure extends to methods and/or apparatus substantially as herein described with reference to the accompanying drawings.

The disclosure will now be described, by way of example, with reference to the accompanying drawings.

DESCRIPTION OF THE DRAWINGS

FIG. 5*a*-5*d* show further layers of the keyboard that may be included in the keyboard.

FIGS. 16*a*-16*c* show the keypress mechanism of FIG. 11 being moved between the raised position and the depressed position.

FIGS. 28*a*-281 show exemplary layers that can form a part of the keyboard.

DESCRIPTION OF THE PREFERRED EMBODIMENTS

Figure 1:
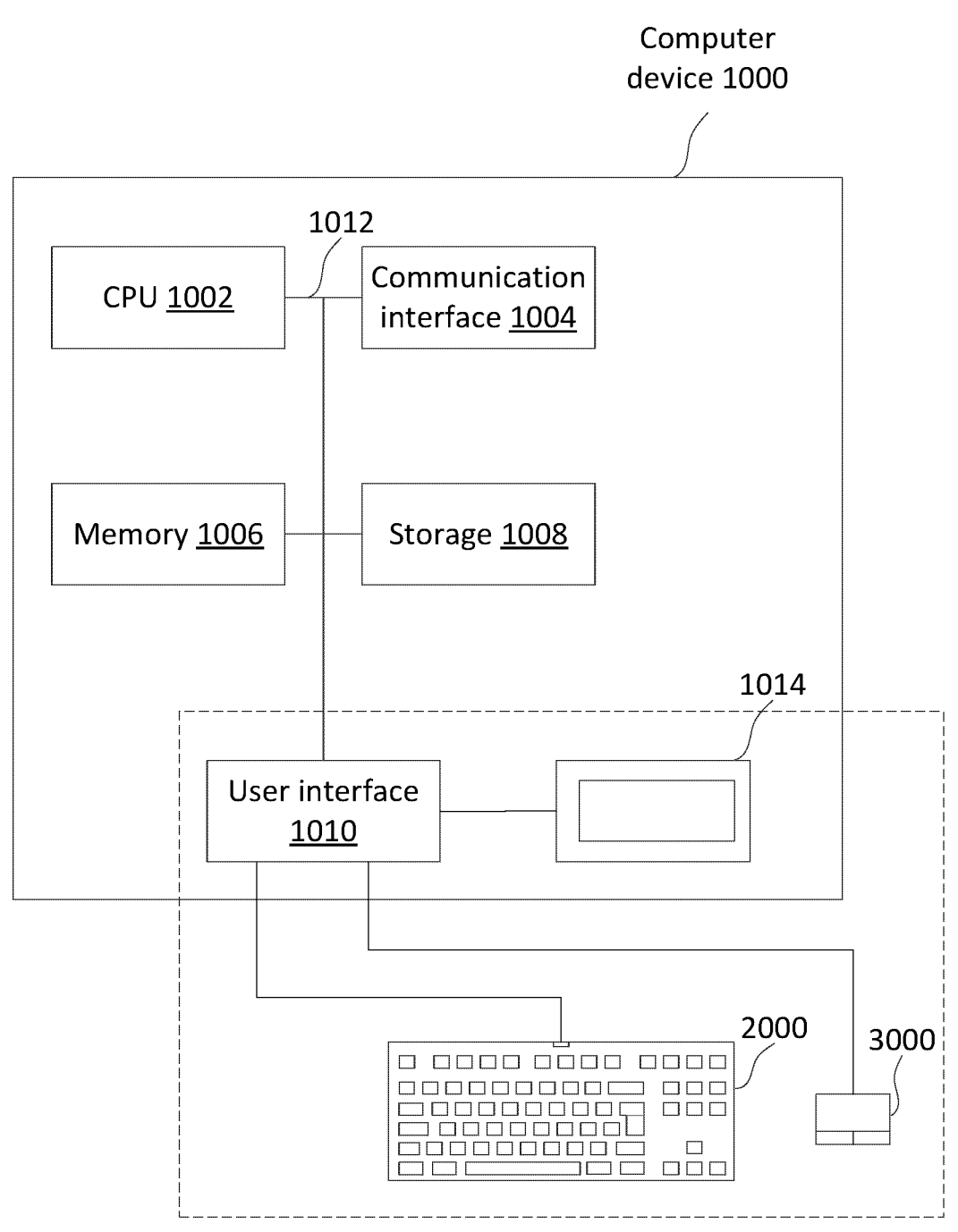
FIG. 1 shows an exemplary user device with which the apparatus described herein may be used.

Referring to FIG. 1, there is shown an exemplary computer device 1000.

The computer device 1000 comprises a processor in the form of a CPU 1002, a communication interface 1004, a memory 1006, storage 1008, and a user interface 1010, where the components are connected by a bus 1012. The user interface 1010 typically comprises a display 1016 and one or more input/output devices; in this embodiment the user interface 1010 comprises a keyboard 2000 and a pointer input 3000.

The CPU 1002 executes instructions, including instructions stored in the memory 1006 and the storage 1008.

The communication interface 1004 is typically a Bluetooth® interface that enables the computer device 1000 to be coupled with other devices comprising a Bluetooth® interface. It will be appreciated that the communication interface 1004 may comprise any other communications technology, such as an area network interface and/or an Ethernet interface. The communication interface 1004 may comprise a wireless interface or a wired interface, such as a universal serial bus (USB) interface.

The memory 1006 stores instructions and other information for use by the CPU 1002. Typically, the memory 1006 usually comprises both Random Access Memory (RAM) and Read Only Memory (ROM).

The storage 1008 provides mass storage for the computer device 1000. Depending on the computer device 1000, the storage 1008 is typically an integral storage device in the form of a hard disk device, a flash memory or some other similar solid state memory device, or an array of such devices.

The user interface 1012, and in particular the keyboard 2000 and the pointer input 3000 are used to control the computer device 1000, where these components enable the user to pass instructions to the CPU 1002. Typically, the pointer input comprises a touch sensor and/or a computer mouse.

The keyboard 2000 and the pointer input 3000 may be integrated with the computer device 1000 or may be removable components. For example, the keyboard 2000 and the pointer input 3000 may be connected to the computer device 1000 by an, optionally removable, wire, such as a USB connection In some embodiments, the keyboard 2000 and/or the pointer input 3000 is wirelessly connected to the computer device 1000, for example using a Bluetooth® connection.

The present disclosure relates, in part, to a combined keyboard and pointer input, where a pointer input means (e.g. a touchpad) is integrated with the keyboard 2000. As an example, a capacitive sensor may be integrated with the keyboard 2000, where the capacitive sensor detects when the user touches the keys of the keyboard 2000.

It will be appreciated that as well as capacitive sensors other technologies can be used to detect a user touching the keys of the keyboard 2000. As an example, optical sensors may be used, where these optical sensors may detect movement of an object a certain distance from the keyboard 2000 and/or touchpad 3000. Similarly, pressure sensors may be used, where the pressure sensors may be included in the keys of the keyboard 2000 or placed above/below the keys. In various embodiments, the touch sensor comprises one or more of: a camera; acoustic sensors; temperature sensors; magnetic sensors (e.g. Hall sensors); piezoelectric sensors; and triboelectric sensors.

Figure 2:
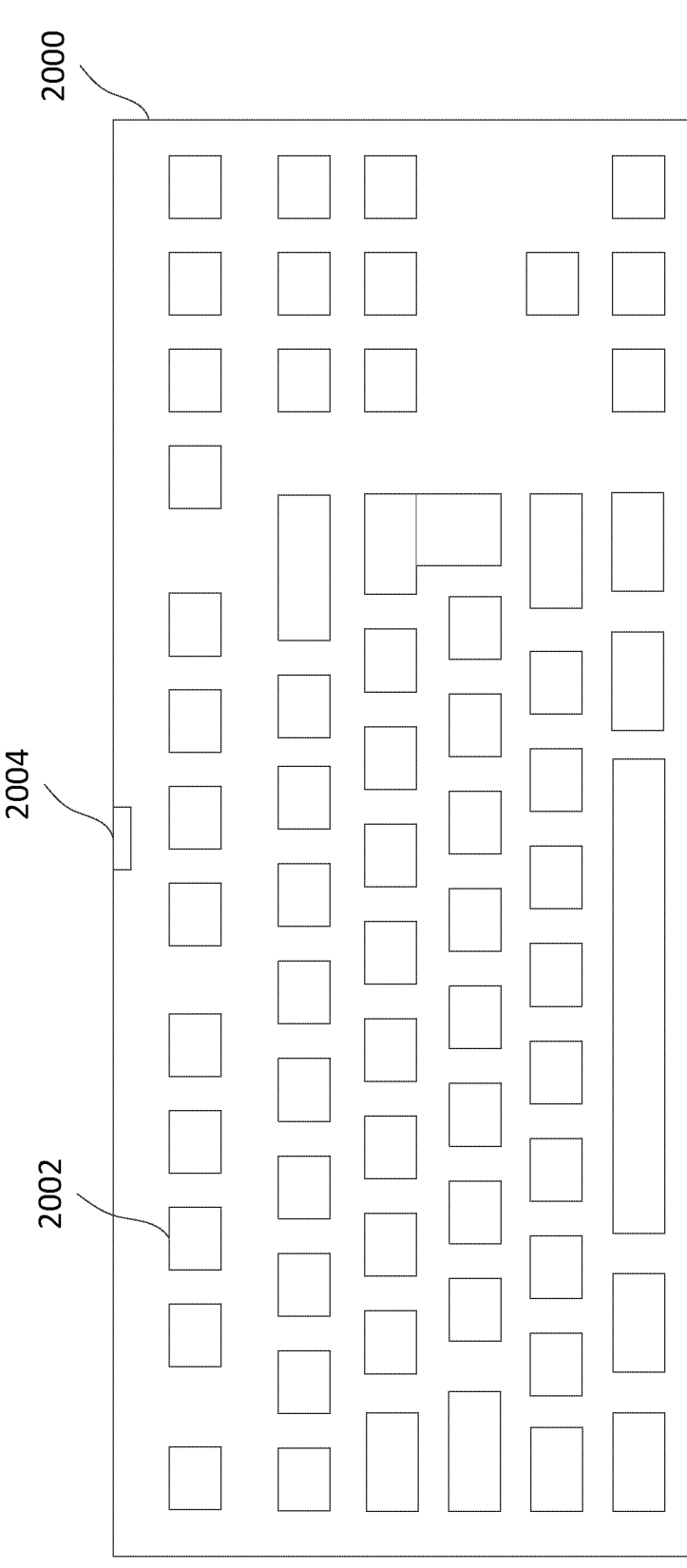
FIG. 2 shows a keyboard.

Referring to FIG. 2, the keyboard 2000 is shown in more detail.

The keyboard 2000 comprises a number of keys 2002 and a connection interface 2004. The keys 2002 are arranged to detect a user input, e.g. from a user pressing the keys 2002. The connection interface 2004 is arranged to connect the keyboard to the computer device 1000. The connection interface 2004 may comprise a USB connection, a Bluetooth® interface, or a radio interface (e.g. at 2.4 GHz or 5 GHz).

In some embodiments, the keyboard 2000 comprises a computer device and/or comprises components similar to the computer device 1000. In particular, the keyboard 2000 may comprise a processor, a communication interface, a memory, storage, and/or a user interface. This enables the keyboard to execute instructions itself (without requiring the assistance of a separate computer device).

It will be appreciated that any layout of keyboard may be used; for example, a full-size keyboard, a 'tenkeyless' keyboard, or a '60%' keyboard. Furthermore, the layout and properties of the keys 2002 on the keyboard 2000 may vary.

Figure 3:
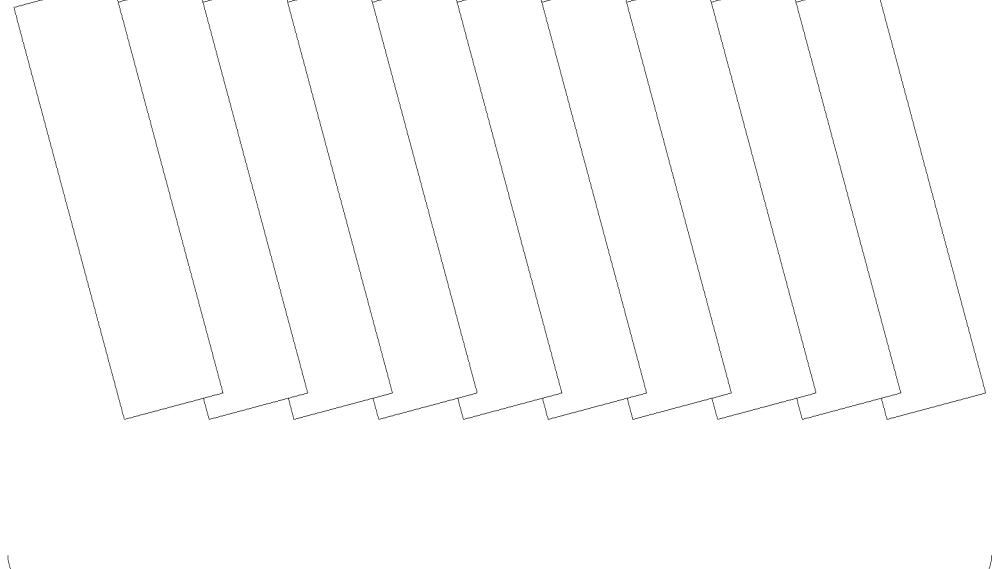
FIG. 3 shows layers of the keyboard.

Referring to FIG. 3, the keyboard 2000 is typically composed of a plurality of layers.

Certain layers that may form a part of the keyboard 2000 are described with reference to FIGS. 4 and 5*a*-5*d*.

Figure 4:
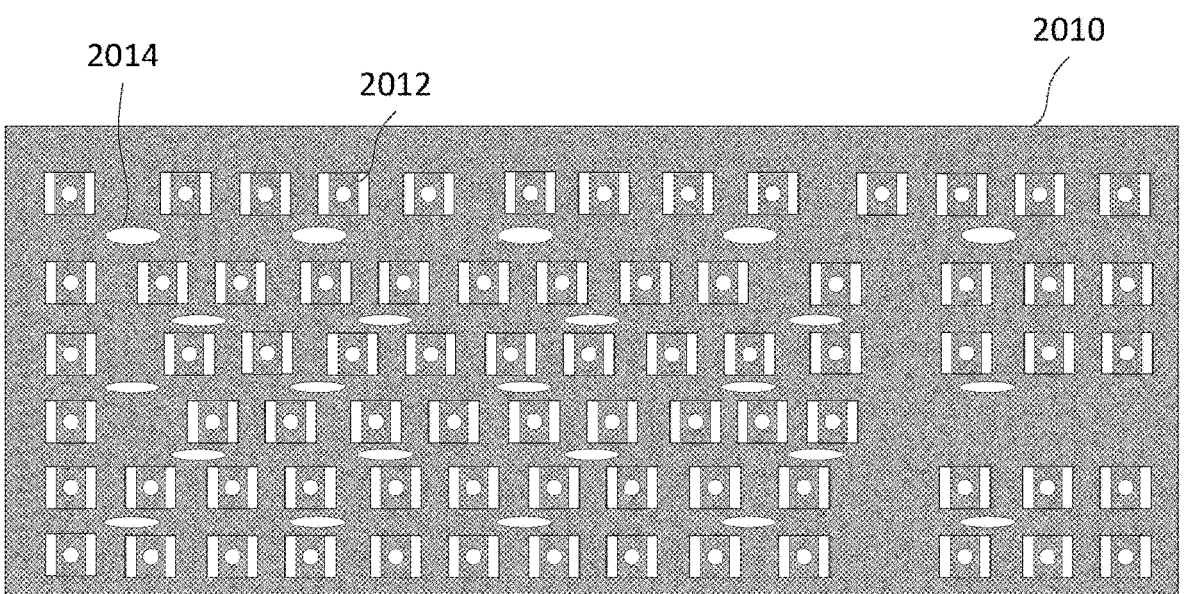
FIG. 4 shows a base plate that may be included in the keyboard.

In particular, referring to FIG. 4, there is disclosed a base plate 2010, is a rigid plate (e.g. made of metal, plastic, or textolite). Typically, the base plate comprises a plurality of hook mounts 2012. The hook mounts 2012 of the base plate 2010 are arranged to pass through each other layer of the keyboard 2000 in order to attach to a keypress mechanism, such as a scissor mechanism. Various other keypress mechanisms may also be used, for example those described with reference to FIGS. 11 to 23. The keyboard 2000 may also comprise a touch sensor (which touch sensor is typically a part of a touch sensor layer); this touch sensor is typically arranged to allow passage of the hook mounts 2012, e.g. by the touch sensor comprising holes through which the hook mounts 2012 can pass.

The hook mounts 2012 typically comprise extensions, which are designed to pass through the other layers in order to fit inside recesses of another layer. Alternatively, the hook mounts 2012 may comprise recesses, into which extensions of another layer are arranged to fit.

In some embodiments, the base plate 2010 comprises holes 2014 to allow the passage of light. This allows a backlight to be located behind the base plate 2010, where this backlight is able to provide a light that passes through the holes 2014 of the base plate 2010.

The base plate 2010 is a rigid structure that is typically formed of metal; this provides rigidity to the entire keyboard 2000.

Referring to FIGS. 5*a*-5*d*, there are described other layers that may form a part of the keyboard 2000.

Figure 5A:
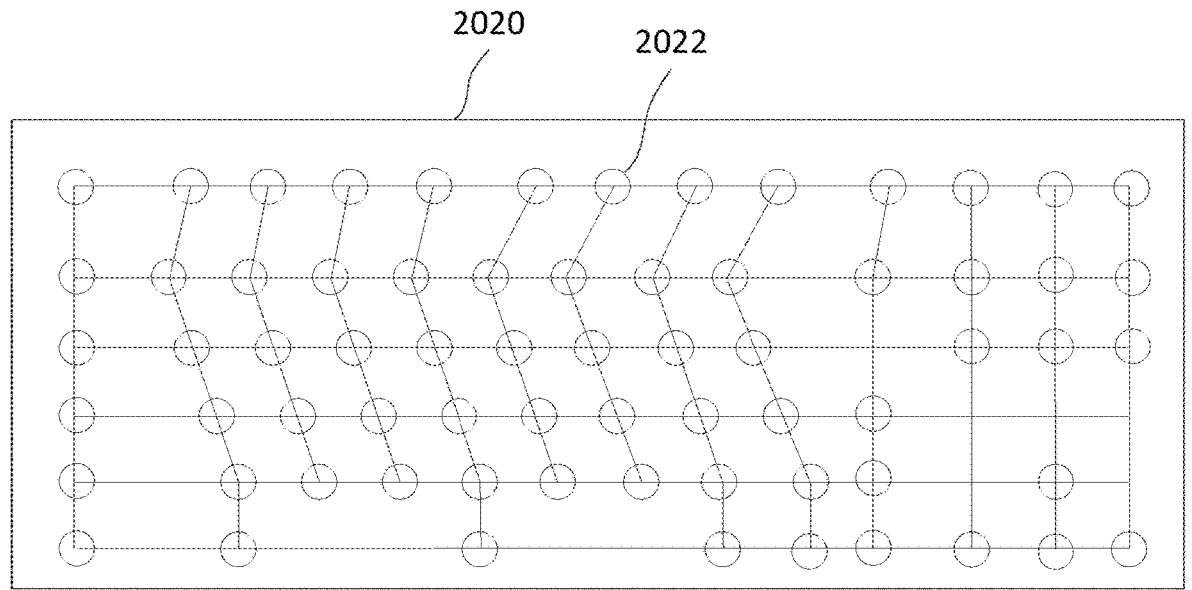

Referring to FIG. 5*a*, there is shown a keypress sensor layer 2020. The keypress sensor layer 2020 is arranged to record keystrokes, e.g. when a user presses the key 2002. Typically, this is achieved by arranging a plurality of sensors 2022 on the keypress sensor layer 2020, where each sensor is arranged to detect the pressing of a single key.

In some embodiments, the keyboard 2000 is a membrane keyboard. In such embodiments, the keypress sensor layer 2020 comprises a series of conductive portions with there being two conductive portions between each key. A further conductive portion is present at the base of the key, so that when the key is pressed the two conductive portions of the keyboard sensor layer 2020 are connected.

In order to determine a keypress, the keyboard 2000 typically comprises a control unit (not shown) that continuously scans the keypress sensor layer 2020 in order to determine the presence of a current. In various embodiments, the scan rate and the scan pattern of the controller differ; e.g. a higher scan rate of the controller may be desirable to reduce the latency of a keypress, but this may reduce accuracy by being more likely to pick up a false keypress.

In some embodiments, the keyboard 2000 is a mechanical keyboard and each key is connected to a separate switch. Pressing a key operates the corresponding switch, thereby a keypress can be detected.

Typically, the keyboard 2000 is a membrane keyboard and the keypress sensor layer 2030 is formed by bonding together one or more polyethylene terephthalate (PET) membranes. The plurality of keypress sensors (e.g. conductive portions) are located within the PET membranes.

Referring to FIGS. 5b-5d, each key 2002 typically comprises a transmittal mechanism 2030, a keypress mechanism 2040, and a keycap 2050. The keycap 2050 enables the user to interact with the remainder of the key 2002; the transmittal mechanism 2030 connects the keycap 2050 to the keypress sensor layer 2020 so that a keypress can be detected; the keypress mechanism 2040 is an optional feature of the key 2002 that is arranged to provide a stable keypress (e.g. ensure that the force resisting a keypress is relatively constant throughout the distance of travel of the key 2002).

The keypress mechanism 2040 also maintains the horizontal position of the keycap 2050 throughout the travel of the key to ensure that the keycap 2050 being pressed (at any location on the keycap 2050) results in a depression of the transmittal mechanism 2030.

Typically, the transmittal mechanisms 2030 are mounted on the touch sensor layer 2020. In some embodiments, the transmittal mechanisms 2030 are arranged so that the depression of a keycap results in a part of a corresponding transmittal mechanism impacting the touch sensor layer 2020. In some embodiments, the transmittal mechanisms 2030 are arranged so that the depression of the keycap 2050 results in a part of a corresponding transmittal mechanism passing through a hole of the touch sensor layer 2020.

Referring to FIG. 5b, there is shown an embodiment of the transmittal mechanisms 2030. In this embodiment, the transmittal mechanisms 2030 comprise a plurality of silicone domes 2032, where there is a silicone dome for each key of the keyboard 2000. The silicone domes 2032 are arranged so that when the user presses a key of the keyboard 2000 a corresponding silicone dome is compressed, and this dome actuates a sensor of the keypress sensor layer 2020. The sensor 2022 is thus able to detect that a key has been pressed. The silicone domes 2032 also cushion the depression of the keys 2002 and provide a return force that raises a key once the user has released pressure on that key.

It will be appreciated that there are a number of other types of transmittal mechanisms may be used to detect the depression of a key, such as metal domes or mechanical linkages (e.g. push switches and/or springs).

Referring to FIG. 5c, there is shown an embodiment of the keypress mechanism 2040, in this embodiment of the keypress mechanism 2040 is a scissor mechanism. The scissor mechanism comprises two interlocking parts that are typically composed of plastic. The interlocking parts are arranged to bias the key 2002 in a raised position and/or to resist the depression of the key 2002. When the user applies pressure to the key 2002, the key 2002 is depressed, which forces the base of each interlocking part away from the base of the other interlocking part so that the key 2002 can be depressed. When the user releases the pressure, the biasing force acts to raise the key 2002. This movement is shown in FIG. 5c.

Referring to FIG. 5d, there is shown a keycap 2050. The keycap 2050 is placed on top of the transmittal mechanism and the keypress mechanism 2040 so that pressure applied to the keycap 2050 is transmitted to the transmittal mechanism 2030 and the keypress mechanism 2040. The keycap 2050 protects the remainder of the layers to minimise wear and increase the lifespan and usability of the keyboard 2000. Typically, each keycap has a different symbol printed onto it, e.g. a letter or a number, to enable the user to determine the consequence of depressing the keycap 2050 (e.g. depressing a keycap 2050 that has "F" printed on it will result in the letter f being typed and shown on the display 1012).

The keypress mechanism 2040 is mounted on a layer of the keyboard 2000, which may be a separate layer to those described above. In typical keyboards the keypress mechanism 2040 is mounted to a layer that is located towards the top of the keyboard 2000, e.g. the keypress mechanism 2040 is mounted to a layer immediately below the level of the keypress mechanisms 2040.

The present disclosure considers, in part, a keyboard in which the hook mounts 2012 on which the keypress mechanisms 2040 are mounted are a part of the base plate 2010. Each other layer of the keyboard 2000 is arranged so that the hook mounts 2012 are able to pass through these layers in order to attach to the keypress mechanisms 2040; in particular, a touch sensor layer is arranged to enable the passage of the hook mounts. The base plate 2010 therefore provides both rigidity for the keyboard 2000 and a mounting means for the keypress mechanisms 2040. This enables each keypress mechanism 2040 to be secured without the need for a separate securing layer, which allows the provision of a thin keyboard.

Touch Sensor

Figure 6A:
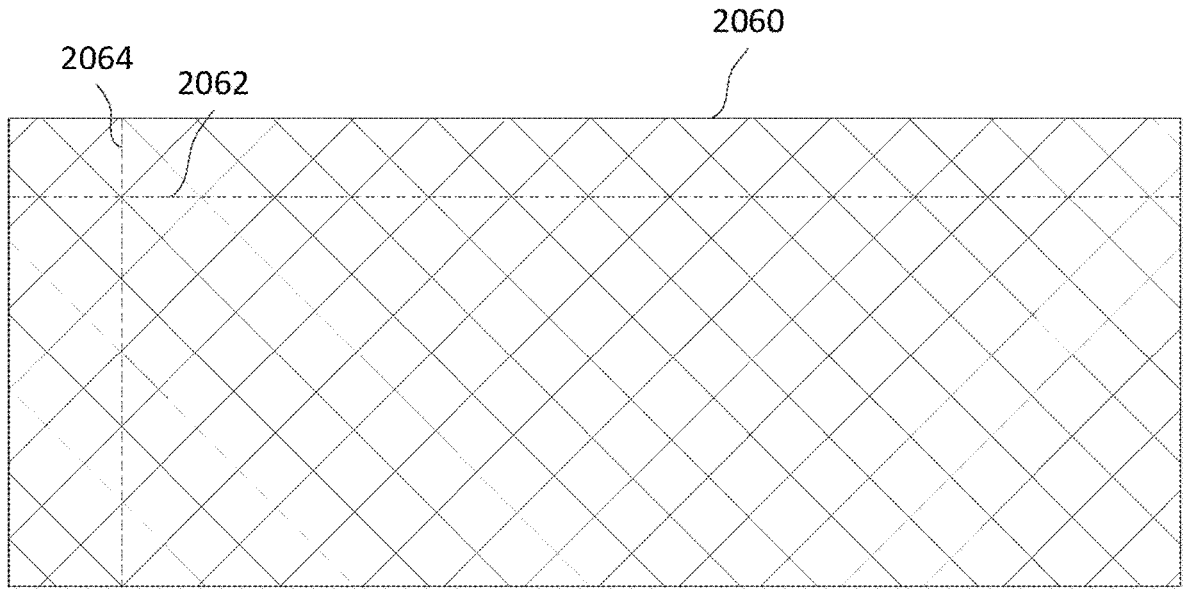
FIG. 6*a* shows a touch sensor that can be used with the keyboard.

Referring to FIG. 6a, there is shown a touch sensor in the form of a touch sensor layer 2060 that is suitable for inclusion within the keyboard 2000. The touch sensor layer 2060 is arranged to detect the presence of an object on or above the keyboard 2000. Typically, this detection is achieved by the touch sensor layer comprising a plurality of sensing elements. In this embodiment, the touch sensor layer 2060 comprises a capacitive sensor that is capable of detecting a user's finger touching the keyboard 2000 due to a change in the local electric field caused by the finger. Typically, the touch sensor layer 2060 is arranged to determine one or more of: a number of objects above the keyboard 2000, a position of those objects, a motion of those objects, a trajectory of those objects, and/or a speed of those objects.

In some embodiments, the touch sensor layer 2060 comprises other sensors, such as optical sensors, pressure sensors, accelerometers, or audio sensors. Generally, the touch sensor layer 2060 may comprise any sensor and/or component that is capable of detecting the position and/or movement of a user and/or object.

Where a capacitive sensor is used the capacitive sensor typically comprises a grid formed of rows 2062 and columns 2064 of electrodes. A controller is arranged to drive a current through a single row of the touch sensor layer 2060 and then to scan (in order) each column of the touch sensor layer 2060 for an induced current; this process is repeated for each row. The current induced in a given column will depend on whether a user (e.g. a user's finger) is near the row being driven. With a mutual capacitance sensor, the capacitance value at each intersection can be evaluated separately so that the sensing of multiple touch points is possible. Other capacitive sensors, such as self-capacitance sensors, may also be used—for some of these sensors, detection of multiple touch points may not be possible. A more detailed view of a capacitive touch sensor is described below with reference to FIGS. 8a-8c. More generally, any grid of sensor elements may be used to detect a touch input, e.g. a grid of pressure sensors or optical elements may be used.

In this embodiment, there is provided a capacitive sensor with rows and columns arranged in a diamond formation as shown in FIG. 6a, where the separations between the rows 2062 and the columns 2064 of the capacitive sensor are at an angle compared to the edges of the keyboard 2000. Other arrangements may be used, e.g. a comb arrangement where the separations between the rows and columns of electrodes are parallel to the edges of the keyboard 2000.

In order to sense the presence of an object, the touch sensor layer 2060 may be located near the top of the keyboard, e.g. immediately beneath the keypress mechanism 2040 or the transmittal mechanism 2030. Proximity to the keycaps 2050 enables simple sensing of a user's touch on the keycaps 2050. In order to amplify the capacitive effect of the user's touch on the keycaps 2050, there may be provided a conductive material on the keycaps 2050 or an electrical connection between the keycaps 2050 and the touch sensor layer 2060. The use of a conductive material may be advantageous when the touch sensor layer 2060 is distant from the keys 2002.

Typically, the touch sensor layer 2060 is located above the keypress sensor layer 2020 and below the level of the keypress mechanisms 2040; this arrangement places the touch sensor layer 2060 close enough to the top of the keyboard 2000 to detect the touch of a user on the keycaps 2050 of the keyboard 2000 while enabling the touch sensor layer 2060 to be provided as a single plate (since the touch sensor layer 2060 does not move due to a movement of the keys 2002. More generally, the touch sensor layer 2060 is typically located below the layer of the keypress mechanisms 2040 so as to allow provision of the touch sensor layer 2060 as a single plate.

In some embodiments, the touch sensor layer 2060 comprises holes that enable the passage of the hook mounts 2012 of the base plate 2010; this enables the hook mounts 2012 (or a component that can be secured to the hook mounts 2012) to pass through the touch sensor layer 2060 so that the keypress mechanisms 2040 can be secured to the hook mounts 2012.

Where the touch sensor layer 2060 is provided above the keypress sensor layer 2020, the keypress sensor layer 2020 may be arranged to detect the depression of the transmittal mechanisms 2030 through the touch sensor layer 2060. As an example, the depression of the transmittal mechanisms 2030 may apply a pressure to the touch sensor layer 2060 that results in the depression of the portion of the touch sensor layer 2060 directly beneath the pressed key; this depression of the touch sensor layer 2060 is detected by the sensor 2022 of the keypress sensor layer 2020.

In some embodiments, there are provided holes in the touch sensor layer 2060 to enable the transmittal mechanisms 2030 or a part of the transmittal mechanisms 2030 (e.g. a silicone dome striker) to pass through the touch sensor layer 2060 so as to actuate the sensors 2022 of the keypress sensor layer 2020.

The holes in the touch sensor layer 2060 are typically arranged so that they do not overlap with any intersections of the rows 2062 and columns 2064 of electrodes of the touch sensor layer 2060. For example, the touch sensor layer 2060 may comprise one or more holes located entirely between the diagonal separation lines of electrodes of the touch sensor layer 2060. This is described in more detail in reference to FIGS. 8a-8c.

Figure 6B:
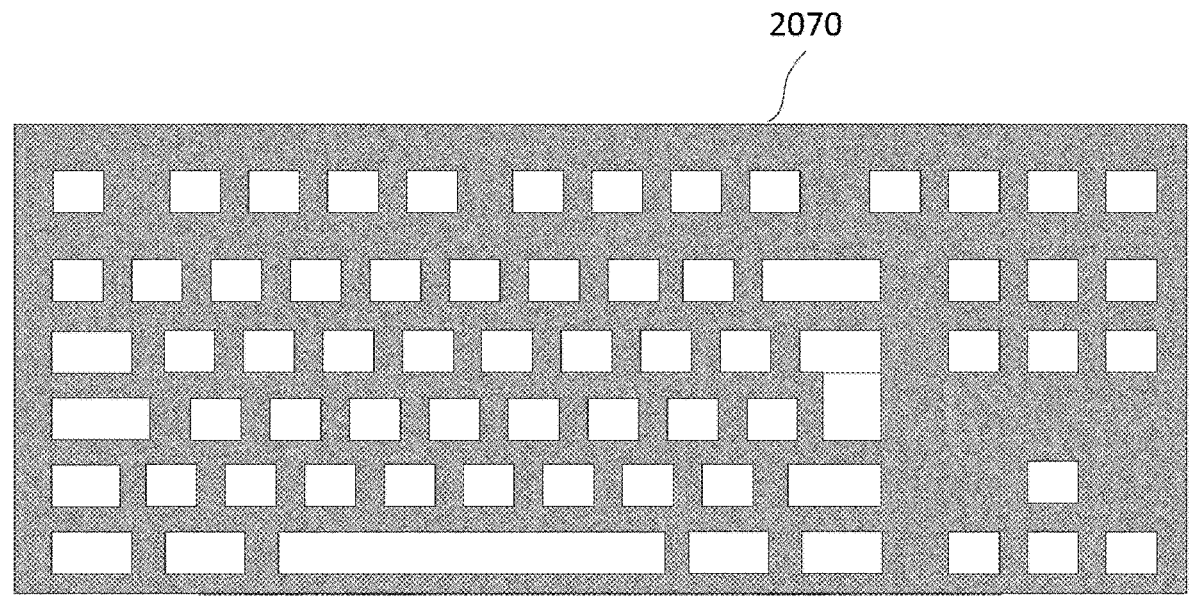
FIG. 6*b* shows a protective layer for protecting the touch sensor of FIG. 6*a*.

Referring to FIG. 6b, where the touch sensor layer 2060 is provided, a protective layer 2070 may be provided to protect the touch sensor layer 2060 from dust and moisture. The protective layer 2070 is typically made of a plastic material and/or a thin film.

The protective layer 2070 is typically located above the touch sensor layer 2060. Like the touch sensor layer 2060, the protective layer 2070 may comprise holes so as to allow the passage of transmittal mechanisms 2030. The transmittal mechanisms 2030 may then be mounted on the protective layer 2070. In this situation, the touch sensor layer 2060 and the protective layer 2070 may be considered to be a single combined touch sensor/touch sensor layer (so that the transmittal mechanisms 2030 being mounted on the protective layer 2070 effectively involves the transmittal mechanisms 2030 being mounted on a touch sensor).

More generally, each layer of the keyboard 2000, and/or each layer between the base layer 2010 and the keypress mechanisms 2040 may comprise holes. Typically, each layer comprises concentric holes so that the hook mounts 2012 (or a light from a backlight) can pass through each layer.

In some embodiments, a backlight is provided so that a user can easily use the keyboard 2000 without an external light source. In these embodiments, there is typically a light guide layer (not shown) included in the keyboard, which light guide layer directs the lights to pass through the keycaps 2050 of the keyboard 2000. In these embodiments, the protective layer 2070 may be transparent or comprise transparent portions.

Typically, the light guide layer and/or the optical elements that provide light for the backlight are placed either at the base of the keyboard (beneath the base plate 2010); above the touch sensor layer 2060; in or on the touch sensor layer 2060 (e.g. so that the backlight is integrated with the touch sensor/touch sensor layer 2060); or above the protective layer 2070.

Each layer is typically secured to the other layers with an adhesive layer, e.g. a layer of glue or an adhesive tape (e.g. a double sided adhesive tape). Securing the layers together ensures that the rigid base plate 2010 is able to provide rigidity to the remainder of the layers.

The hook mounts 2012 are arranged to pass through the touch sensor layer 2060 and the protective layer 2070 in order to secure the keypress mechanisms 2040; this also provides rigidity to the intervening layers.

While it will be appreciated that the layers of the keyboard 2000 may be arranged in any order—and any combination of layers may be provided and/or removed—a preferred arrangement of the layers is as follows:

1. (optionally) The light guide layer (not shown).
2. The base plate 2010.
3. (optionally) A layer of adhesive.
4. The keypress sensor layer 2020.
5. (optionally) A layer of adhesive.
6. The touch sensor layer 2060.
7. (optionally) A layer of adhesive.
8. (optionally) The protective layer 2070.
9. The transmittal mechanisms 2030.
10. The keypress mechanisms 2040.
11. The keycaps 2050.

As has been described above, typically the base layer 2010 comprises hook mounts 2012 that pass through each of the layers between the base plate 2010 and the keypress mechanisms 2040 (including the touch sensor layer 2060).

As has been described above, the transmittal mechanisms 2030 may be arranged to pass through the other layers so as to be able to actuate the sensors 2022 of the keypress sensor layer 2020.

Furthermore, the transmittal mechanisms 2030 may pass through, or be located internally to, the keypress mechanisms 2040, so that the keypress mechanisms 2040 are effectively adjacent to the protective layer 2070.

Typically, the transmittal mechanisms 2030 (e.g. silicone domes) are mounted on the touch sensor layer 2060, where the depression of the transmittal mechanism 2030 may result in a part of the transmittal mechanism 2030 passing through a hole of the touch sensor layer 2060.

Typically, a ground layer is located between the keypress sensor layer 2020 and the touch sensor layer 2060; for example, directly above the keypress sensor layer 2020. This ground layer is arranged to prevent interference between the keypress sensor layer 2020 and the touch sensor layer 2060.

As is described below, there is further considered herein a method of detecting keypresses using the touch sensor layer 2060. In these embodiments, the keyboard 2000 may be provided without the keypress sensor layer 2020. In these embodiments, and other embodiments, the keyboard 2000 may be provided without the base plate 2010. Where the keyboard 2000 is provided without the base plate 2010 in particular (but also where the keyboard 2000 has the base plate 2010), the touch sensor layer 2060 may be provided as a rigid layer that provides rigidity to the keyboard 2000; for example, the touch sensor layer 2060 may comprise an FR4 material.

In some embodiments, lighting elements for the backlight are mounted onto the touch sensor layer 2060; in particular, such an arrangement may be used where the touch sensor layer 2060 comprises a rigid material (and/or where no base layer is provided).

In some embodiments, the touch sensor layer 2060 comprises a subset of the area of the keyboard 2000, for example the touch sensor layer 2060 may be present only beneath a subset of the keys 2050 of the keyboard. In such embodiments, there may be provided a thickness compensating component arranged to compensate for the reduced thickness in areas that are not covered by the touch sensor layer 2060. The thickness compensating component may, for example, comprise a PET film around the touch sensor layer 2060 and/or a section of another layer that has an increased thickness. In some embodiments, the protective layer 2070 or the plastic plate of the backlight comprises one or more sections of increased thickness in an area that is not covered by the touch sensor layer 2060.

In some embodiments, instead of the keypress mechanisms 2040 being mounted to the base plate 2010, there is provided a separate layer (typically made of plastic) on which the keypress mechanisms are mounted. Such an arrangement may have layers:

1. (optionally) The light guide layer (not shown).
2. The base plate 2010.
3. (optionally) A layer of adhesive.
4. The keypress sensor layer 2020.
5. (optionally) A layer of adhesive.
6. The touch sensor layer 2060.
7. (optionally) A layer of adhesive.
8. (optionally) The protective layer 2070.
9. The transmittal mechanism 2030.
10. Keypress mechanism mounting layer (not shown).
11. The keypress mechanisms 2040.
12. The keycaps 2050.

With this arrangement, there is typically provided a base plate 2010 that does not comprise hook mounts.

Where the keypress mechanisms 2040 are not mounted to the base plate 2010, the base plate 2010 may be removed, so that in some embodiments the arrangement of the keyboard 2000 is:

1. The keypress sensor layer 2020.
2. (optionally) A layer of adhesive.
3. The touch sensor layer 2060.
4. (optionally) The protective layer 2070.
5. The transmittal mechanism 2030.

6. Keypress mechanism mounting layer (not shown).
7. The keypress mechanisms 2040.
8. The keycaps 2050.

In some embodiments, there is provided a layer of double sided tape between the touch sensor layer 2060 and the keypress mechanism mounting layer; the protective layer 2070 may comprise or constitute such a layer of double sided tape.

In some embodiments, a plurality of the layers are combined. In particular, the transmittal mechanisms 2030 may be combined with the keycaps 2050. In such an embodiment, the keycaps 2050 typically comprise a deformable and/or flexible material (such as silicone) so that the keycaps 2050 can be depressed to operate the sensors 2022 of the keypress sensor layer 2020 before returning to a raised position.

In some embodiments, the protective layer 2070 is combined with the transmittal mechanisms 2030 and the keycaps 2050. This enables the provision of a thin keyboard.

In some embodiments, the keyboard 2000 comprises (optionally, only):

1. A touch sensor layer 2060, which may also be used to detect keypresses, as is described further below.
2. Keycaps 2050.

In this embodiment, the keycaps 2050 may perform certain functions of the transmittal mechanisms 2030 and the protective layer 2070 (e.g. the operation of the touch sensors). Typically, such embodiments further comprise keypress mechanisms 2040 between the touch sensor layer 2060 and the keycaps 2050. As is described further below, these keypress mechanisms 2040 may also provide some of the functionality that is conventionally provided by the transmittal mechanisms 2030.

In some embodiments, there are no keypress mechanisms 2040 provided. This typically reduces the stability of the keycaps 2050 during a keypress, but may also reduce the weight and the number of moving parts of the keyboard 2000.

In these embodiments in particular, the keycaps 2050 may comprise a conductive and/or metal element. In particular, there may be a metal coating arranged on or in the keycaps (e.g. embedded in layers of silicon). In a preferred embodiment, there are silicone elements located on each corner of some or all of the keycaps 2050. This aids in the detection of a keypress by the keypress sensor layer 2020 (where a keypress sensor layer is used) and/or the touch sensor layer 2060 (as is described further below).

Where a keypress sensor layer 2020 is provided, this may be provided in combination with the touch sensor layer 2060 (e.g. in a combined printed circuit board (PCB) layer).

The, optionally PCB, layer of the touch sensor layer 2060 and/or the keypress sensor layer 2020 may be attached to the, optionally silicone, keycaps 2050 using an adhesive and/or double-sided tape. This enables straightforward manufacture of a thin keyboard from only two components. Rigidity may be provided by the touch sensor layer 2060, which may comprise a stiffened material (e.g. the PCB backing).

In order to manufacture the keyboard 2000, one or more of the following steps are typically performed:

1. The keypress sensor layer 2020 is attached to the base plate 2010 using a layer of adhesive.
2. The transmittal mechanisms 2030 are attached to the touch sensor layer 2060, e.g. using adhesive.
3. The touch sensor layer 2060 is attached to the keypress sensor layer 2020.

4. (optionally) the protective layer 2070 is attached to the touch sensor layer 2060, e.g. using a double sided adhesive.

5. The hook mounts 2010 of the base plate 2010, and/or a component that attaches to the hook mounts 2010, are passed through holes in the keypress sensor layer 2020 and/or the touch sensor layer 2060 and attached to the keypress mechanisms 2040.

6. (optionally) the assembled layers are heated to secure a tight fit between the assembled layers.

7. The keycaps are attached to the keypress mechanisms 2040.

In embodiments comprising a separate keypress mechanism mounting layer, step 5 of the above method of manufacture typically involves mounting this keypress mechanism mounting layer to the touch sensor layer 2060 (or to the protective layer 2070) and then mounting the keypress mechanisms 2040 on the keypress mechanism mounting layer. The keypress mechanisms 2040 may also be mounted on the keypress mechanism mounting layer before the keypress mechanism mounting layer is mounted to the touch sensor layer 2060 or protective layer 2070.

In some embodiments, the heating step may be excluded (e.g. to avoid melting certain layers of the keyboard). A tight fit between the layers may then be achieved using an alternate mechanism, such as using pressing the layers together. The exclusion of the heating step is particularly desirable where certain types of plastic are included in the keyboard 2000, this may be the case where a plastic plate is provided as part of a backlight.

In order to ensure an accurate and consistent response from the touch sensor layer 2060, it is desirable to avoid the formation of any air bubbles during the manufacture of the keyboard; therefore the manufacture may involve a step designed to remove air bubbles, such as a step of cleaning the touch sensor layer 2060 to remove dust and debris; a step of forcibly pressing together any two or more layers; and/or a step of heating the protective layer 2070 and/or the touch sensor layer 2060.

Typically, the manufacture comprises applying a layer of double sided tape to the touch sensor layer 2060 and/or above the touch sensor layer 2060. The double sided tape may form a part, or the whole, of the protective layer 2070. As is described below, there may be provided a keypress mechanism mounting layer above the touch sensor layer. This keypress mechanism mounting layer may be secured to the touch sensor layer 2060 using the double sided tape.

In particular, where a plastic plate is provided above the touch sensor layer 2060 (e.g. as part of the backlight), the touch sensor layer 2060 may be attached to this plastic plate using a double sided adhesive.

In particular, the double sided tape may be used to reduce the presence of air between the touch sensor layer 2060 and the layers above the touch sensor layer 2060. Other mechanisms for removing air gaps between layers may also be included in the keyboard 2000.

Backlight

As mentioned above, in some implementations of the keyboard 2000 there is provided a backlight, which enables a user to easily see text printed on the keycaps 2050.

Figure 7:
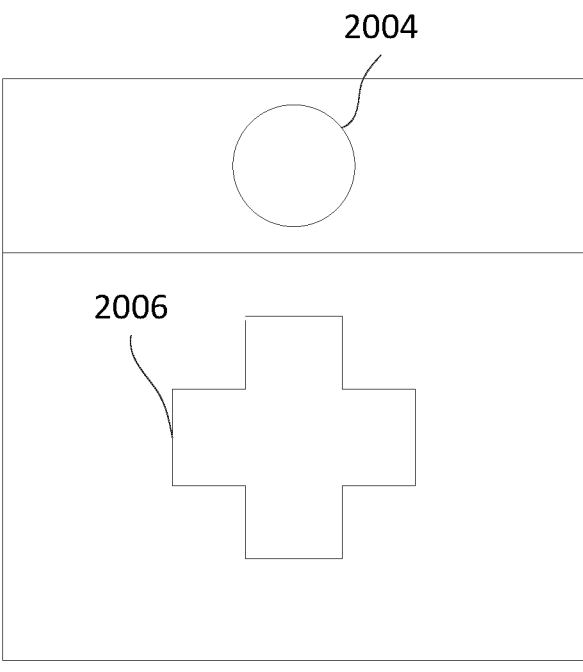
FIG. 7 shows a key that includes a light source.

Referring to FIG. 7, there is shown an exemplary embodiment of a key with an integrated backlight. In this embodiment, the key comprises a light source, e.g. an LED. The key also comprises an attachment mechanism 2006, which enables the keycap 2050 to be attached to the key. While this provides a strong light, providing an LED on each key can be expensive. Furthermore, the failure of a single LED can be particularly noticeable when the LED is associated with a specific key.

An alternative method of providing a backlight is to provide a backlight layer within the keyboard, which backlight optical layer comprises one or more light sources. In order to achieve an even and diffuse backlight the backlight layer typically also comprises a light guide layer. As well as diffusing the light from the optical layer, the light guide layer directs the light upwards through the keyboard 2000.

A protective layer, e.g. the protective layer 2070 of FIG. 6b, can be used to block the passage of light through portions of the keyboard and further direct light. In particular, the protective layer 2070 may comprise portions of opaque material as well as portions of transparent material. The transparent material is typically located under each key 2002 and/or keycap 2050 of the keyboard 2000 when the keyboard 2000 is assembled, with the opaque material located on the other parts of the keyboard 2000.

The backlight layer may be provided beneath the base plate 2010 of the keyboard, where the base plate 2010 may comprise holes 2014 to allow the passage of light through the base plate. In some embodiments, there is also and/or alternatively a cut-out portion beneath each key, as can be seen in FIG. 5b.

In order to improve the passage of light upwards through the keyboard 2000, the keys 2002 may comprise a transparent or translucent material. The keys 2002 may also be raised and/or located within widened holes so that light can pass out of the keyboard 2000 around the edges of the keys 2002.

The backlight layer may comprise a translucent and/or transparent backlight layer, which may be made of plastic. The backlight layer may comprise holes to enable the passage of the hook mounts 2012. The backlight layer may comprise a light guide layer, where the optical components used to provide the backlight are provided either around the perimeter of the backlight layer or are embedded into the backlight layer. This precludes the need for separate optical and light guide layers. Furthermore, the backlight layer may be a rigid component used to add rigidity to the keyboard 2000, for example by making the backlight layer out of a rigid transparent plastic.

The backlight layer can be inserted at any layer of the keyboard so that, for example, the transparent backlight layer may be inserted immediately beneath the keypress mechanism.

The backlight layer may also be integrated with and/or combined with the touch sensor layer 2060.

In various embodiments the backlight layer is arranged directly beneath the keys 2002, beneath the touch sensor layer 2060 and/or beneath the base plate 2010.

The backlight layer may also comprise an opaque film that blocks unnecessary light.

When located above the touch sensor layer 2060, the backlight layer provides protection to the touch sensor layer 2060. The backlight layer may be used in combination with or instead of the protective layer 2070 and may act simultaneously as a rigid structural layer, a protective layer, and a backlight layer. By combining these features into a single layer, a thinner keyboard can be provided.

The backlight layer being located beneath the touch sensor layer 2060 places the touch sensor layer 2060 closer to the top of the keyboard, which can improve the sensing of a touch on the keys 2002 of the keyboard 2000.

The transparent backlight layer may be arranged to allow the passage of the transmittal mechanisms 2030, e.g. by providing holes in the transparent backlight layer.

Figure 8A:
FIGS. 8*a*, 8*b*, and 8*c* show touch sensor layers that comprise a hole.
Figure 8A:
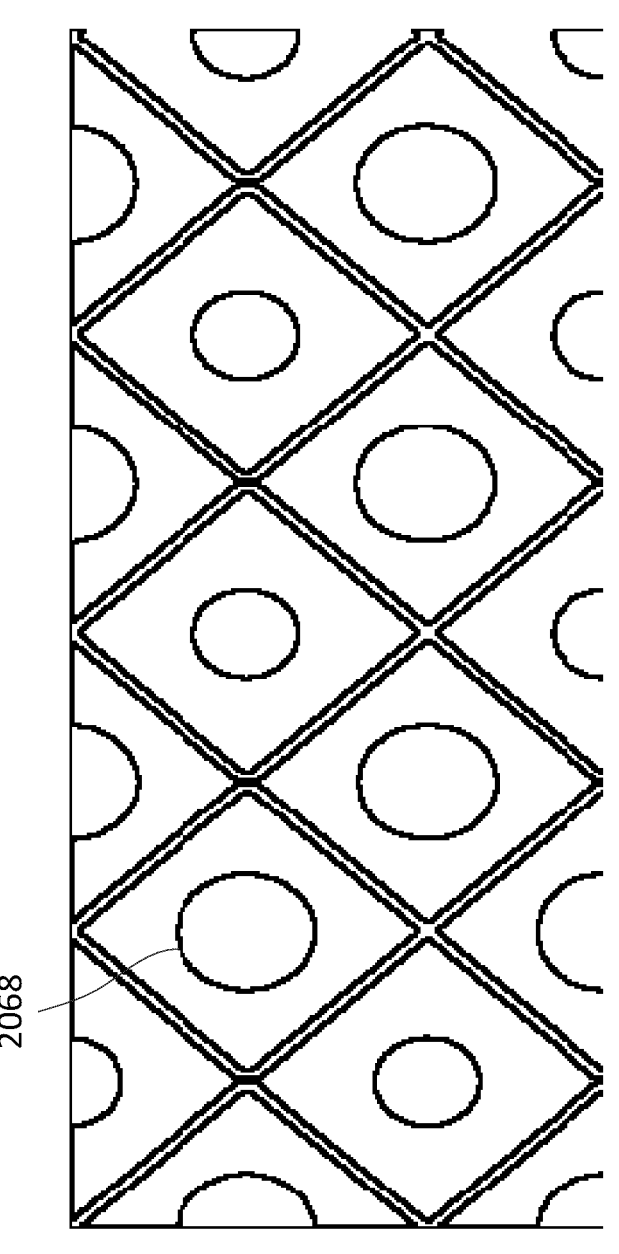
Figure 8B:
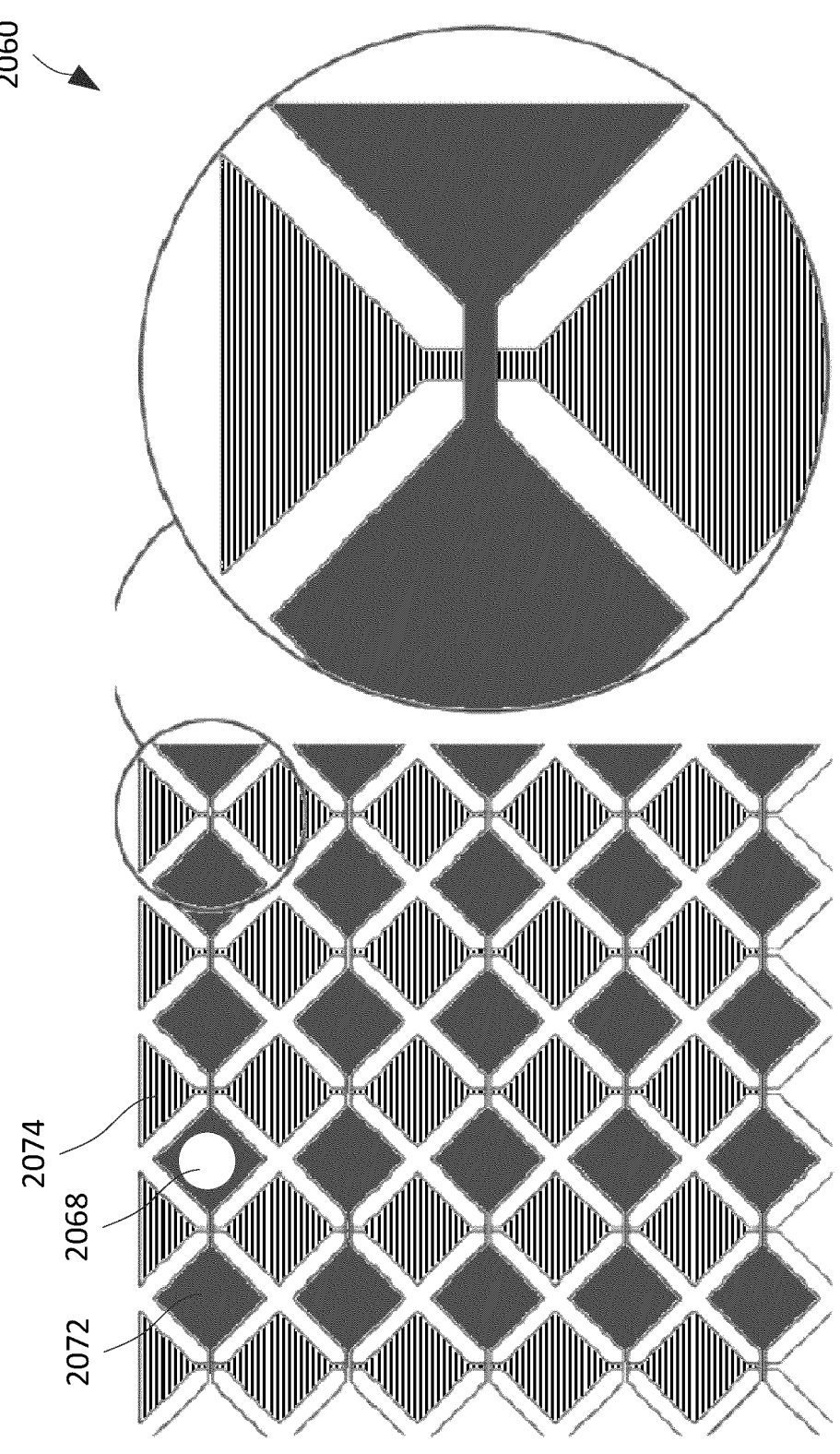
Figure 8C:
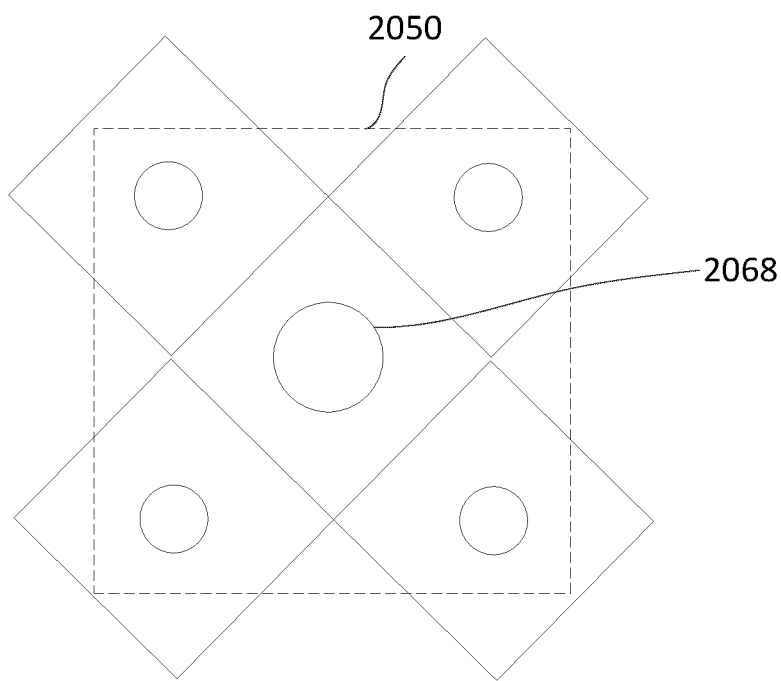

Referring to FIGS. 8a-8c, in order to enable light to pass through the touch sensor layer 2060, the touch sensor layer 2060 may comprise one or more holes 2068. Typically, the touch sensor layer 2060 is arranged so that the holes 2068 do not overlap with any intersection of the rows and columns of electrodes of the touch sensor layer 2060. In other words, the touch sensor layer 2060 comprises one or more holes located between adjacent rows of electrodes of the touch sensor layer 2060 and located between adjacent columns of electrodes of the touch sensor layer 2060. Typically, the holes 2068 for the passage of light are the same as the holes used to allow passage of the transmittal mechanism 2030 to the keypress sensor layer 2020. Alternatively, separate holes may be provided for these different purposes.

In some embodiments, in addition to, or instead of, the holes 2068, the touch sensor layer 2060 and/or the protective layer 2070 comprises translucent or transparent sections arranged to allow the passage of light.

In order to not disrupt the rows 2062 and columns 2064 of the touch sensor layer 2060, the holes 2068 are typically arranged in a regular pattern, such as a rhombus pattern (as shown in FIG. 8a). Where a different arrangement of the touch sensor layer 2060 is used (e.g. where the rows 2062 and columns 2064 of the touch sensor layer are parallel/perpendicular to the edges of the keyboard 2000) the holes 2068 may be arranged in a different pattern, such as a rectangular pattern.

Referring to FIG. 8b, the layout of an exemplary capacitive touch sensor, which may form the touch sensor layer 2060, is shown in more detail. It can be seen that the rows and columns of the touch sensor are formed by a plurality of diamond shaped electrodes; these electrodes form rows and columns as described with reference to FIG. 8a. By driving each row of electrodes in turn and then detecting a corresponding signal induced in each column of the electrodes (or vice versa), a touch relating to one or more intersections of rows and columns can be detected. Specifically, the signal induced in each column will be different depending on whether or not there is a conductive object (such as a user's finger) in proximity to that column. Therefore, to detect a user's touch a detected signal can be compared to a baseline signal, which baseline signal corresponds to a reading taken where no conductive object is near the column.

In order to increase the accuracy of the detection, it is desirable for the rows and columns to be unbroken. Therefore, the holes 2068 located in the touch sensor layer 2060 are typically arranged so as to not disrupt the continuity of the rows and/or columns of the electrodes. To this end, each hole 2068 may be located entirely within an electrode as shown in FIG. 8a. In particular, the holes 2068 are typically arranged so as to not coincide with, or overlap, any of the intersections between the rows 2072 and columns 2074 of the electrodes.

More generally, the holes 2068 are arranged to not overlap with an edge of one or more of the electrodes of the touch sensor layer 2060; typically, the holes 2068 are arranged so as to not overlap an edge of any of the electrodes of the touch sensor layer 2068. Typically, both the holes 2068 and the electrodes are arranged in a regular pattern where the holes 2068 and the edges of the electrodes do not overlap—this simplifies manufacture and allows simple manufacture regardless of the size of the keyboard 2000.

Typically, the holes 2068 are typically arranged so as not to overlap with an intersection of the rows and columns of the electrodes, where, in some embodiments, the holes 2068 may still overlap with the edges of one or more electrodes. In some embodiments, the holes 2068 are arranged so as not to overlap with the neck of any of the electrodes (where the neck of the electrode is a narrow portion of the electrode located in the region of intersections between the rows and columns of the electrodes).

In order to not overlap with an edge of the electrodes, in some embodiments, the holes 2068 are arranged entirely internally within the electrodes, where the electrodes may be shaped/sized in order to enable this. In some embodiments, the holes 2068 are instead arranged entirely externally to the electrodes, where the electrodes may be shaped/sized in order to enable this.

The regular pattern of holes 2068 and/or electrodes may be provided across only a portion of the touch sensor layer, where different patterns may be used in different areas (e.g. there may be a different pattern of holes present beneath the main body of the keyboard 2000 as compared to beneath the bottom row of the keyboard (e.g. the space bar).

Equally, the holes 2068 of the touch sensor layer 2060 may be arranged so as to not disrupt the continuity of the rows and/or columns of the electrodes throughout the touch sensor layer 2060, and/or or the holes 2068 of the touch sensor layer 2060 may be arranged so as to not disrupt the continuity of the rows and/or columns of the electrodes only in certain areas of the touch sensor layer 2060.

While the example described in relation to FIG. 8b concerns the holes 2068 not disrupting the continuity of electrodes, more generally the holes are arranged in dependence on the layout of one or more sensor elements. As an example, the sensor elements may comprise a grid of pressure sensors, where the holes may be arranged so as not to disrupt a connection between any pair of pressure sensors.

These holes 2068 may also be used for an attachment mechanism. For example, there may be hooks provided in the layers to either side of the touch sensor layer 2060 that pass through the holes 2068 in order to fix together two layers of the keyboard. In some embodiments the hook mounts 2012 on the base plate 2010 are arranged to pass through these holes 2068. There may also be separate cut-outs in the touch sensor layer 2060 (and/or any other layer) that enable passage of the hook mounts 2012.

As shown in FIG. 8c, there may be provided holes of different size and function in the touch sensor layer 2060. In particular, holes that enable passage of the transmittal mechanisms 2020 are typically provided under the centre of the keycaps 2050 and are typically larger than the holes provided in order to enable the passage of light, which are offset from the centre of the keycaps 2050. A more detailed arrangement of holes is described in relation to FIG. 22b, which describes a touch sensor that has holes for transmittal mechanisms, holes for attachment mechanisms, and holes for the passage of light.

There is also disclosed a method of manufacturing the touch sensor layer 2060 for inclusion in the keyboard 2000, where this method comprises manufacturing a touch sensor, and thereafter forming holes in the touch sensor. More specifically, the manufacturing of the touch sensor layer 2060 may comprise (in any order): forming holes for transmittal mechanisms; forming holes for the passage of light; and forming holes for attachment mechanisms, where the holes for attachment mechanisms may be provided for the mounting of keypress mechanisms and/or for the passage of attachment structures that secure together one or more layers of the keyboard 2000. The holes provided for each purpose may be sized differently and/or arranged in a different pattern.

The method of manufacturing the touch sensor layer 2060 may further comprise the step of attaching the transmittal mechanisms 2030, e.g. silicon domes, to the touch sensor layer 2060. Typically, the transmittal mechanisms 2030 comprise silicone domes which are attached to the touch sensor layer 2060 so as to be concentric with holes in the touch sensor layer 2060. The depression of the keycaps 2050 then deforms a corresponding silicon dome so that a part of the silicone dome passes through the hole of the touch sensor layer 2060 and impact a sensor of the keypress sensor layer 2020

As described above, the holes 2068 of the touch sensor layer 2060 may also allow the passage of the transmittal mechanism 2030 and the passage of attachment mechanisms (e.g. the hook mounts 2012). Not least due to this, the touch sensor layer 2060 of FIG. 8a is useful in keyboards where no backlight is provided.

In some embodiments, the transmittal mechanisms 2030 are narrow so that the holes provided in the transparent backlight layer and the touch sensor layer 2060 to enable the passage of the transmittal mechanisms 2030 can be small. The transmittal mechanisms may have a perimeter of less than 20 mm, less than 10 mm, less than 5 mm, and/or less than 2 mm.

Keypress Sensor Layer

As has been explained with reference to FIG. 5a, keypresses can be detected using a keypress sensor layer that contains a number of sensors to detect the pressing of a key.

An aspect of the present disclosure relates to determining a keypress using the touch sensor layer 2060. In particular, where the touch sensor layer 2060 comprises a capacitive sensor, the transmittal mechanism 2030 may be modified so that pressing the key 2002 results in a change in the local electric field near the touch sensor layer 2060.

Figure 9:
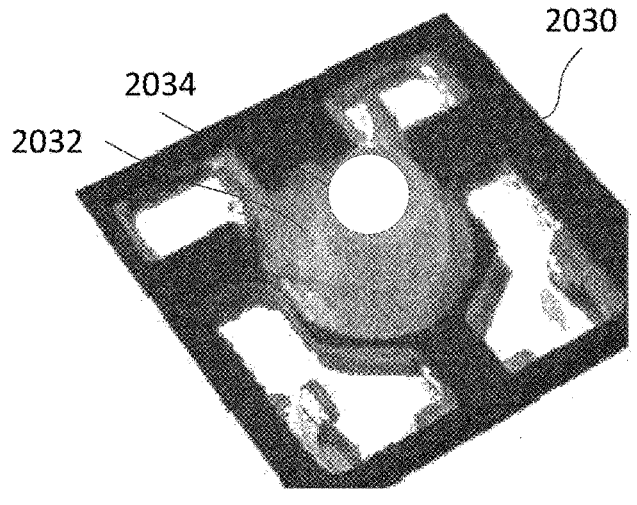
FIG. 9 shows a transmittal mechanism for use in detecting a keypress.

As shown in FIG. 9, one way of achieving this is by attaching a coating 2034, e.g. a metal coating, to the transmittal mechanisms 2030 and/or the base of the keys 2002 so that when a key is pressed the coating 2034 approaches and/or contacts an electrode of the touch sensor layer 2060. This presence of the coating 2034 results in a determinable alteration of the local electric field beneath the pressed key. This alteration can be detected using the touch sensor layer 2060.

In various embodiments, the coating 2034 comprises one or more of: a metal coating, an electrically conductive coating, a metal oxide semiconductor coating, and an electrically insulating coating. Typically, the coating 2034 is arranged to cause a greater alteration to the local electric filed than the presence of a user's finger (e.g. an alteration at least twice the alteration due to a user's finger).

The coating 2034 may be located on any component that moves when the keycap 2050 is depressed. Typically, the coating is located on the keycap 2050 (e.g. on the underside of the keycap) and/or on the transmittal mechanism 2030 (e.g. on the exterior of the silicone dome 2032 or on the interior of the silicone dome 2032). In other words, the coating 2034 is arranged so that the coating 2034 is moved when the keycap 2050 is pressed.

Figure 10:
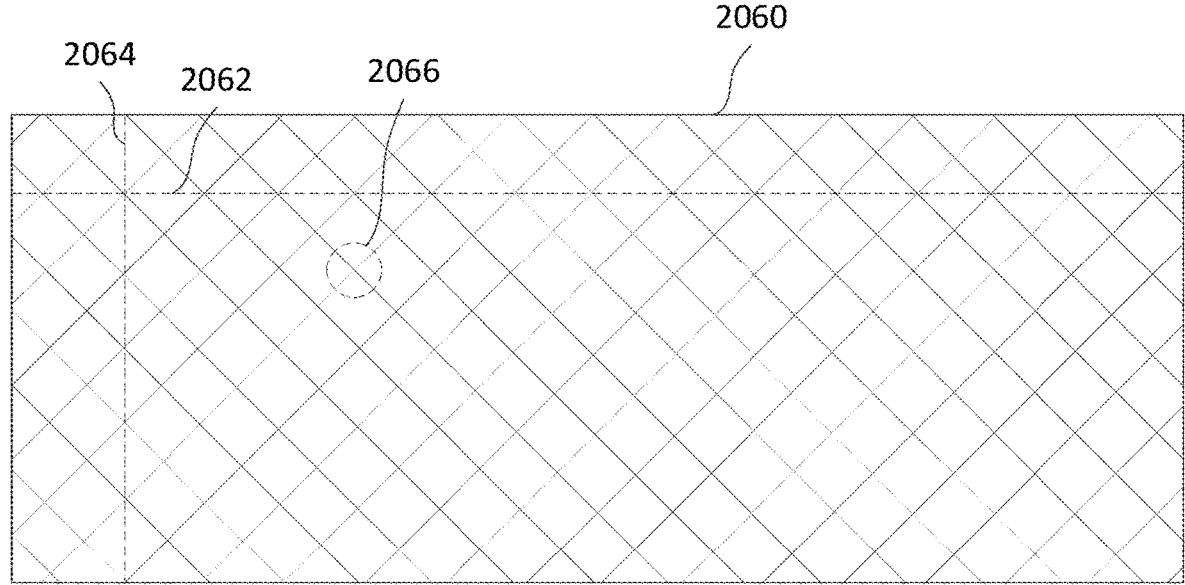
FIG. 10 shows a capacitive sensor suitable for use with the transmittal mechanism of FIG. 9.

In order to increase the sensitivity of the touch sensor layer 2060 and improve the detection of keypresses, in some embodiments the touch sensor layer 2060 is arranged so that the coating 2034 on the transmittal mechanism 2030 is located above an intersection of the rows and columns of the touch sensor layer 2060. This is illustrated by FIG. 10, which indicates a contact point 2066 (or a nearest approach point) on the touch sensor layer 2060. This contact point 2066 is arranged to be located beneath the coating 2034 of a key of the keyboard 2000 so that when the key is depressed, the coating 2034 approaches the contact point 2066.

In some embodiments, the transmittal mechanism 2030 and/or the coating 2034 is arranged to be in the centre of a sensor of the touch sensor layer 2060 (e.g. to be at the centre of an electrode and/or at the intersection of a row of electrodes and a column of electrodes).

By using the touch sensor layer 2060 to detect keypresses, the keyboard 2000 can be provided without the (separate) keypress sensor layer 2020. This enables the provision of a thin keyboard that is useable both for typing and as a touchpad. This also enables the provision of the touch sensor layer 2060 without holes to enable the passage of the transmittal mechanisms 2030. The lack of a need to provide holes in the touch sensor layer 2060 can simplify manufacture of the touch sensor layer 2060.

In some embodiments, and in particular in embodiments where keypresses are detected using the touch sensor layer 2060, the touch sensor layer 2060 comprises optical elements (e.g. LEDs) arranged to provide a backlight. Where keypresses are detected using the touch sensor layer 2060, holes in the touch sensor layer 2060 for the transmittal mechanisms 2030 are not required; the optical elements may then replace these holes (e.g. so that the optical elements do not overlap with any edges of touch sensor elements). More generally, optical elements may be located on the touch sensor layer 2060 based on the same sets of conditions for the placing of the holes. There may be provided a touch sensor layer 2060 that comprises both holes and optical elements, wherein the locating of the optical elements and the holes is based on the same sets of conditions.

While the detection of a keypress has been described with reference to a capacitive touch sensor, it will be appreciated that such detection is possible with other sensing mechanisms. As an example, a pressure sensor may be used to detect both touches and keypresses, where a light pressure placed on the keys 2002 is indicative of a user providing a touch/pointer input and a heavy pressure placed on the keys 2002 (e.g. a keypress) is indicative of a keystroke input.

Exemplary keyboard constructions where the touch sensor layer 2060 is used to detect keypresses are as follows:
1. The base plate 2010.
2. (optionally) A layer of adhesive.
3. The touch sensor layer 2060.
4. (optionally) The protective layer 2070.
5. The transmittal mechanism 2030.
6. The keypress mechanisms 2040.
7. The keycaps 2050.
   and
1. The base plate 2010.
2. (optionally) A layer of adhesive.
3. The touch sensor layer 2060.
4. (optionally) The protective layer 2070.
5. The transmittal mechanism 2030.
6. The keypress mechanism mounting layer (not shown).
7. The keypress mechanisms 2040.
8. The keycaps 2050.

As has been described above, the keyboard 2000 may also comprise a backlight, e.g. as a transparent backlight layer. Where the keyboard 2000 comprises a backlight, the backlight may be provided adjacent to any other layer(s) and the touch sensor layer 2060 may be provided with holes in order to enable the passage of light.

Where the backlight is provided, the backlight may comprise holes to enable the passage of the transmittal mechanisms 2030 and/or the hook mounts 2012 of the base layer 2010.

Where the keypress mechanisms 2040 are not mounted to the base plate 2010, the base plate 2010 may be removed, so that in some embodiments the arrangement of the keyboard 2000 is:

1. The touch sensor layer 2060.
2. (optionally) The protective layer 2070.
3. (optionally) a layer of adhesive (e.g. double sided tape).
4. The transmittal mechanism 2030.
5. Keypress mechanism mounting layer (not shown).
6. The keypress mechanisms 2040.
7. The keycaps 2050.

This arrangement may be used in particular where keypresses are detected using the touch sensor layer 2060. In this arrangement, the touch sensor layer 2060 (or any other layer) may be arranged to be rigid and to provide rigidity to the keyboard 2000 in this arrangement. The touch sensor layer 2060 (or any other layer) may also be used to provide mounts for assembly that would normally be located on the base plate 2010 (e.g., to mount the keyboard 2000 in a laptop).

Touch Sensor Layer

The touch sensor layer 2060 may be any layer that is capable of detecting the position of the finger of a user. The touch sensor layer 2060 may comprise optical sensors, pressure sensors, self-capacitive sensors, and/or mutual capacitance sensors. While the touch sensor layer 2060 is typically described as sensing a touch on the keys of the keyboard 2000, the touch sensor layer may also be arranged to sense an object proximate to the touch sensor layer 2060, where this object may move above the keys 2002 of the keyboard 2000.

In this embodiment, as shown in FIG. 6a, the touch sensor layer 2060 comprises a matrix of electrodes that is used to provide a projected capacitive keyboard.

The 'rows' 2062 of electrodes form a transmitting channel, while the 'columns' 2064 of electrodes form a receiving channel. In order to detect a touch, a control unit (not shown) sends a signal sequentially to each of the rows 2062 (so that at any one time only one electrode row is being 'driven'). This results in a signal being induced in the receiving channels/columns 2064. The touch of a user, or the proximity of the coating 2034, alters the local electric field in the vicinity of the electrodes and thereby alters the signal that is induced in each receiving channel/column. For each pair of rows 2062 and columns 2064 there will be a single intersection; therefore, by detecting an alteration in the local electric field for a receiving column based on a driven row, it is possible to detect the precise location of a touch or a keypress.

It will be appreciated other arrangements may be used, e.g. where the columns form the transmitting channel of the touch sensor layer 2060 and the rows form the receiving channel of the touch sensor layer 2060.

In order to detect the alteration in the local electric field, it is necessary to calibrate the touch sensor layer 2060 in order to determine a baseline for the induction in each receiving channel (for each transmitting channel). Differences from this baseline measurement can then be detected. In order to calibrate the touch sensor layer 2060, the signal induced in each column 2064 by a signal being sent to each row 2062 is measured in the absence of a user.

It will be appreciated that a change in the local electric field can be caused simply by proximity to the touch sensor layer 2060; it is not necessary for the user or the coating 2034 to directly impact the touch sensor layer 2060.

In order to distinguish between a keypress and the touch of a user, the control unit which receives signals from the touch sensor layer 2010 may:

Determine a direction and/or location of movement—typically, the keys will move substantially perpendicular to the touch sensor layer 2060, so that the detection of a substantial parallel movement is useable to identify a user touch and the detection of a substantial perpendicular movement is useable to identify a keypress. Similarly, the keys 2002 will typically be restrained so that each key has a fixed range and location of motion; in contrast a movement across the keyboard (e.g. a user's touch) is unrestrained. Therefore, a keypress may be identified by identifying a specific location/direction of movement.

Determine a magnitude of a change in the local electric field (e.g. by measuring a current induced in the receiving channels)—typically, the coating 2034 will cause a different (e.g. greater) change in the local electric field than a human finger.

Determine a rate and/or duration of a change in the local electric field—typically a key is pressed and then released so that the duration of the change in the local electric field may be shorter for a key press than for a finger movement. Similarly, the rate of change of the local electric field may be higher for a key press. Additionally, the depression of a key will result in a change that increases to a peak. The release of a key will cause a decrease in a similar way. This may not be true for a user's touch.

In some embodiments, the coating 2034 is not provided and the touch sensor layer 2060 is nevertheless used to determine a keypress. Such detection may occur based on the considerations above; in particular a movement of a finger directly towards the touch sensor 2060 (and below the raised level of the keys 2002) may be interpreted as a keypress, while a movement perpendicular to the touch sensor layer 2060 may be interpreted as a touch gesture.

In some embodiments, the controller for the touch sensor layer 2010 processes signals in dependence on a mode of the keyboard 2000. The keyboard 2000 may have a plurality of modes that can be selected by a user, including a keyboard mode and a touchpad mode. In the keyboard mode, the controller of the touch sensor layer 2010 may expect keypresses, and so detect an isolated capacitive change indicative of a keypress as a keypress. In the touchpad mode, the controller of the touch sensor layer 2010 may expect a user's touch and so may ignore such an isolated change in capacitance, or interpret this change as a touch gesture instead of a keypress.

In some embodiments, the controller of the touch sensor layer 2010 detects keypresses even in the touchpad mode and uses such keypresses as a signal to change to a keyboard mode. Alternatively, the output of pressing a key may differ between the modes (e.g. the space bar may enter a space when in keyboard mode and may simulate a mouseclick when in touchpad mode).

Exemplary keyboard modes, and exemplary methods for switching between these modes, are described in more depth below as well as in WO2019237173 ("INPUT DEVICE, SIGNAL PROCESSING UNIT THERETO, AND METHOD TO CONTROL THE INPUT DEVICE").

Keypress Mechanism

The keypress mechanism 2040 has been described in relation to FIG. 5c as optionally being a scissor mechanism. A scissor mechanism provides a low profile keypress mechanism that is particularly suitable for use in laptops.

However, scissor mechanisms do have certain drawbacks; for example, the scissor mechanism can jam if debris or dust enters the keyboard, which can make the keys feel sticky or stiff. Furthermore, conventional scissor mechanisms may be unstable, and enable either horizontal movement of the keycap 2050 or provide an inconsistent return force.

Referring to FIGS. 11-17, there is disclosed an alternative keypress mechanism—a 'cams' mechanism 4000—that provides a stable keypress and reduces the possibility of key jamming, while still enabling the provision of a low profile keyboard.

Figure 11:
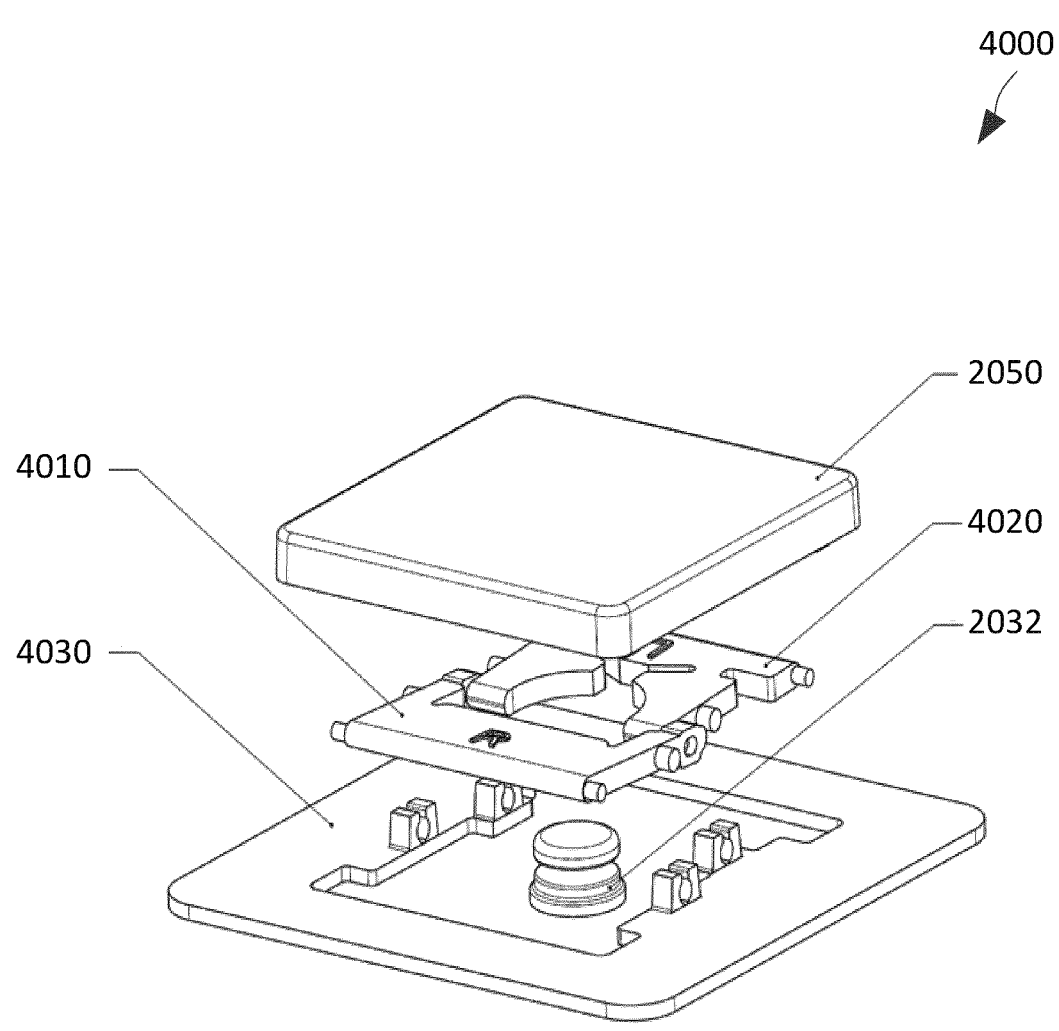
FIG. 11 shows an embodiment of a keypress mechanism.

Referring to FIG. 11, as with the key described with reference to FIGS. 5b-5d, a key using the cams mechanism 4000 typically comprises the keycap 2050 and the silicone dome 2032. The user is able to depress the silicone dome 2032 by pressing down on the keycap 2050. It will be appreciated that, as with the scissor mechanism, the silicone dome 2032 may be replaced by another mechanism for registering the depression of the keycap, such as a spring and/or a mechanical push switch.

Instead of the scissors of the scissor mechanism, the cams mechanism 4000 comprises a first lever 4010 and a second lever 4020. The first lever 4010 and the second lever 4020 are each attached to a mounting plate 4030 and are arranged to fit together around the silicone dome 2032. The first lever 4010 and the second lever 4020 are also attached to the keycap 2050, so that a movement of the keycap 2050 results in movement of the first lever 4010 and the second lever 4020.

Figure 12A:
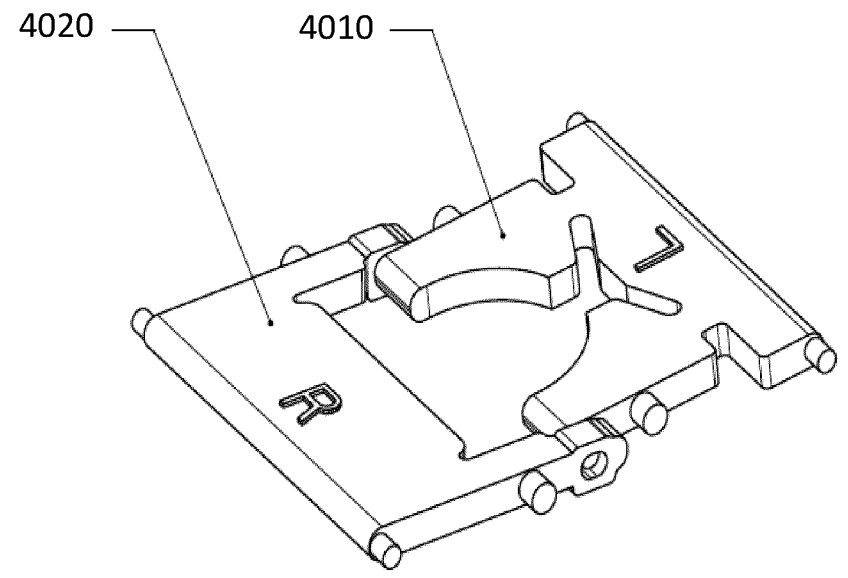
FIGS. 12*a*-12*c* show a first lever and a second lever that are part of the keypress mechanism of FIG. 11.
Figures 12B, 12C:
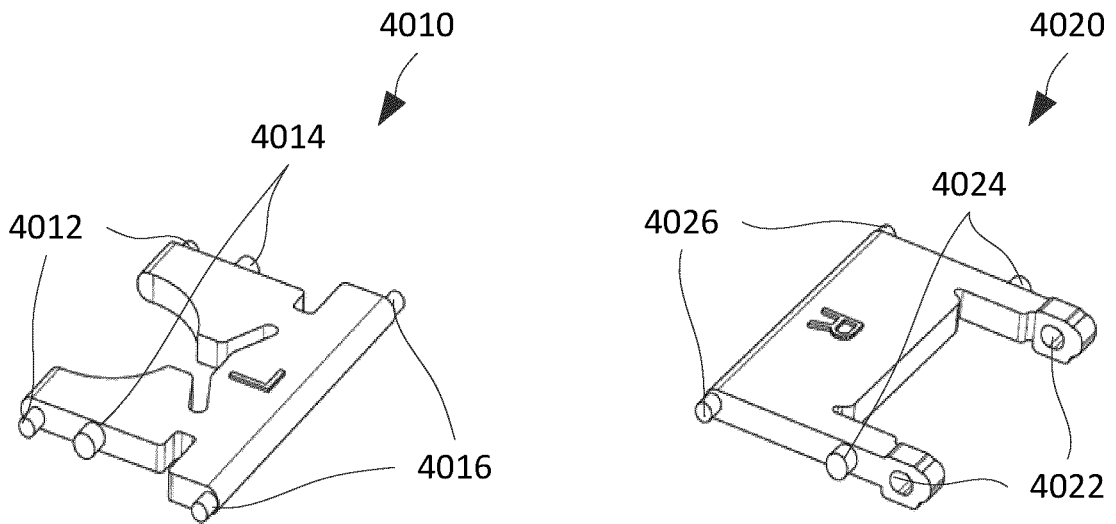

Referring to FIGS. 12a-12c, the first lever 4010 and the second lever 4020 are shown in more detail.

The first lever 4010 comprises at least one pin 4012 that extends from a protrusion of the first lever 4010. In this embodiment, the first lever 4010 comprises a pair of pins extending from opposing protrusions of the first lever 4010.

The first lever 4010 also comprises a pair of plate mounting pins 4014 that are arranged to attach the first lever 4010 to the mounting plate 4030 as well as a pair of keycap mounting pins 4016 that are arranged to attach the first lever 4010 to the keycap 2050.

The second lever 4020 comprises at least one hole 4022 in a protrusion of the second lever 4020. In this embodiment, the second lever 4020 comprises a pair of protrusions, with each protrusion comprising a hole.

Similar to the first lever 4010, the second lever 4020 also comprises a pair of plate mounting pins 4024 that are arranged to attach the second lever 4020 to the mounting plate 4030 as well as a pair of keycap mounting pins 4026 that are arranged to attach the second lever 4020 to the keycap 2050.

The pins 4012 of the first lever 4010 are arranged to fit inside the holes 4022 of the second lever 4020. In this way, the first lever 4010 and the second lever 4020 can be arranged about the silicone dome 2032 with the pins 4012 of the first lever 4010 located within the holes of the second lever 4020. The first lever 4010 and the second lever 4020 can then be attached to the mounting plate 4030 using plate mounting pins 4014, and the keycap 2050 can be attached to the first lever 4010 and the second lever 4020 via the keycap mounting pins 4016, 4026.

Figure 13A:
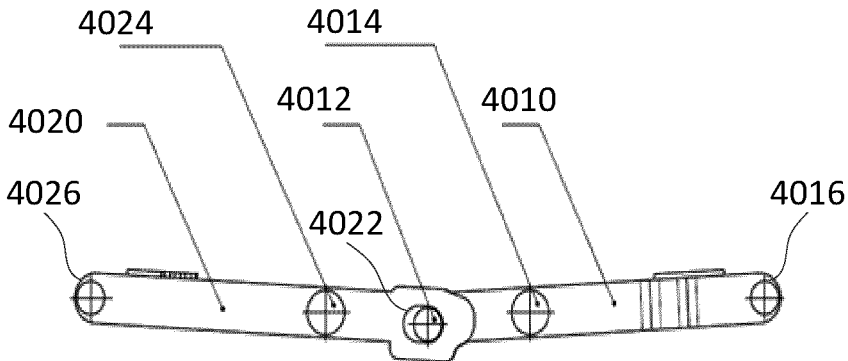
FIGS. 13*a* and 13*b* show an arrangement for attaching the first lever and the second lever of the keypress mechanism of FIG. 11.
Figure 13B:
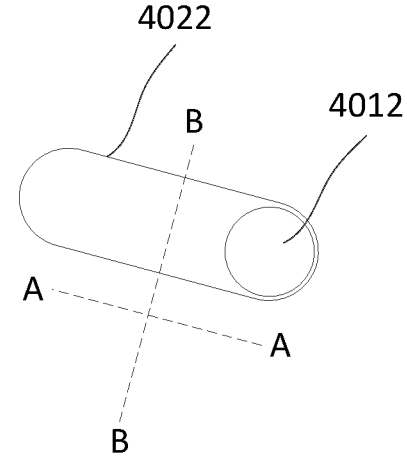

Referring to FIGS. 13a and 13b, there is shown the attachment of the first lever 4010 to the second lever 4020.

The pins 4012 of the first lever 4010 are arranged to fit inside the holes 4022 of the second lever 4020.

The holes 4022 of the second lever 4020 are shaped so as to allow movement of the pins 4012 of the first lever 4010 along the holes 4022. Typically, this comprises the pins 4012 being substantially circular and/or the holes 4022 being elongated. Typically, the holes are shaped as ovals or oblongs with a minor axis length that is similar to a radius of the pins 4012. The holes 4022 are shaped so as to allow movement of the pins in a first direction A-A, where this direction may change as the key is depressed. The first direction A-A is typically parallel to the plane of the second lever 4020.

Typically, the pins 4012 are sized to fit snugly in the holes 4022 so as to substantially prevent movement of the pins 4012 in a second direction B-B while allowing movement in the first direction A-A, which movement in the first direction A-A is not subject to large frictional forces. This enables smooth movement of the pins 4012 along the holes 4022.

The pins 4012 and/or the holes 4022 may comprise material that aids smooth movement; for example the pins 4012 and/or the holes 4022 may comprise a material with a low coefficient of friction.

In some embodiments, the pins 4012 are slightly oversized as compared to the radius of the holes 4022 as well as being elastically deformable. This enables the first lever 4010 and the second lever 4022 to be held together using a snap fit. This also provides an amount of frictional resistance to the movement of the pins 4012 along the holes 4022 in the direction of the second axis B-B, which frictional resistance can be used to provide resistance to a keypress.

In some embodiments, the holes 4022 are non-uniform, e.g. the holes may be roughened or coated with a high friction material in certain places. This can be used to alter the resistance to movement as the key 2002 is pressed and the pins 4012 moves move along the holes 4022.

Figure 14A:
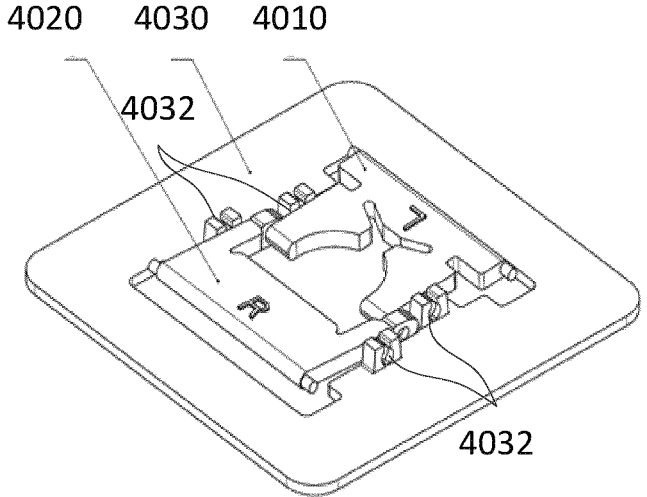
FIGS. 14*a* and 14*b* show the first lever and the second lever being mounted to a mounting plate and a keycap of the keypress mechanism of FIG. 11.
Figure 14B:
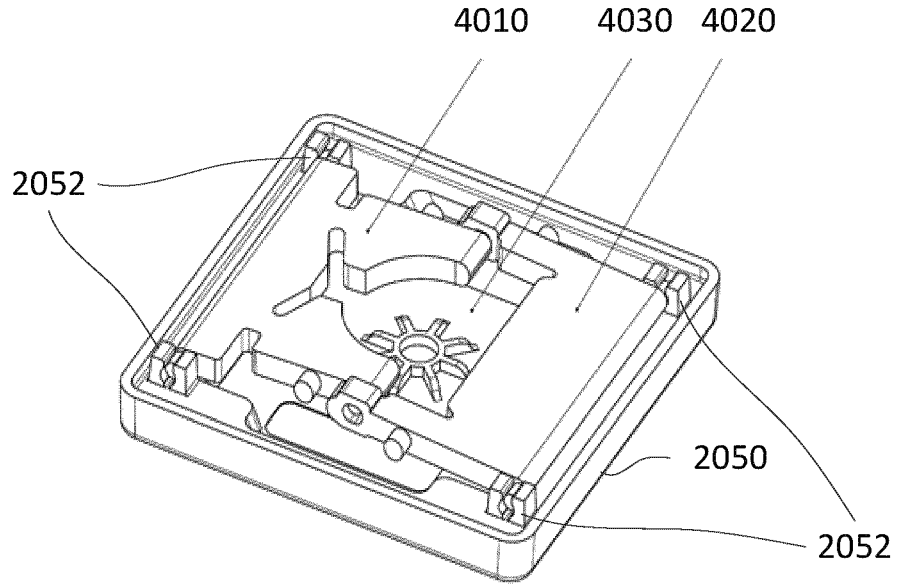

Referring to FIGS. 14a and 14b, there is shown respectively the attachment of the first lever 4010 and the second lever 4020 to the mounting plate 4030 and the attachment of the first lever 4010 and the second lever 4020 to the keycap 2050.

Referring to FIG. 14a, the first lever 4010 and the second lever 4020 are attached to the mounting plate 4030 using the plate mounting pins 4014, 4024. The mounting plate 4030 comprises mounting pin holders 4032 that are arranged to hold the plate mounting pins 4014, 4024 to restrict and/or prevent translational movement while allowing rotational movement. Typically, the mounting pin holders 4032 allow rotation in about a single axis.

The plate mounting pins 4014, 4024 and mounting pin holders 4032 may be arranged to enable the plate mounting pins 4014, 4024 to be removed from the mounting pin holders 4032. Typically, the mounting pin holders 4032 comprise resiliently-deformable snap-fit latches, where the plate mounting pins 4014, 4024 can be pushed into the mounting pin holders 4032 by elastically deforming the mounting pin holders 4032 and the plate mounting pins 4014, 4024 are then held firmly in place (to allow rotation, but not translation, of the plate mounting pins 4014, 4024). In various embodiments, there are varying degrees of stiffness with which the plate mounting pins 4014, 4024 are held by the mounting pin holders 4032; the force required to rotate the mounting pins 4014, 4024 and thereby the force required to depress the keycap 2050 depends on this stiffness.

Referring to FIG. 14b, the first lever 4010 and the second lever 4020 are attached to the keycap 2050 by locating the keycap mounting pins 4016, 4026 in keycap pin holders 2052. The attachment to the keycap 2050 is typically similar to the attachment to the mounting plate 4030, where the keyboard mounting pins 4016, 4026 are able to rotate relative to the keycap 2050, but are substantially prevented from translational movement relative to the keycap 2050. While the keycap mounting pins 4016, 4026 are fixed relative to the keycap 2050, as the keycap 2050 is depressed the keycap mounting pins 4016, 4026 will experience a force that acts to cause a translation relative to the mounting plate 4030. The amount of translational movement possible for the keyboard mounting pins 4016, 4026 depends on the tolerance of the connection between the keyboard mounting pins 4016, 4026 and the keycap pin holders 2052; this tolerance may be such that a small degree of translation movement is possible (e.g. less than 0.1 mm), or such that effectively no translation movement is possible.

Figure 15A:
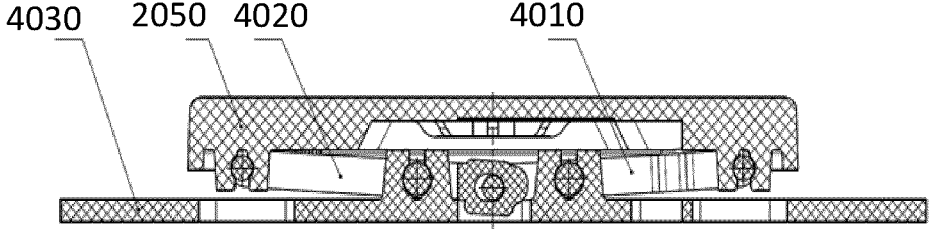
FIGS. 15*a* and 15*b* show, respectively, the keypress mechanism of FIG. 11 in a raised position and a depressed position.
Figure 15B:
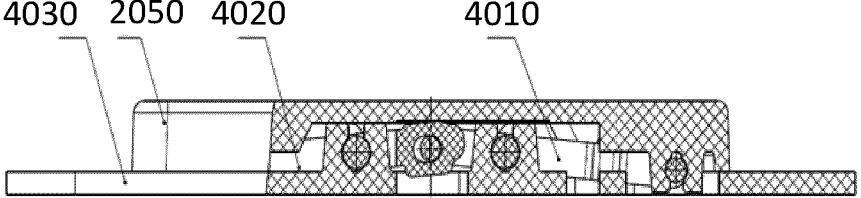
Figures 16A, 16B, 16C:
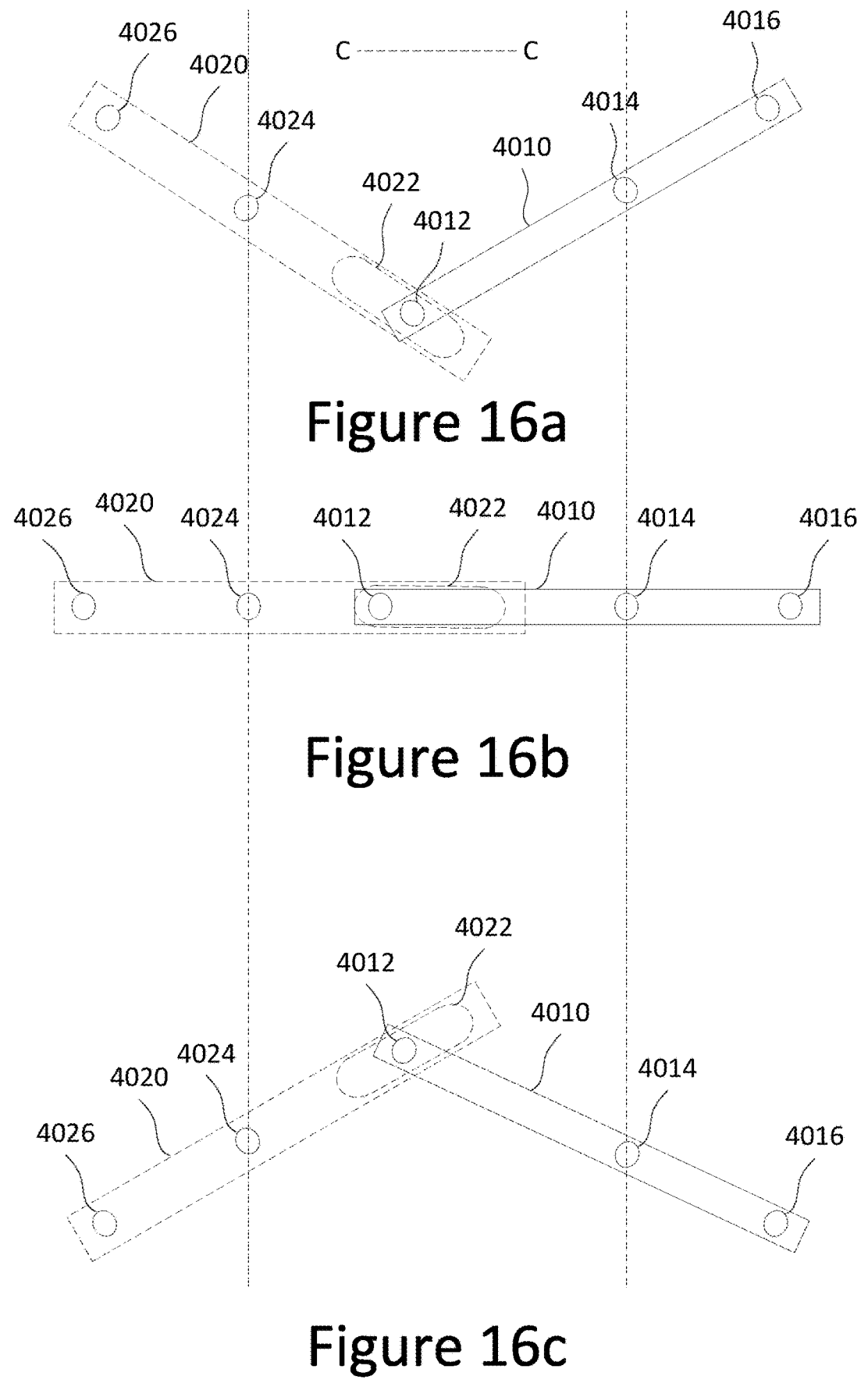

Referring to FIGS. 15a and 15b, the operation of the cams mechanism 4000 as the key is depressed is described. FIG. 15a shows the keycap 2050 and the cams mechanism 4000 in a raised state; FIG. 15b shows the keycap 2050 and the cams mechanism 4000 in a depressed state. FIGS. 16a-16c show an exaggerated movement of the first lever 4010 and the second lever 4020 in, respectively, a raised state, an intermediate state, and a depressed state.

The first lever 4010 and the second lever 4020 are attached to the mounting plate 4030 via the plate mounting pins 4014, 4024 and the mounting pin holders 4032. The first lever 4010 and the second lever 4020 are attached to the keycap 2050 via the keycap mounting pins 4016, 4026 and the keycap pin holders 2052.

The mounting plate 4030 is attached to the base plate 2010 of the keyboard 2000 either directly or via another layer. In some embodiments, the mounting plate 4030 is attached to the hook mounts 2012 of the base plate 2010. The keycap 2050 is arranged to move relative to the mounting plate 4030. Typically, the keycap 2050 is fixed relative to the mounting plate 4030 in two axes; specifically, the keycap 2050 is arranged to be moveable only directly towards and/or away from the mounting plate 4030. This is achieved by connecting the keycap 2050 to the mounting plate 4030 via the first lever 4010 and the second lever 4020, which first lever and second lever are arranged to rotate about a single axis.

As shown in FIG. 16a, when the keycap 2050 is in the raised position, the keycap mounting pins 4016, 4026 of the first lever 4010 and the second lever 4020 are located 'vertically' above (from the perspective of a user) the plate mounting pins 4014, 4024 of the first lever 4010 and the second lever 4020.

As the keycap 2050 is depressed by a user, the keycap mounting pins 4016, 4026 move towards the mounting plate 4030. Since the plate mounting pins 4014, 4024 are attached to the mounting plate 4030, this causes the first lever 4010 and the second lever 4020 to rotate relative to each other. The first lever 4010 and the second lever 4020 rotate about the plate mounting pins 4014, 4024. As can be seen from FIG. 16b, this relative movement is enabled by movement of the pin 4012 of the first lever 4010 along the hole 4022 of the second lever 4020. Without the provision of the hole 4022 (e.g. if there was simply a fixed mounting of the first lever 4010 and the second lever 4020), the movement of the levers would not be possible without deforming the attachment point.

As indicated by FIGS. 15a and 15b, the cams mechanism 4000 is typically arranged so that the keycap pin holders 2052 are near the edges of the keycap 2050 and the mounting pin holders 4032 are near the centre of the keycap 2052/mounting plates 4030. With this arrangement, a large vertical movement of the keycap mounting pins 4016, 4026 at the outer ends of the first lever 4010 and the second lever 4020 causes a relatively small vertical movement of the pin

4012 and the hole 4022 at the inner ends of the first lever 4010 and the second lever 4020. This enables the provision of a low profile keyboard.

Preferably, the keycap pin holders 2052 are located less than 1 mm, more preferably less than 0.2 mm from the edges of the keycaps 2050. Preferably, the mounting pin holders 2052 are located less than 1 mm, more preferably less than 0.2 mm from the centres of the mounting plates 4030.

As has been mentioned above, typically the keys 2002 of the keyboard 2000 are constrained to move in only a single direction, referred to here as 'vertically'. Further, the keycap pin holders 2052 and the mounting pin holders 4032 are typically arranged to substantially prevent translation movement of the keycap mounting pins 4016, 4026 and the plate mounting pins 4014, 4024.

However, as can be seen from FIG. 16, the depression of the keycap 2050 causes the distance between the keycap pin holders 2052 and the mounting pin holders 4032 to decrease. Therefore, since the mounting pin holders 4032 are fixed to the mounting plate 4030, either the first lever 4010 and the second lever 4020 must deform, or the keycap 2050 must deform as the keycap 2052 is depressed.

As explained with reference to FIGS. 15a and 15b, the cams mechanism 4000 is typically implemented in a low profile keyboard, so that the distances in question are small. Therefore, the components in question may be arranged to elastically deform as the key is depressed—and this deformation can also provide resistance to the depression of a key, which may be desirable. Typically, the keycaps 2050 and/or the mounting connections (the mounting pin holders 4032 and keycap pin holders 2052) are made of plastic—this typically enables sufficient deformation to allow a keypress. Equally, the manufacturing tolerances for the mounting connections are typically such that sufficient translational movement is possible at the mounting connections to allow for a keypress.

Figures 17A, 17B, 17C:
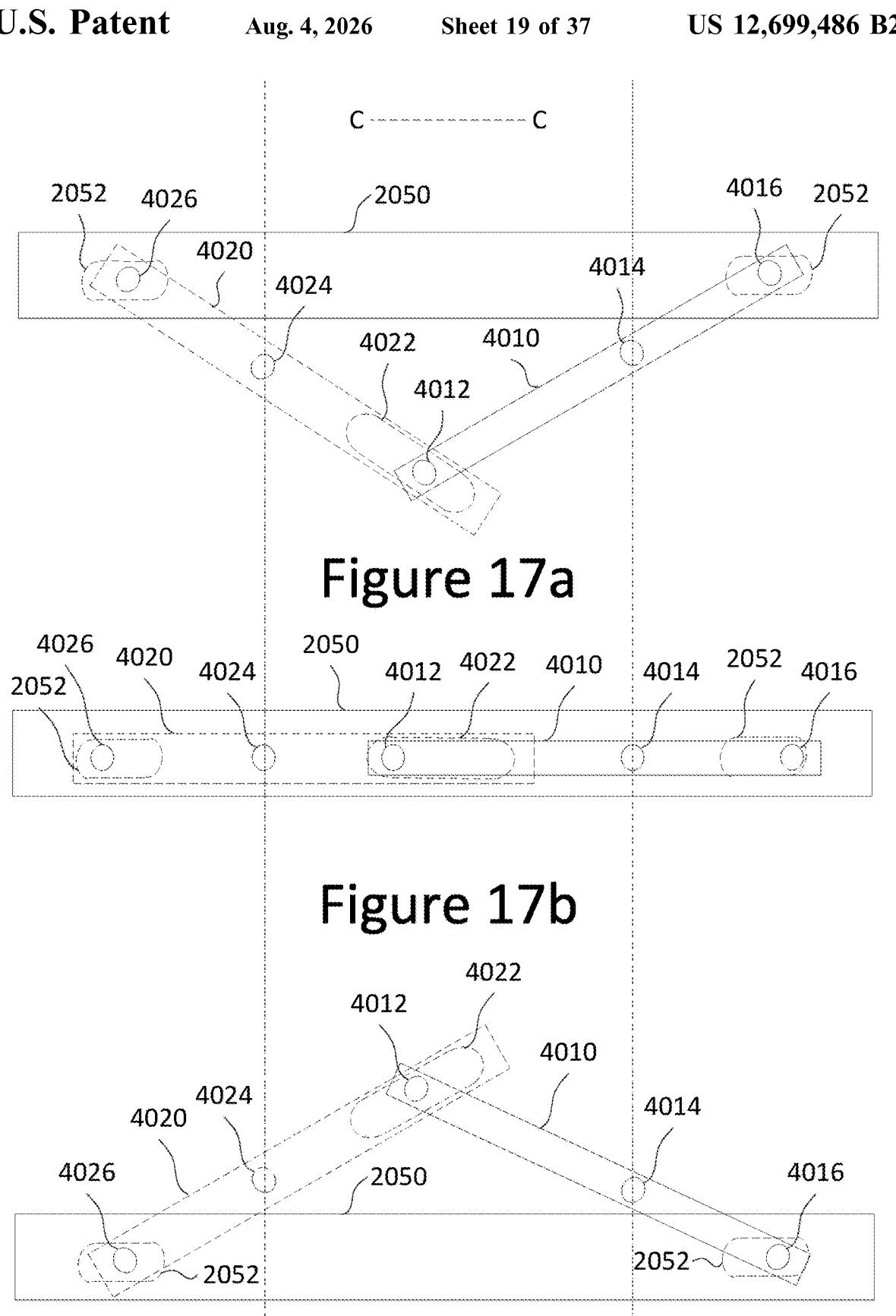
FIGS. 17*a*-17*c* show another embodiment of the keypress mechanism of FIG. 11 being moved between the raised position and the depressed position.

Alternatively, in some embodiments either the mounting pin holders 4032 or the keycap pin holders 2052 are arranged to allow horizontal movement of the plate mounting pins 4014, 4024 or the keycap mounting pins 4016, 4026. This can be achieved by providing an elongated hole or an oblong hole as part of either the mounting pin holders 4032 or the keycap pin holders 2052 (similar to the hole 4022 of the second lever 4020). Typically, the mounting pin holders 4032 are arranged to substantially prevent translational movement, and the keycap pin holders 2052 are arranged so as to allow translational movement of the keycap mounting pins 4016, 4026 along at least one axis, and optionally only one axis, e.g. one 'horizontal' axis. This enables the keycap mounting pins 4016, 4026 to move along the underside of the keycap 2050, e.g. towards and/or away from the centre of the keycap 2050 in the direction of the edges of the keycap 2050. Such an arrangement is shown in FIGS. 17a-17c, where the 'horizontal' movement of the keycap mounting pins 4016 along the keycap pin holders 2052 can be seen.

Typically, at least one of the keycap pin holders 2052 is arranged to allow translational movement of at least one of the keycap mounting pins 4016, 4026.

As the keycap 2052 is depressed, the keycap 2050 depresses the silicon dome 2032, which is located between the first lever 4010 and the second lever 4020. The depression of the silicone dome 2032 is used to detect the depression of the key. This can be used to detect an input to the computer device 1000 (e.g. to type a letter on the display 1014).

The actuation position, that is the position where a keystroke is registered, can be altered by altering the position/properties of the silicone dome 2032 (or of another component, such as a switch, that may be used in place of the silicone dome 2032). This can be used to provide a key with low travel, so that only a small depression is required to provide an input to the computer device 1000.

The silicone dome 2032 is arranged to resist the deformation so that upon the keycap 2050 being released, the silicone dome 2032 acts to return the keycap 2050 to the raised position.

This biasing towards the raised position can also be obtained, or assisted, by:

Providing a tight fit between the mounting plate pins 4014, 4024 and the mounting pin holders 4032, so that rotation of the keycaps results in rotation deformation of the mounting pin holders 4032. The mounting pin holders may comprise a resiliently deformable material that resists this deformation.

Providing fixed mounting pin holders 4032 and keycap pin holders 2052. Depression of the keycap 2050 will then deform either the holders or the first lever 4010 and the second lever 4020, which components will act to return the keycap to a raised position.

The hole 4022 of the second lever 4020 being tapered so that the pin 4012 enters a narrower region of the hole 4022 as the keycap 2050 is depressed.

Forming the cams mechanism 4000 from a resiliently deformable material.

Providing a resilient material as part of the cams mechanism 4000, so that as the keycap 2050 is depressed, the resilient material is deformed and provides a force to return the keycap to the raised position. The deformable material may, for example, be located in the keycap pin holders 2052 where the keycap pin holders are arranged to allow translation movement (e.g. as described with reference to FIGS. 17a-17c).

The example of FIG. 16 shows an arrangement where the first lever 4010 and the second lever 4020 move from a 'v-shaped' arrangement to a horizontal arrangement and then to a 'inverse-v-shaped' arrangement. In such an arrangement, the travel distance of a keystroke (the distance from the raised position to the most depressed position) may be limited by impact of the keycap 2050 on the mounting plate (as shown in FIG. 15b).

In some embodiments, the holes 4022 are designed so that the pins 4012 abut a side of the holes 4022 when the keycap 2050 is above, or at, the intermediate (horizontal) position of FIG. 16b. This abutment optionally occurs when the first lever 4010 and the second lever 4020 are substantially aligned, with the keycap mounting pins 4024, 4026 being (just) above the plate mounting pins 4014, 4016 in the vertical direction (while remaining horizontally spaced). This arrangement prevents the keycap 2050 from 'bottoming out' and striking the mounting plate. This may reduce the noise of the keyboard 2000.

In some embodiments, the keycap 2050 is prevented from bottoming out by using a transmittal mechanism 2030 with a limited travel distance. In some embodiments, the keycap 2050 is prevented from bottoming out by providing keycap pin holders 2052 or mounting pin holders 4032 that limit (respectively) the rotation of the plate mounting pins 4014, 4024 or the keycap mounting pins 4016, 4026.

In this embodiment, the travel of the keycap 2052 is limited by an abutment of the pins 4012 against the ends of the holes 4022.

In contrast to a scissors mechanism, the cams mechanism 4000 is raised from the mounting plate 4030 and the keyboard layer beneath this keypress mechanism. Therefore, dust and debris does not interfere with the cams mechanism 4000. Further, such dust and debris can easily be swept out or blown out of the keyboard 2000. Typically, the cams mechanism 4000 is arranged to contact the mounting plate 4030 and/or the layers of the keyboard beneath the cams mechanism 4000 only at the plate mounting pins 4014, 4024.

In various embodiments, the travel distance of the keycap (from the raised to the depressed state) is less than 2 mm, less than 1 mm, less than 0.5 mm, and/or less than 0.2 mm.

In various embodiments, the distance between the plate mounting pins 4014, 4024 to either side of the pin 4012 and the hole 4022 is less than 0.5 mm, less than 0.2 mm, less than 0.1 mm, less than 0.05 mm, and/or less than 0.02 mm.

The plate mounting pins 4014, 4024 and/or the keycap mounting pins 4016, 4026 typically comprise latches and/or a non-continuous hole. This enables the plate mounting pins 4014, 4024 and/or the keycap mounting pins 4016, 4026 to be inserted via a snap-fit. This also enables simple removal of the keycap from the cams mechanism 4000 and simple removal of the first lever 4010 and the second lever 4020 from the mounting plate 4030, thereby simplifying the cleaning and maintenance of the cams mechanism 4000.

In some embodiments, the mounting plate 4030 comprises one or more recesses arranged to receive a part of the keycap 2050, the first lever 4010, and/or the second lever 4020. Such recesses can be seen in FIG. 15a; this enables the depressed position of the keycap to be close to the base plate 2010 and therefore enables the raised position to be lower than for a mounting plate without the recesses. This enables the provision of a low profile keyboard.

In various embodiments:

The keycap mounting pins 4016, 4026 are arranged to be above the plate mounting pins 4014, 4024 in a raised position of the keycap 2050.

The keycap mounting pins 4016, 4026 are arranged to be above and/or at the same level as the plate mounting pins 4014, 4024 in a raised position of the keycap 2050. and/or The keycap mounting pins 4016, 4026 are arranged to be above the plate mounting pins 4014, 4024 in a raised position of the keycap 2050.

The keycap mounting pins 4016, 4026 are arranged to be below as the plate mounting pins 4014, 4024 in a raised position of the keycap 2050. and/or The mounting plate 4030 is arranged to be mounted to the base plate 2010.

The mounting plate 4030 comprises a part of the base plate 2010. In particular, the plate mounting pins 4014, 4024 may be provided on the base plate 2010.

This final arrangement in particular enables a low profile keyboard.

Preferably, in order to achieve the low profile keyboard, the plate mounting pins 4014, 4024 are raised above the level of the mounting plate 4030, e.g. by at least 0.05 mm, at least 0.1 mm, at least 0.5 mm, and/or at least 1 mm.

In some embodiments, the first lever 4010 and the second lever 4020 are arranged to define an angle of less than 180 degrees (towards the keycap 2050) when the keycap 2050 is in a raised position and an angle of greater than 180 degrees (towards the keycap 2050) when the keycap 2050 is in a depressed position. In various embodiments, the angle between the first lever 4010 and the second lever 4020 is greater than 135 degrees, greater than 150 degrees, greater than 170 degrees and/or greater than 175 degrees when the keycap 2050 is in the raised position and the (same) angle between the first lever 4010 and the second lever 4020 is at least 185 degrees, at least 190 degrees, at least 200 degrees, at least 210 degrees, and/or at least 240 degrees when the keycap 250 is in the lowered position.

Figure 18A:
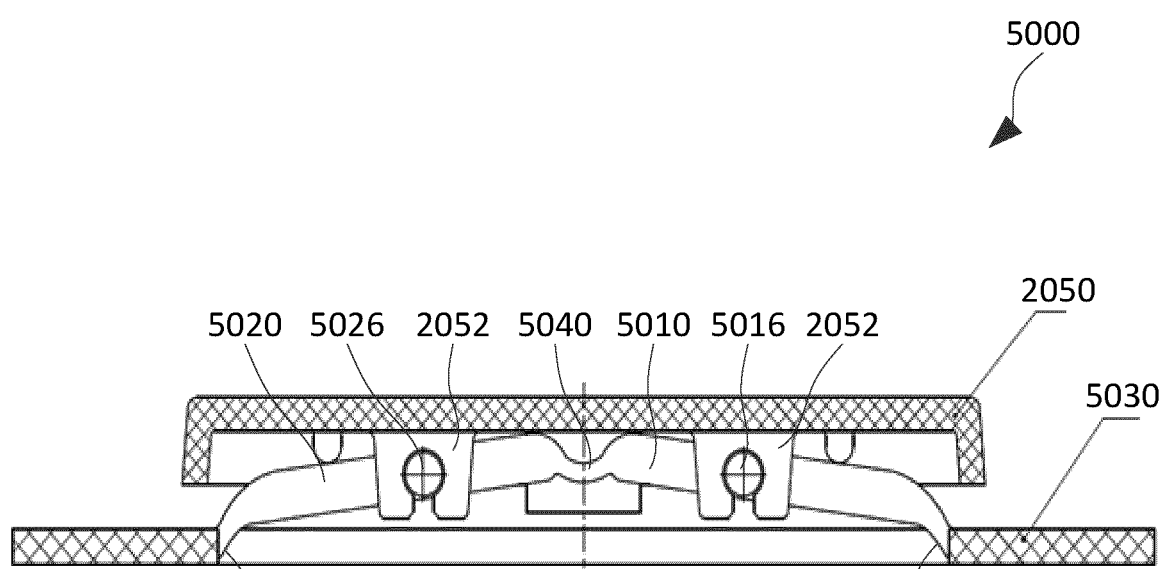
FIGS. 18*a* and 18*b* show an embodiment of another keypress mechanism in a raised position and a depressed position.
Figure 18B:
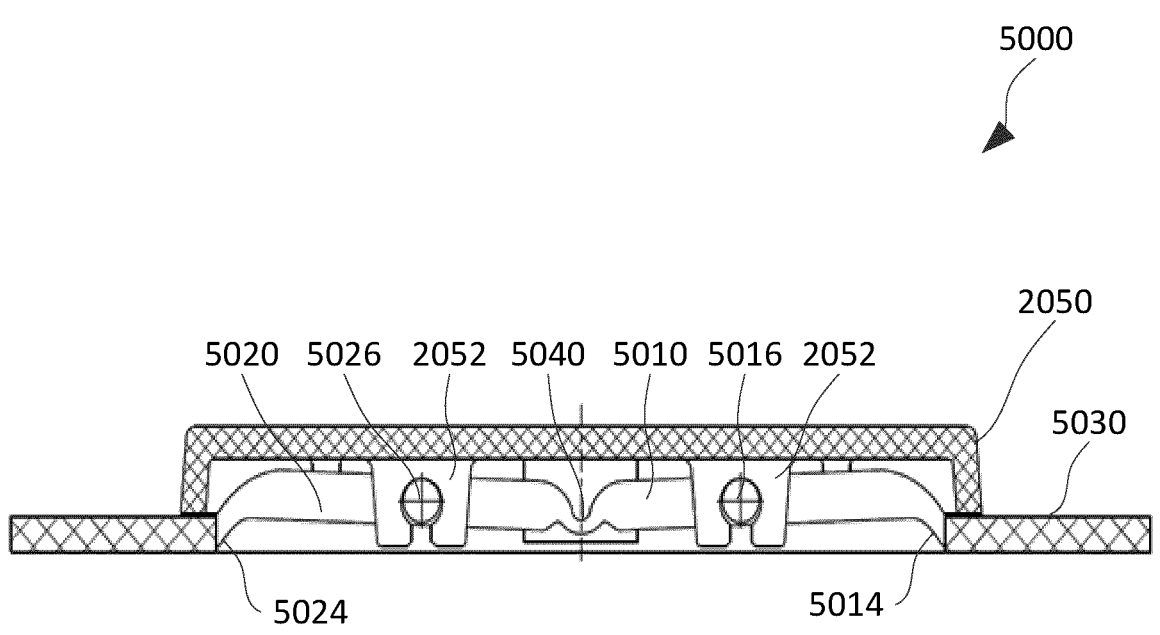

Referring to FIGS. 18a and 18b, an embodiment of an alternate keypress mechanism, hereafter referred to as a 'wings' mechanism 5000, is described.

FIG. 18a shows the wings mechanism 5000 in a raised position, FIG. 18b shows the wings mechanism 5000 in a depressed position.

The wings mechanism 5000 contains components similar to the cams mechanism 4000 which are numbered similarly. Specifically, the wings mechanism 5000 comprises: a first wing 5010 and a second wing 5020 (which are also referred to as a first lever 5010 and a second lever 5020) that are connected to a mounting plate 5030 at first and second plate mounting points 5014, 5024.

In contrast to the pin and hole connection of the cams mechanism 4000, the first wing 5010 and the second wing 5020 are connected by a wing neck 5040. The wing neck 5040 may be less than 0.1 mm in length, less than 0.3 mm in length, less than 0.5 mm in length, less than 1 mm in length, and/or less than 2 mm in length. The wing neck 5040 may be arranged to compress and/or deform as the key is moved from the raised position to the depressed position. Typically, the first wing 5010, the second wing 5020, and the neck 5040 are all integral sections of the same part.

The structure and operation of the wings mechanism 5000 is now described with reference to FIGS. 18a and 18b.

The first wing 5010 of the wings mechanism 5000 is attached to the mounting place 5030 at the first plate mounting point 5014 and is attached to the second wing 5020 at the neck 5040. The second wing 5020 is attached to the mounting plate 5030 at the second plate mounting point 5024 and is attached to the first wing 5010 at the neck 5040. The first wing 5010 is attached to the keycap 2050 by a first keycap pin 5016 and the second wing 5020 is attached to the keycap 2050 by a second keycap pin 5026.

Typically, the first wing 5010 and the second wing 5020 are arranged to abut the keycap 2050 when the keycap 2050 is in the raised position; this can be seen in FIG. 18a. The first wing 5010 and the second wing 5020 may alternatively be spaced from the keycap 2050 when the keycap 2050 is in the raised position.

Typically, the plate mounting points 5014, 5024 are located at an edge of the first wing 5010 and the second wing 5020 that is opposite the neck 5040 and/or the plate mounting points 5014, 5024 are located proximate to the edges of the keycap 2050. Typically, the keycap mounting pins 5016, 5026 are located closer to the centre of the keycap than the plate mounting points 5014, 5024.

In order to allow the first wing 5010 and the second wing 5020 to move as the keycap 2050 is depressed, the neck 5040 is arranged to deform under the force of a keypress. Typically, this comprises the neck 5040 having a smaller cross-sectional area than the first wing 5010 and the second wing 5020 as can be seen in FIGS. 18a and 18b. In some embodiments, the neck 5040 is formed of a different material than the first lever 5040 and/or the second wing 5020.

Typically, the neck 5040 is located underneath a centreline of the keycap 2050; it will be appreciated that the neck 5040 may also be offset from the centreline of the keycap 2050 and/or there may be multiple necks (e.g. there may be a third section under the centre of the keycap, which third section is separated from the first wing 5010 by a first neck and from the second wing 5020 by a second neck).

Typically, the neck is arranged to move towards the mounting plate 5030 as the keycap 2050 is depressed.

Typically, the keycap mounting pins 2052 to which the keycap mounting pins 5016, 5026 are attached are located closer to the centre of the keycap than to the edges of the keycap 2050 (this is in contrast to the embodiment of the cams mechanism 4000 described with reference to FIGS. 11-17; in some embodiments, the keycap mounting pins 5016, 5026 are located midway between the centre of the keycap and an edge of the keycap.

As the keycap 2050 is depressed, the first wing rotates about the first keycap mounting pin 5016 and the second wing 5020 rotates about the second keycap mounting pin 5026. This results in the neck 5040 deforming and the keycap lowering. Typically, the deformation of the neck 5040 and/or the deformation of the first wing 5010 and the second wing 5020 respectively at the first plate mounting point 5014 and the second plate mounting point 5024 acts to resist the depression of the keycap 2050 and acts to return the keycap 2050 to the raised position once the depressing force is removed.

The resisting force that acts to resist a keypress and return the keycap 2050 to the raised position can be varied by varying the shape, size, and/or material of the neck 5040 and the plate mounting points 5014, 5024.

In some embodiments, the neck 5040 is arranged so that deformation of the neck 5040 and/or the plate mounting points 5014, 5024 causes tactile feedback and/or an audible sound. This may improve the user experience of the keyboard 2000, in particular where the keyboard does not comprise a separate transmittal mechanism. In some embodiments, the neck 5040 is arranged to invert towards the bottom of a keypress (e.g. to change from an 'u' shape to a 'n' shape); this can cause a particularly audible click and a release of pressure near the bottom of the keypress. An audible click and/or a release of pressure can also be achieved without such drastic deformation. More generally, the neck 2040 and/or the plate mounting points 5014, 5024 may be arranged to provide tactile or audible feedback at any point during a keystroke, preferably such feedback occurs at an actuation point, at which a keypress is registered.

In some embodiments, the wings mechanism 5000 is arranged such that no component of the mechanism contacts the other components of the keyboard (apart from the transmittal mechanism 2030) apart from the plate mounting points 5014, 5024. In some embodiments, the first wing 5010 and the second wing 5020 are arranged to be spaced from a plane of the mounting plate 5030 (other than at the plate mounting points 5014, 5024) in both the raised position and the depressed position. This prevents the build-up of dirt and debris beneath the wings mechanism 5000.

The feel of the wings mechanism 5000, the characteristics of a keypress, and in particular the return force provided by the wings mechanism 5000, is determined by a number of factors, which may be altered to provide a desired return force and stiffness. In particular:

The size, shape, angle, and material of the neck 5040. A thicker or stiffer neck acts to provide a stiffer mechanism that requires a larger force to depress. Modification of the neck also alters the sound and feel of the 'click' that occurs when the keycap 2050 is depressed.

The position and composition of the plate mounting points 5014, 5024. In particular, wide mounting points located near the edges of the mounting plate 5030 are usable to provide a mechanism with a low travel of distance that requires less force to depress the keycap 2050. Similarly, the use of a low stiffness material or a narrow section at the mounting points leads to less force being needed to depress the keycap 2050. Typically, the first wing 5010 and the second wing 5020 narrow at the mounting points 5014, 5024, this enables the use of robust wings while requiring only a small depression force.

The angle between the first wing 5010 and the second wing 5020 (towards the mounting plate 5030) in the raised position. Generally, a smaller angle leads to an decreased force being required to depress the keycap 2050 since with a smaller angle between the wings a comparatively large proportion of a depression force acts to in a horizontal direction (e.g. perpendicular to the depression force) at the plate mounting points 5014, 5024.

The position of the keycap mounting pins 2052. In particular the keycap mounting pins 2052 may be provided either near to or far from the centre of the keycap 2050 The keycap mounting pins 2052 being mounted nearer the centre of the keycap 2050 leads to a greater moment at the plate mounting pins 5014, 5024 for the same depression force and therefore a reduced depression force is needed to depress the keycap 2050.

Stroke limiting components may be provided that limit the depression of the keycap 2050 and/or provide a return force. For example, the mounting plate 5030 may comprise resilient stops that are arranged to impact the first wing 5010 and/or the second wing 5020 as the keycap 2050 is depressed.

In some embodiments, the silicone dome 2032 is used to operate a keypress and/or to provide a return force for the wings mechanism 5000. More generally, any transmittal mechanism 2030 may be used to provide a return force, where this transmittal mechanism may be integral to the mounting plate 5030.

Typically, a metal dome is used as part of the transmittal mechanism 2030 for the wings mechanism 5000. A metal dome is stiffer than a silicone dome, which is particularly desirable when providing keys with a short travel distance. In some embodiments, the travel of each key (the distance between the raised position and the depressed position) is less than 1 mm, and/or less than 0.5 mm.

The metal dome may be a part of a larger transmittal mechanism layer comprising a plurality of metal domes. Each metal dome may be an integral part of a sheet of metal domes, which metal domes relate to a plurality of keys.

In some embodiments, the transmittal mechanism 2030 comprises a metal dome that is arranged to be depressed by the keycap 2050. This metal dome may be an integral part of another layer of the keyboard 2000 (e.g. the dome may be a part of the mounting plate 5030 and/or of a metallic transmittal mechanism layer).

Where a metal transmittal mechanism, and/or a metal dome, is used, this component is typically placed beneath the touch sensor layer 2060. This avoids interference and prevents false positive detection of touches.

In some embodiments, the keyboard 2000 is provided without a dedicated transmittal mechanism 2030. In some of these embodiments, the wings mechanism 5000 may be used to actuate a keypress; for example, the neck 5040 of the transmittal mechanism may be arranged to deform so as to interact with the keypress sensor layer 2020 when the keycap 2050 is depressed. This typically, comprises the neck 5040 being arranged to pass through the mounting plate 5030 of the wind mechanism when the keycap 2050 is depressed so as to approach and/or contact a sensor of the keypress sensor layer 2020. In such embodiments, the neck 5040 may not comprise the hole 5042; in some of these embodiments, the hole 5042 may be replaced with a protruding portion that is arranged to interact with the keypress sensor layer 2020 as the keycap 2050 is depressed.

In some embodiments, certain functions of the transmittal layer 2030 (e.g. operating the keypress sensor layer 2020) are performed by a protrusion located on the keycap (as is described with reference to FIG. 19); in these embodiments, the keyboard 2000 may be provided without the transmittal mechanism 2030, where other functions (e.g. providing a return force to a keypress) are performed by the keypress mechanism.

More generally, regardless of the keypress mechanism 2040 that is used, a keycap comprising a protrusion arranged to interact (optionally directly) with the keypress sensor layer 2020 and/or the touch sensor layer may be provided. This protrusion can effectively replace the transmittal mechanism 2030 (e.g. the silicone domes 2032) thereby reducing the complexity of the keyboard 2000. Equally, this protrusion can pass through the touch sensor layer 2060 so as to interact with a metallic transmittal mechanism that is located beneath the touch sensor layer 2060. Where the protrusion replaces the transmittal mechanism 2030, certain functions of the transmittal mechanism are performed by the wings mechanism 5000 (or another keypress mechanism, e.g. the cams mechanism 4000); in particular, the keypress mechanism provides: a resisting force resisting a keypress, a returning force acting to return the keycap 2050 to a raised position, and tactile feedback.

The embodiment of FIGS. 18a and 18b shows the wings mechanism 5000 in use with a key that is substantially square in shape. The wings mechanism 5000 may also be used with (typically keyboards comprise certain keys such as the backspace key that are of a non-square shape). With non-square keys, the plate mounting points 5014, 5024 are typically located on the longer sides of the key, e.g. along the longer sides of a rectangular key. This enables keys of different sizes to provide a similar feel More generally, there is envisaged a keyboard comprising a plurality of wings mechanisms 5000, where each plate mounting point has a similar width (e.g. a similar distance between the plate mounting points 5010, 5020 and the neck 5040). Yet more generally, there is envisaged a keyboard where each keypress mechanism 2040 provides a similar feel and/or return force profile.

In some embodiments, a consistent feel is achieved using a separate structure to provide stiffness. As an example, metal brackets may be provided for larger keys.

Figure 19:
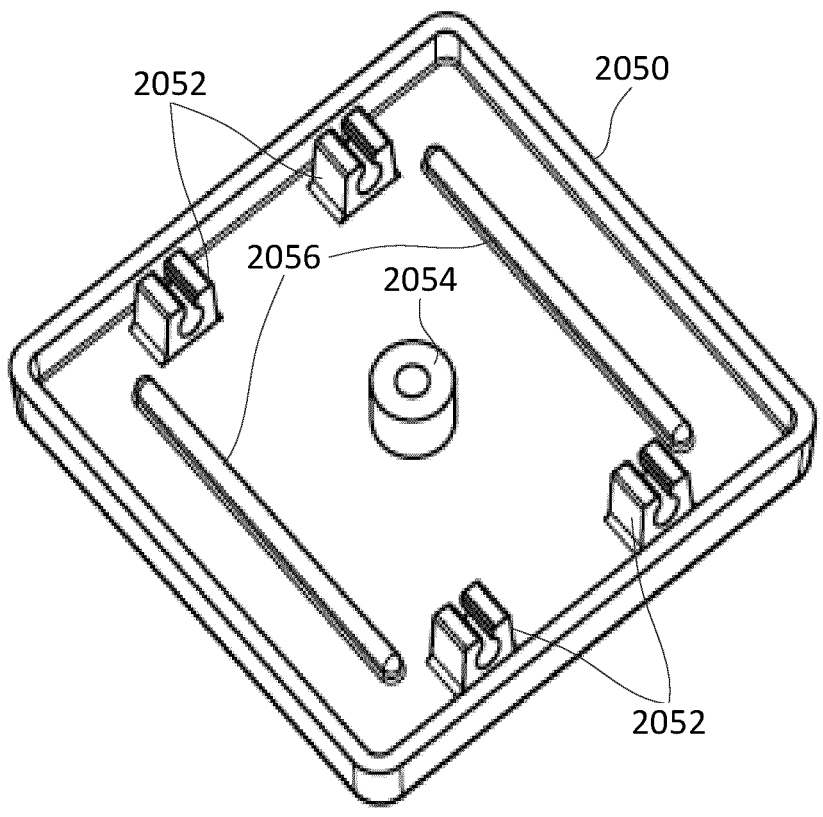
FIG. 19 shows an embodiment of a keycap.

Referring to FIG. 19, an embodiment of the keycap 2050 is shown. There is shown in FIG. 19 the keycap mounting pins 2052 as well as a protrusion hereafter referred to as a transmittal impactor 2054 and a pair of long stops 2056. The transmittal impactor 2054 is arranged to work in conjunction with the transmittal mechanisms 2030 in order to register an impact (e.g. the transmittal impactor 2054 may depress a silicone as the keycap 2050 is depressed). The long stops 2056 are arranged to improve the stability of the keycap 2050 when the keycap is in the depressed position (e.g. by causing a frictional force that resists horizontal movement of the keycap 2050. It will be appreciated that the long stops 2056 are optional and the wings mechanism 5000 may be implemented using a keycap without the long stops 2056. In particular where the long stops 2056 are not used, the stability of the keycap 2050 can be increased by locating the keycap mounting pins 2052 near to the edge of the keycap 2050. For example, the keycap mounting pins 2052 may be located less than 25% of the length of the keycap 2050 from the edge of the keycap 2050, less than 20%, less than 15% or less than 10% of the length of the keycap 2050 from the edge of the keycap 2050.

In some embodiments, the transmittal impactor 2054 of the keycap 2050 of FIG. 19 is used instead of the transmittal mechanism 2030 to detect a keypress; this is particularly useful where the touch sensor layer 2060 is used to detect keypresses. In these embodiments, the transmittal impactor 2054 may be arranged to not directly impact any other component of the keyboard 2000; instead the transmittal impactor 2054 may be arranged to be in proximity to the touch sensor layer 2060 when the keycap 2050 is in the depressed position. Where the transmittal mechanism 2030 is not provided, there may be provided instead a damper mechanism, such as a rubber dome. Where the touch sensor layer 2060 is to be used to detect keypresses the transmittal impactor 2054 may comprise a conductive material (e.g. it may be a rubber dome with conductive coating).

It will be appreciated that the keycap 2050 of FIG. 19, or any of the features of the keycap 2050 of FIG. 19 (e.g. the transmittal impactor 2054 and/or the long stops 2056) may be used in conjunction with the cams mechanism 4000, a scissors mechanisms and/or any other keypress mechanism. Equally, any of the features described with reference to the cams mechanism 4000 or any other keypress mechanism may be implemented in conjunction with the wings mechanism 5000.

Typically the travel distance of the keycap 2050 between the raised position and the lowered position is less than 2 mm, less than 1.2 mm, less than 1 mm, and/or less than 0.8 mm.

Figure 20A:
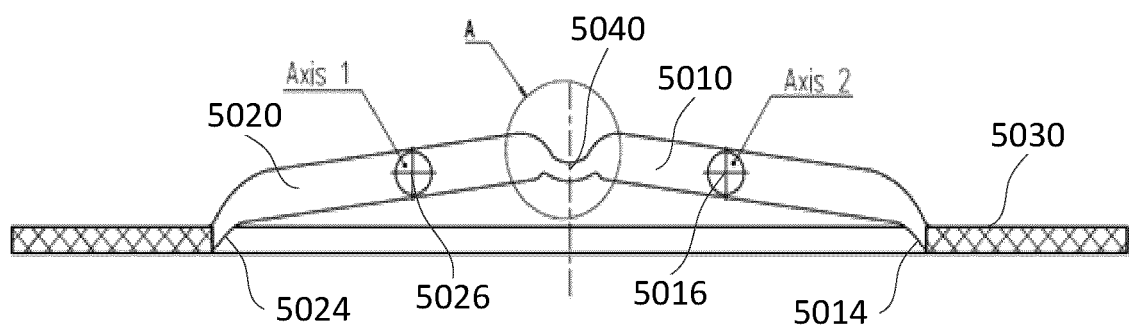
FIGS. 20*a* and 20*b* show the keypress mechanism of FIGS. 18*a* and 18*b* being attached to a mounting plate.
Figure 20B:
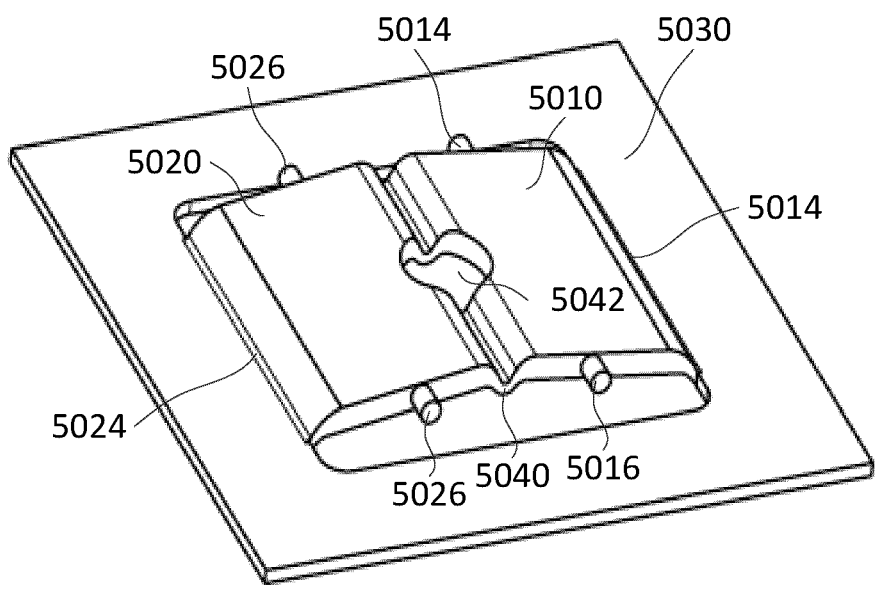

Referring to FIGS. 20a and 20b, the mounting of the first wing 5010 and the second wing 5020 on the mounting plate 5030 is shown. Typically, the first mounting point 5014 and the second mounting point 5024, at which the first wing 5010 and the second wing 5020 are respectively mounted to the mounting plate 5030, extend along at least 20%, at least 50%, and/or at least 75% of a surface of the mounting plate 5030 and/or are at least 0.5 mm long, at least 1 mm long, and/or at least 1.5 mm long.

As shown in FIG. 20b, the neck 2040 (and/or the first wing 5010 and/or the second wing 5020) comprises a hole 5042 through which the transmittal mechanism 2030 and/or the transmittal impactor 2054 is arranged to pass. This enables the transmittal mechanism 2030 to be depressed as the keycap 2050 is depressed.

FIG. 20b also shows that, in this embodiment, each of the first wing 5010 and the second wing 5020 is composed of two sections (in some embodiments each wing 5010, 5020 is composed of only a single section or of more than two sections). More specifically, in this embodiment each wing 5010, 5020 comprises a first section near the plate mounting point 5014, 5024 and a second section that connects the first section and the neck 5040. The angle formed between the first section and the mounting plate 5030 in the raised position may be greater than 5 degrees, greater than 15 degrees, greater than 30 degrees, greater than 45 degrees, greater than 60 degrees, and/or greater than 75 degrees. The angle formed between the first section and the second section may be greater than 30 degrees, greater than 45 degrees, and/or greater than 60 degrees in the raised position. The angle formed between the first wing 5010 and the second wing 5020 (towards the mounting plate 5030) (e.g. the angle formed between the second sections of each wing 5010, 5020) in the raised position may be greater than 130 degrees, greater than 155 degrees, and/or greater than 170 degrees.

Typically, the angle formed between the first wing 5010 and the second wing 5020 (towards the mounting plate 5030) e.g. the second sections of each wing 5010, 5020) in the raised position is greater than 150 degrees, greater than 165 degrees, greater than 180 degrees and/or greater than 200 degrees. Typically, the (same) angle formed between the first wing 5010 and the second wing 5020 (towards the mounting plate 5030) e.g. the second sections of each wing 5010, 5020) in the depressed position is greater than 180 degrees, greater than 200 degrees, and/or greater than 240 degrees.

In some embodiments, the first wing 5010 and the second wing 5020 are an integral part of the mounting plate 5030, where the first plate mounting point 5014 and the second plate mounting point 5024 may comprise thinner sections of material which are arranged to deform as the keycap 2050 is depressed. Typically, the mounting plate 5030, the first wing 5010, the second wing 5020, the first keycap mounting pin 5016, the second keycap mounting pin 5026, and the neck 5040 are formed of a single piece of material and/or are formed of a plastic material.

In some embodiments, the keyboard 2000 comprises an integral wings layer that comprises a plurality of wings mechanisms 5000. This wings layer may be composed of the same plastic material as the individual mechanisms (e.g. the mounting plates 5030 for each mechanism form part of a layer). The provision of an integral wings layer enables simpler construction of a keyboard than a conventional scissors mechanism since a single layer comprising multiple keypress mechanisms can be manufactured (with individual keycaps attached to individual wings mechanisms of this single layer).

In some embodiments, a plurality of different keypress mechanisms are used within the keyboard 2000. In particular, the 'long' keys on the keyboard 2000 (e.g. the space bar) may use a different mechanism to the standard square keys. Typically, each key of the keyboard comprises the same type of mechanism (e.g. the cams mechanism 4000 or the wings mechanism 5000), where certain keys comprise reinforcement. The reinforcement may comprise additional mounting points and/or metal brackets. In some embodiments, the material used for the keypress mechanism differs for one or more pairs of keys (e.g. the mechanisms for the long keys may comprise a stiffer material). In some embodiments, the thickness of the components of the keypress mechanisms 2030 differs for one or more pairs of keys.

Figure 21A:
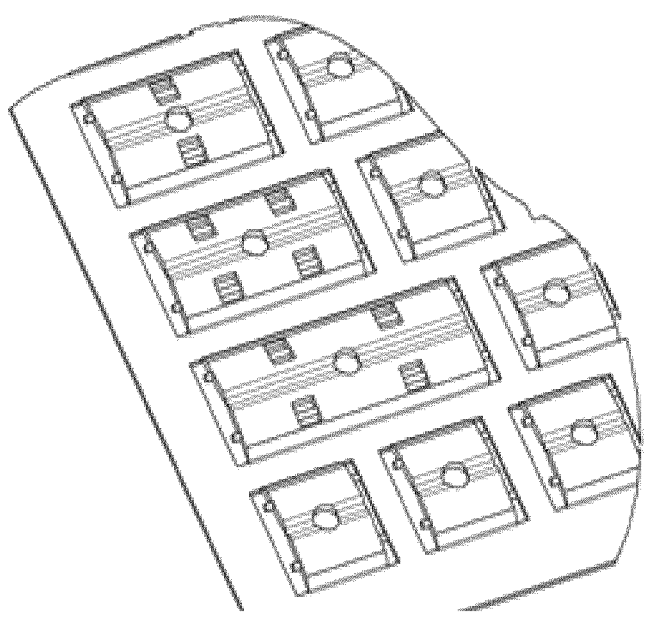
FIGS. 21*a* and 21*b* show embodiments of the keypress mechanism of FIGS. 18*a* and 18*b* that are useable for differently shaped keycaps.
Figure 21B:
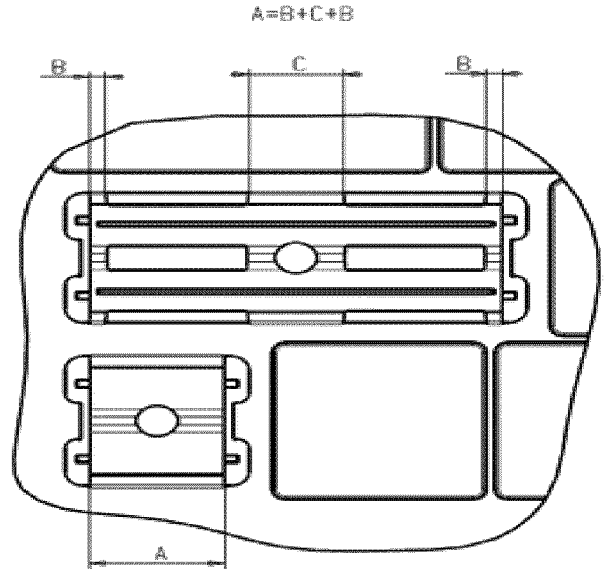

Referring to FIG. 21b, an implementation of the wings mechanism 5000 is shown where the mechanism is used for a range of differently sized keys. As can be seen, the mechanism used for each key is similar, where the mechanism is sized based on the size of the keycap 2050 of the associated key. As aforementioned, certain keys, typically the larger keys may comprise reinforcement. This reinforcement may comprise a non-conductive material so as not to interfere with a touch sensor. Alternatively, the touch sensor layer 2070 (where it is provided) may not extend beneath keys comprising reinforcement.

FIGS. 21a and 21b also show how a single mounting plate may be used for mounting a plurality of keypress mechanisms. Typically, the mounting plate is provided as a mounting plate layer (e.g. the keypress mechanism mounting layer) where sections are provided in the mounting plate for each key. Equally, the mounting plate may be combined with the base plate 2010 where the individual keypress mechanisms are mounted to mounts (e.g. the hook mounts 2012) on the base plate 2010.

Where differently sized wings mechanisms 5000 are provided, the differing lengths of the mounting points 5014, 5024 and the differing sizes of the holes 5042 can result in differing return forces being provided for each key. Therefore, in some embodiments, the lengths and/or properties of the mounting points 5014, 5025 and/or of the necks 5040 of different wings mechanisms 5000 are adapted to provide a consistent return force. In particular, referring to FIG. 21b, the lengths/sizes of the mounting points 5014, 5024 and the necks 5042 of each wings mechanism 5000 may depend on the size of that wings mechanism and/or the size of a related keycap.

In particular, there may be provided gaps in the plate mounting points 5014, 5024 and/or necks 5042 of larger wings mechanisms 5000. More specifically, as shown in FIG. 21b, in some embodiments there are provided a plurality of wings mechanisms 5000 of different size where the total contact area between the wings 5010, 5020 and the mounting plate 5030 is the same for each wings mechanism 5000. Similarly, in some embodiments, there are provided a plurality of wings mechanisms 5000 of different size where the total neck area is the same for each wings mechanism 5000. Equally, a plurality of wings mechanisms may be provided with different material compositions and/or different cross-sections to provide a consistent return force for differently sized/shaped keycaps.

Figure 22:
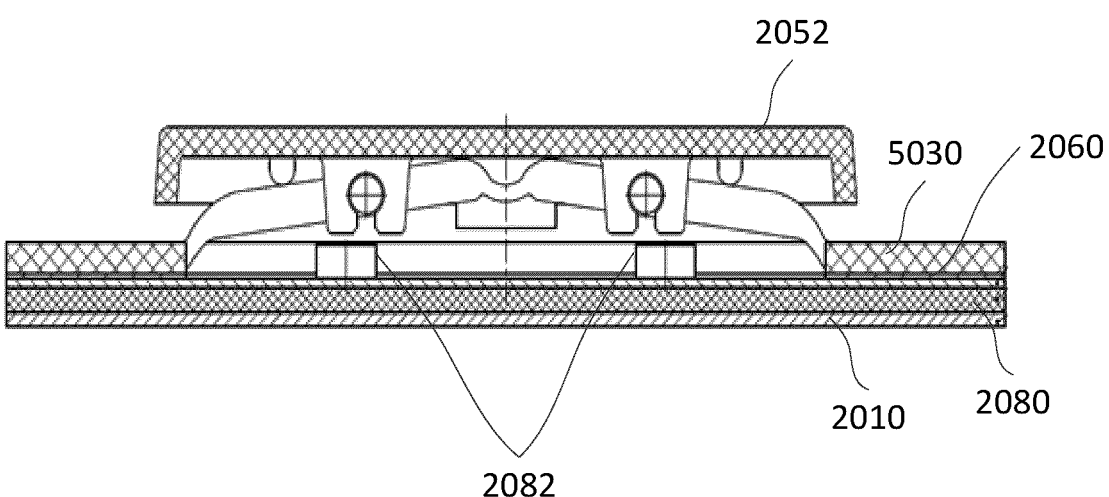
FIG. 22 shows the keypress mechanism of FIGS. 18*a* and 18*b* being attached to other layers of a keyboard.

Referring to FIG. 22 an exemplary placement of the wings mechanism 5000 into the keyboard 2000 is shown. It can be seen that the mounting plate for the wings mechanism 5030 is placed on the touch sensor layer 2060 (and the protective film 2070 and/or a layer of tape may be placed in between the mounting plate 5030 and the touch sensor layer 2060). In the example of FIG. 22, there is also a backlight layer 2080 located underneath the touch sensor layer 2060 with the base plate 2010 located under the backlight layer 2080. The base layer 2010 may comprise hook mounts 2012 to which the mounting plate 5030 can be affixed. As has been described above, in some embodiments the keyboard 2000 does not comprise a base plate 2010.

In the embodiment of FIG. 22, the backlight layer 2080 comprises keycap stops 2082, which are arranged to impact the keycap 2050 and/or the keycap pin holders 2052 as the keycap 2050 is depressed. The keycap stops 2082 can be used to define the depressed position of the keycap 2052 and/or to cushion the descent of the keycap 2050. To this end, the keycap stops 2082 may comprise an elastic, resilient, and/or deformable material (such as rubber). While the embodiment of FIG. 22 has the keycap stops 2082 being located on the backlight layer 2080, it will be appreciated that similar keycap stops may be located on any layer of the keyboard 2000, e.g. on the mounting plate 5030.

In some embodiments, the travel of the keycap 2050 is also, or alternatively, limited by an impact of the transmittal mechanism 2030 and/or the transmittal impactor 2054. Typically, the impact of the transmittal impactor 2054 on the transmittal mechanism 2030 limits the travel of the keyboard.

In particular where the touch sensor layer 2060 is used to detect a keypress, the transmittal impactor 2054 may be arranged to impact, or approach, the touch sensor layer 2060 when the keycap 2050 is in the depressed position. The transmittal impactor 2054 may be arranged to be spaced from the touch sensor layer 2060 when the keycap 2050 is in the depressed position, e.g. spaced by less than 1 mm, less than 0.5 mmm, less than 0.3 mm, and/or less than 0.1 mm. This spacing enables an accurate detection of a keystroke without risking damage to the touch sensor. The transmittal impactor 2054 may comprise the coating 2034 and/or may comprise a conductive material to aid in the sensing of keypresses. As an example, the transmittal impactor 2054 may comprise a metal oxide semiconductor.

Figures 23A, 23B, 23C:
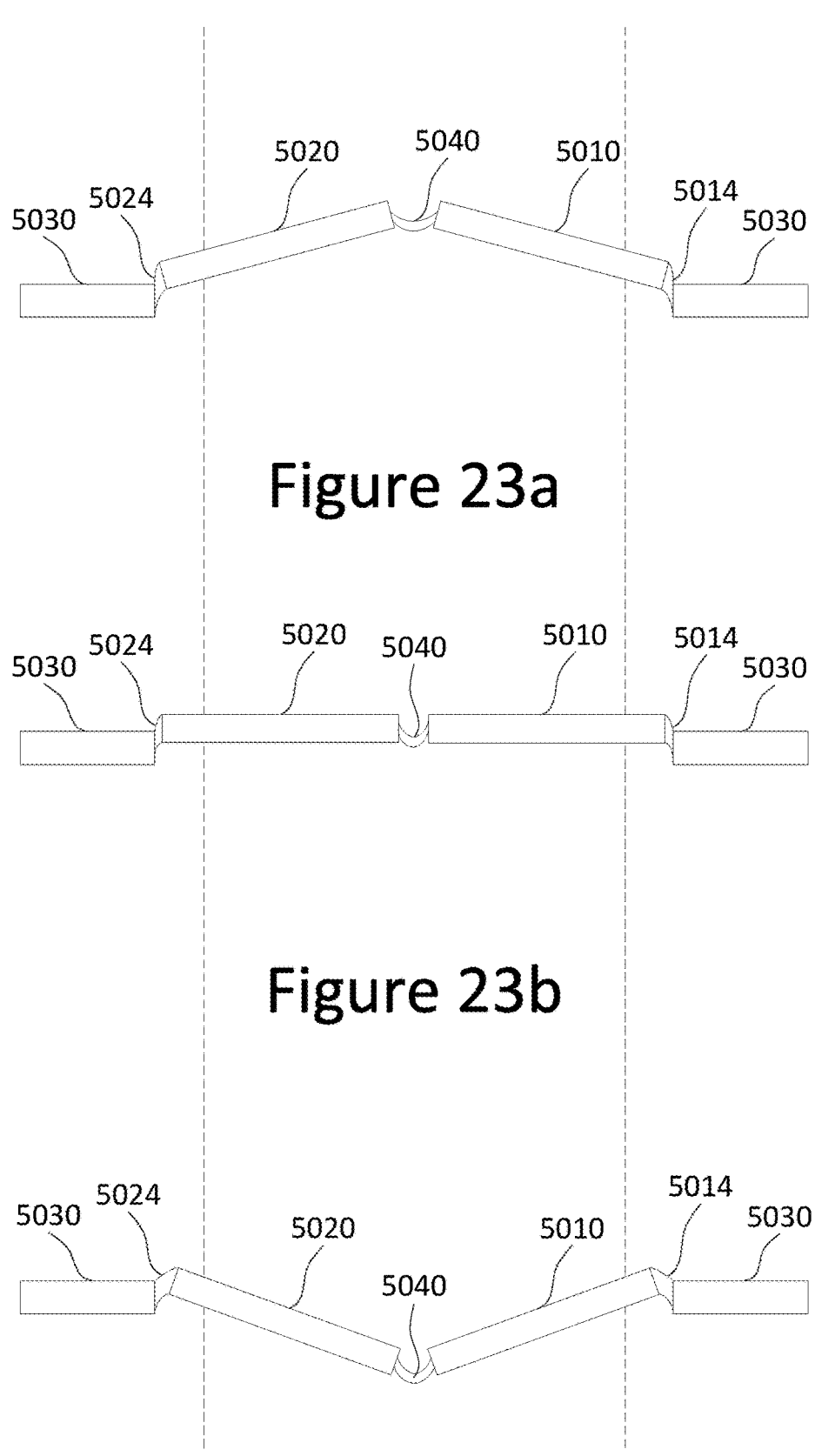
FIGS. 23*a*-23*c* show the keypress mechanism of FIGS. 18*a* and 18*b* being moved between the raised position and the depressed position.

Referring to FIGS. 23a-23c, the operation of the wings mechanism 5000 is described.

In a typical resting state, the keycap 2050 is in the raised position of FIG. 23a. This position occurs before a user depresses the keycap 2050.

When a user depresses the keycap 2050 (e.g. to type a letter) the wings mechanism 5000 is moved from the raised position of FIG. 23a towards the depressed position of FIG. 23c. As this occurs, a force is placed on each of the first wing 5010 and the second wing 5020; this force causes the first wing 5010 to rotate about the first mounting point 5014 and the second wing 5020 to rotate about the second mounting point 5024. The rotation causes a deformation of the wings 5010, 5020 at the locations of the mounting points 5014, 5024 as well as a deformation of the neck 5040. In particular, the rotation of the wings results in a horizontal force that acts to squeeze the neck 5040 and to push outwards against the mounting plate 5030. This force is resisted by the neck 5040 and the mounting plate 5030 creating a pleasant resistive force as the keycap 2050 is depressed.

FIG. 23b shows an intermediary point where the angle between the first wing 5010 and the second wing 5020 is substantially equal to 180 degrees. Above this position, the resistive compressive force of the neck 5040 acts to resist further compression, thereby providing an upwards force that resists the depression of the keycap 2050. In this position of FIG. 23b, the neck 5040 is at the point of maximal deformation, but the resistive compressive force provided by the neck 5040 acts primarily outwards (e.g. there is a minimal vertical component to this force). Due to the position of the neck 5040, beyond the intermediary point, e.g. in the depressed position of FIG. 23c, the resistive force provided by the neck acts to move the keycap 2050 further downwards.

The force at the plate mounting points 5014, 5024 may be arranged to have a similar effect. Above the intermediary point there is an upwards component of force provided by the compression of the material near the plate mounting points 5014, 5024; below the intermediary point, this compressive force acts in the downwards direction.

Typically, the deformation at the plate mounting points 5014, 5024 results in a substantial rotational resistive force that acts to return the keycap to the raised position. Therefore, although the neck 5040 no longer provides an upwards force after the intermediary position, the resistive force at the plate mounting points 5014, 5024 continues to force the keycap 2050 towards the raised position. Typically, the wings mechanism 5000 is arranged so that in the absence of external forces the resistive force at the plate mounting points 5014, 5024 exceeds that at the neck 5040 when the keycap 2050 is depressed. This results in the keycap 5020 being biased towards the raised position so that it returns to the raised position once the keycap 5020 is released by a user.

In some embodiments, the wings mechanism 5000 is instead arranged so that there is an equilibrium position at which the keycap 2050 is in equilibrium (e.g. the neck forces are equal and opposite to the mounting point twisting forces). In some embodiments, the wings mechanism 5000 is arranged so that there is a range of positions at which the keycap 2050 is biased towards the depressed position.

In other words, both the neck 5040 and the plate mounting points 5014, 5024 provide a force that resists the depression of the keycap 2050 until the intermediary point is reached. At this point, the direction of the force provided by the neck 5040 switches, resulting in a rapid reduction in the resistance and an audible click (e.g. as the keycap 5020 quickly bottoms out due to the reduction in force, or as the neck 5040 rapidly moves to a position of maximal deformation). Beneath the intermediary point, the force in the neck acts to further depress the keycap 2050; however, this neck force is exceeded by the rotational force of the plate mounting points 5014, 5024, which acts to move the keycap 2050 towards the raised position. Therefore, once the user releases the keycap 2050, the keycap 2050 moves towards the raised position.

While in the example shown in FIGS. 23a-23c there is a substantial change in the angle between the wings 5010, 5020 between the intermediary and depressed positions, typically the wings mechanism 5000 is arranged so that there is only a small change in angle between these positions. For example, the angle between the wings 5010, 5020 (in the direction of the mounting plate 5030) in the raised position may be less than 180 degrees but greater than 145 degrees, greater than 160 degrees, and/or greater than 175 degrees and this same angle in the depressed position may be greater than 1890 degrees, but less than 190 degrees, and/or less than 185 degrees.

Furthermore, while the example shown in FIGS. 231-23c shows the wings 5010, 5020 moving beneath the level of the mounting plate in the depressed position, it will be appreciated that the wings mechanism 5000 may be arranged to remain entirely above the level of the mounting plate 5030 in the depressed position.

In various embodiments, the travel of the keycap 2050 (e.g. the distance between the raised position and the depressed position) is less than 2 mm, less than 1 mm, and/or less than 0.5 mm.

As the keycap is moved through a first range of positions between the raised position and the intermediary position, the depression of the keycap 5020 typically results in an increasing resistive force being generated by the deformation at the neck 5040 and the plate mounting points 5014, 5024. The direction of this force is increasingly horizontal. By adapting the starting angle and the materials/dimensions of each component a near constant return force can be provided (or an increasing return force up until the intermediary point) can be provided. Alternatively, an increasing return force can be added, which may be desirable to certain users.

Typically, the wings mechanism 5000 is arranged to provide an upwards return force that:

increases (optionally linearly) as the keycap is increasingly depressed through a first range of positions between the raised position and an intermediary position;

reaches a maximum value at an intermediary position;

decreases (optionally linearly) as the keycap is increasingly depressed through a second range of positions below the intermediary position (while typically remaining still resisting further depression);

increases sharply as the keycap 2050 nears or reaches a maximally depressed point (e.g. as the edges of the keycap 2050 impact the mounting plate 5030).

The keycap 2050 is typically arranged to actuate a keypress just below the intermediary point, so that the as the keycap 2050 passes the intermediary position the user hears a click and feels a change in the resistance and a keypress is registered. Equally, the keycap 2050 may be arranged to register a keypress at the maximally depressed point (or indeed any other point).

Typically, the wings mechanism 5000 is arranged to produce an audible sound when a key is fully depressed (e.g. where the edges of the keycap 2050 impact the mounting plate 5030. The neck 5040 may also be arranged so that an audible sound is produced when the keycap 2050 passes the intermediary position. This enables the user to ease off before 'bottoming out' the key in order to avoid irritating surrounding parties. Equally, the neck 5040 may be adapted so that the sound produced from passing the intermediary point is substantially inaudible (e.g. less than 15 dB, less than 10 dB, and/or less than 5 dB from one meter away). The keypress may then be registered by the user solely by the change in feel.

Touch Sensor Layout

Figure 24A:
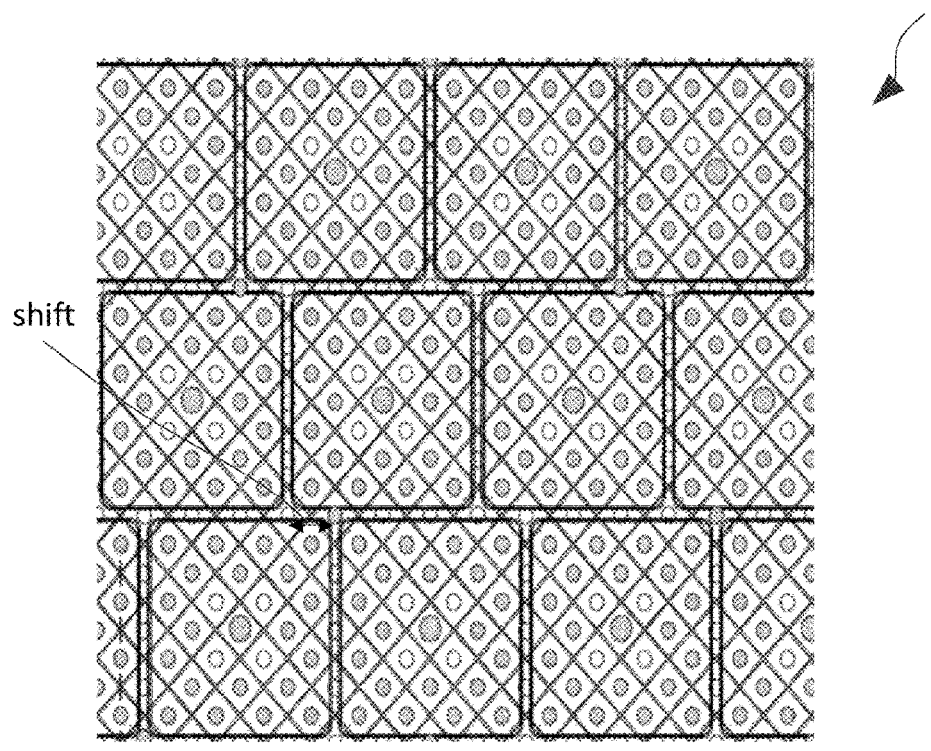
FIGS. 24*a* and 24*b* show a layout of a touch sensor that may be used with the keyboard.
Figure 24B:
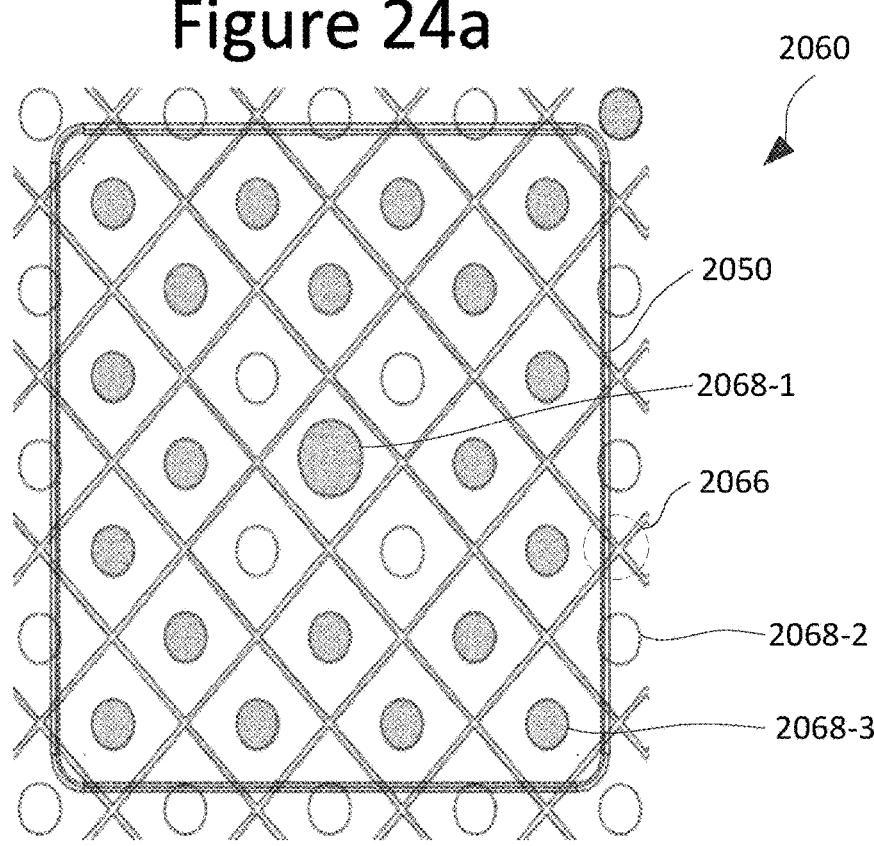

Referring to FIGS. 24a and 24b, an exemplary layout of the touch sensor layer 2060 is shown. In this exemplary layout, the touch sensor layer 2060 is arranged so that there is an integer number of electrode intervals beneath each keycap 2050.

Similarly, in some embodiments, the keycaps 2050, the keys 2002, and/or the arrangement of keys 2002 is dependent on the touch sensor layer 2060. In particular, the keycaps 2050, the keys 2002, and/or the arrangement of keys 2002 may be arranged so that there is an integer number of electrode intervals beneath each keycap 2050.

Typically, there are gaps between the keys 2002 and/or keycaps 2050 of the keyboard 2000 (as can be seen in FIG. 24a). In this case, the keycaps 2050, the keys 2002, and/or the arrangement of keys 2002 may be arranged so that there is an integer number of electrode intervals beneath each combination of: a key 2002 and/or keycap 2050 and a gap adjacent that key 2002 and/or keycap 2050. There may also be an integer number of electrode intervals beneath each key 2002 and/or keycap 2050 and also beneath each gap between keys 2002 and/or keycaps 2050. In general, the conditions described in this specification in relation to a 'keycap' may relate either to a singular key, a singular keycap or to the combination of a key and/or keycap and an adjacent gap between keys and/or keycaps.

As shown in FIG. 24b, in some embodiments the touch sensor layer 2060 comprises a number of holes. The holes may comprise holes for a transmittal mechanism 2068-1, holes for an attachment mechanism 2068-2 (e.g. the hook mounts 2012 of the base plate 2010), and/or holes for allowing the passage of light from the backlight 2068-3.

In various embodiments:

The holes for the transmittal mechanism 2068-1 are larger in area than the holes for the attachment mechanism 2068-2 and/or the holes for the passage of light from the backlight 2068-3;

The holes for the transmittal mechanism 2068-1 have an area of less than $1\times10^{-6}$ m$^2$, less than $5\times10^{-7}$ m$^2$, less than $1\times10^{-7}$ m$^2$, less than $1\times10^{-3}$ m$^2$, and/or less than $1\times10^{-9}$ m$^2$.

The holes for the transmittal mechanism 2068-1 have an area of greater than $1\times10^{-9}$ m$^2$, greater than $5\times10^{-3}$ m$^2$, greater than $1\times10^{-7}$ m$^2$, and/or greater than $5\times10^{-7}$ m$^2$.

The holes for the attachment mechanism 2068-2 have an area of less than $1\times10^{-7}$ m$^2$, less than $5\times10^{-8}$ m$^2$, less than $1\times10^{-3}$ m$^2$, less than $1\times10^{-9}$ m$^2$, and/or less than $1\times10^{-10}$ m$^2$ The holes for the attachment mechanism 2068-2 have an area of greater than $1\times10^{-10}$ m$^2$, greater than $5\times10^{-9}$ m$^2$, greater than $1\times10^{-3}$ m$^2$, and/or greater than $5\times10^{-3}$ m$^2$ The holes for the backlight 2068-3 have an area of less than $1\times10^{-7}$ m$^2$, less than $5\times10^{-3}$ m$^2$, less than $1\times10^{-3}$ m$^2$, less than $1\times10^{-9}$ m$^2$, and/or less than $1\times10^{-10}$ m$^2$ The holes for the backlight 2068-3 have an area of greater than $1\times10^{-10}$ m$^2$, greater than $5\times10^{-9}$ m$^2$, greater than $1\times10^{-3}$ m$^2$, and/or greater than $5\times10^{-3}$ m$^2$.

It will be appreciated that while the touch sensor of FIGS. 24*a* and 24*b* shows a touch sensor layer 2060 with three types of holes, the touch sensor 2060 may comprise any combination of the holes for a transmittal mechanism 2068-1, holes for an attachment mechanism 2068, and holes for allowing the passage of light from the backlight 2068-3.

The holes may also enable the drainage of water, or other substances that might enter the keyboard 2000. In some embodiments, the touch sensor layer 2060 comprises drainage holes that are specifically arranged to enable the passage of contaminants (e.g. liquids).

In order to simplify the manufacture of the touch sensor layer 2060 and to ensure a consistent response from the touch sensor layer 2060, the holes 2068 of the touch sensor layer 2060 and/or the sensor elements of the touch sensor layer 2060 may be arranged in dependence on one or more of: the layout of the keycaps 2050; the layout of the transmittal mechanisms 2030; and/or the layout of the keypress mechanisms 2040.

Typically, the touch sensor layer is 2060 arranged in a regular pattern, e.g. to simplify manufacture. In some embodiments, the touch sensor layer 2060 may only be arranged as disclosed only in relation to a subset of the touch sensor layer 2060 and/or in relation to only a subset of the keys of the keyboard 2000.

In particular, the touch sensor layer 2060, the keys 2002, and/or the keycaps 2050, may be arranged so that one or more of the following conditions are met:

The edges of any pair of keycaps 2050 (and/or of each pair of keycaps 2050) do not overlap any intersection 2066 of rows and columns of electrodes.

Each keycap 2050 relates to an integer number of electrode rows and/or columns (where a portion of these rows and/or columns may fall outside of the footprint of the keycap 2050. With reference to FIGS. 24*a* and 24*b*, it can be seen that each keycap 2050 relates to four electrode rows and four electrode columns.

Each keycap 2050 and a gap between said keycap and an adjacent gap relates to an integer number of electrode rows and/or columns The shift between two rows of keycaps 2050 is equal to an integer number of electrode intervals. The shift relates to the offset between two rows of keycaps 2050 on the keyboard 2000, as shown in FIG. 24*a*.

The holes of the touch sensor layer 2060 are arranged in a regular pattern.

Any one of the holes for a transmittal mechanism 2068-1, the holes for an attachment mechanism 2068-2, and/or the holes for allowing the passage of light from the backlight 2068-3 are arranged in a regular pattern.

The holes for an attachment mechanism 2068-2 are located at the centre of the sensors of the touch sensor layer 2060.

Two or more of the keycaps 2050 of the keyboard are arranged to relate to a similar electrode pattern.

Two or more of the keycaps 2050 of the keyboard are arranged to relate to the same number of holes of the touch sensor layer 2060.

The pattern of holes in the touch sensor layer 2060 is dependent on the size of one or more keycaps 2050 of the keyboard.

The pattern of holes in the touch sensor layer 2060 is dependent on the gaps between one or more keycaps of the keyboard 2050.

One or more (or a plurality of, or each) keycap 2050, transmittal mechanism 2030 and/or coating 2034 is located, or is arranged to be located, directly above the centre of a sensor (e.g. an electrode) of the touch sensor layer 2060.

One or more (or a plurality of, or each) keycap 2050, transmittal mechanism 2030, and/or coating is located, or is arranged to be located, directly above an intersection of the electrodes touch sensor layer 2060.

While the above conditions have been described with relation to the keycaps 2050 (e.g. a keycaps and/or a combination of a keycap and an adjacent gap), it will be appreciated that the above conditions may also depend on the keypress mechanisms 2040, the transmittal mechanisms 2030, and/or the keypress sensor layer 2020.

The above conditions may be applied across the entirety of the keyboard 2000 or across only a portion of the keyboard 2000, e.g. a portion over which the touch sensor layer 2060 extends. Typically, the above conditions apply to at least 2 keys of the keyboard, at least 5 keys of the keyboard, at least 10 keys of the keyboard and/or at least 20 keys of the keyboard.

Certain keys of the keyboard may be of different sizes; for example, the space bar on a keyboard is normally larger than the other keys. In some embodiments, the touch sensor layer 2060 is sized so as not to overlap with any of the irregularly shaped keys. In some embodiments, the pattern of holes of the touch sensor layer 2060 differs dependent on the size of related keys; for example, in the area of the spacebar the pattern of holes of the touch sensor layer 2060 may be different to the pattern of holes of the touch sensor layer 2060 elsewhere.

Sensor Scanning Rate

In some situations, e.g. where there is no ground layer located between the keypress sensor layer 2020 and the touch sensor layer 2060, the operation of the touch sensor layer 2060 may interfere with the operation of the keypress sensor layer 2020. In particular, the driving of the rows of the touch sensor layer 2060 may induce a current in the sensors 2022 of the keypress sensor layer 2020; this current can lead to the sensors 2022 registering false keypresses. Similarly, the presence of a current in the keypress sensor layer 2020 caused by a keypress may induce a current in the columns 2064 of the touch sensor layer 2060 and thereby cause an erroneous detection of a touch by the touch sensor layer 2060.

Therefore, in some embodiments a scanning time or frequency of the keypress sensor layer 2020, or of a line of the keypress sensor layer 2020, is dependent on a scanning time or frequency of the touch sensor layer 2060, or of a line of the touch sensor layer 2060. Similarly, a scanning time or frequency of the touch sensor layer 2060, or of a line of the touch sensor layer 2060, may be dependent on a scanning time or frequency of the keypress layer 2020, or of a line of the keypress sensor layer 2020.

In particular, the scanning of one or more lines (rows or columns) of the keypress sensor layer 2020 is typically arranged to occur alternately with the scanning of one or more corresponding lines (rows or columns) of the touch sensor layer 2060.

In some embodiments, it may be desirable to scan the keypress sensor layer 2020 more frequently or less frequently than the touch sensor layer 2060. Therefore, the scan rate for one or more lines of the keypress sensor layer 2020 may be an integer multiple of the scan rate for one or more lines of the touch sensor layer 2060 or the scan rate for one or more lines of the touch sensor layer 2060 may be an integer multiple of the scan rate for one or more lines of the keypress sensor layer 2020.

The scan rate for the two sensor layers may both differ and alternate; for example, a line of the touch sensor layer 2060 may be scanned at a frequency of 4 Hz, with a corresponding line of the keypress sensor layer 2020 being scanned at 1 Hz. The line of the touch sensor layer 2060 (and/or the line of the keypress sensor layer 2020) may be arranged to skip a scan based on the scan frequency of the line of the other layer.

For example, a scan pattern may be:

0.00 seconds: scan touch sensor layer 2060 (drive the rows of the touch sensor layer 2060);

0.25 seconds: scan touch sensor layer 2060 (drive the rows of the touch sensor layer 2060);

0.50 seconds: scan touch sensor layer 2060 (drive the rows of the touch sensor layer 2060);

0.75 seconds: scan keypress sensor layer 2020 (and do not drive the rows of the touch sensor layer 2060);

1.00 seconds: scan touch sensor layer 2060 (drive the rows of the touch sensor layer 2060);

1.25 seconds: scan touch sensor layer 2060 (drive the rows of the touch sensor layer 2060);

1.50 seconds: scan touch sensor layer 2060 (drive the rows of the touch sensor layer 2060); and 1.75 seconds: scan keypress sensor layer 2020 (and do not drive the rows of the touch sensor layer 2060).

Typically, the scanning of the touch sensor layer 2060 and/or the keypress sensor layer 2020 is controlled by a control unit (not shown) of the keyboard 2000, which control unit is arranged to sense a keypress and/or a touch of a user.

More generally, the scan rate and/or scan pattern of a line of the keypress sensor layer 2020 and/or a line of the touch sensor layer 2060 may also depend on one or more of:

another components of the keyboard 2000;

a mode of the keyboard; e.g. whether the keyboard is in a pointer input mode or a keypress detection mode; and a user input.

In general, the control unit is arranged to detect keypresses at a time where the detection of the keypresses is not substantially affected by a signal relating to the touch sensor layer 2060 and the control unit is arranged to detect touch inputs at a time where the detection of a touch input is not substantially affected by a signal relating to the keypress sensor layer 2020. In order to achieve this, the time at which keypresses are detected is typically arranged to not overlap with a time during which a signal of the touch sensor layer 2060 is driven; more specifically, the time at which keypresses are detected may be offset from the time during which a signal of the touch sensor is driven such that there is not a substantial residual effect within the relevant keypress sensor due to the driving of the touch sensor.

Typically, the touch sensor layer 2060 and the keypress sensor layer 2020 each comprise a grid of sensors; therefore a keypress on one side of the keyboard 2000 may be reliably detected while a column of the touch sensor layer 2060 on the other side of the keyboard 2000 is driven. Therefore, it is not necessary for the entirety of the touch sensor layer 2060 and the entirety of the keypress sensor layer 2020 to be assessed at different times. Instead, the detection of signals by a line of the keypress sensor layer 2020 is dependent on the driving of a line of the touch sensor layer 2060 and the detection of signals by a line of the touch sensor layer 2060 is dependent on the driving of a line of the keypress sensor layer 2060.

Therefore, in some embodiments, at a first time the control unit is arranged to detect a keypress relating to a keypress sensor in a first area of the keyboard and to drive a signal relating to a touch sensor in a second area of the keyboard, where the first area is spaced from the second area. The control unit may further be arranged to detect a keypress relating to a keypress sensor in the second area of the keyboard at a second time, wherein the second time is selected so that the keypress sensor in the second area of the keyboard is not substantially affected by the signal driven in relation to the touch sensor at the first time. The control unit may be arranged to drive a signal relating to a touch sensor in the first area (or a third area) of the keyboard at the second time.

In some embodiments, each of the touch sensor layer 2060 and the keypress sensor layer 2020 are arranged to scan at the same frequency, e.g. 100 Hz, in an alternating pattern (so the scanning of the touch sensor layer 2060 may start at t=0 s and the scanning of the keypress sensor layer 2020 may start at t=0.005 s). It will be appreciated that other scanning rates may be implemented.

In various embodiments, one or more of the other components of the keyboard is arranged to have an operating frequency that depends on (e.g. differs from) the scanning frequency of the touch sensor layer 2060. For example, the backlight may be provided using pulse-width modulation, where the frequency of this pulse-width modulation may depend on the scanning frequency of the touch sensor layer 2060.

Touch Modes

Typically, the keyboard 2000 has a number of modes, where the keyboard 2000 is capable of switching between the modes. In particular, the keyboard 2000 typically has at least a pointer input mode and a keypress detection mode. The operation of the components of the keyboard 2000 differs depending on the mode that is selected. Typically, in the keypress detection mode certain signals from the touch sensor layer 2060 are ignored and in the pointer input mode certain signals from the keypress sensor layer 2020 are ignored.

In various embodiments, one or more of the following inputs are used to change between modes:

a certain keypress relating to a keycap 2050 of the keyboard 2000 (e.g. 'F12');

a combination of keypresses (e.g. shift+control+F12);

a gesture detected by the touch sensor layer 2060. In particular, to switch to/from the pointer input mode, a gesture may be used such as a finger tap, a one-finger movement, a two-finger movement, a relative movement of two or more fingers (e.g. a pinch, vertical or horizontal swipes with three or four fingers or a grab in/out with four or five fingers).

In order to avoid undesired switching between modes, one or more of the following factors may also, or alternatively, be considered:

the position of a user's hands on the keyboard 2000. For example, if the user's hands are positioned in a typical typing position (e.g. with index fingers resting on the 'f' and 'j' keys) the keyboard may be locked in a keypress detection mode;

the number, or location, of a user's hands and/or fingers on the keyboard 2000.

a resting time of a user's hands, e.g. if they have been stationary on the keyboard for a certain amount of time;

a previous or current action, e.g. if the user has been typing for a continuous period (or is currently typing). Typically, there is a delay between the last detected keypress and the consideration of a mode-switching input, e.g. it may not be possible to switch to the pointer input mode until at least 100 ms after depressing a keycap in the keypress detection mode.

The context of a connected computer device. In particular, the applications open on the device and the current focus may be determined. For example, where an image editing application is open a grabbing gesture may enter an image editing mode; where a web browser is open, the same grabbing gesture may enter a scrolling mode.

The mode changing inputs and the factors to avoid undesired switching may be controlled by a user.

The function operated by a gesture and/or a keypress may depend on the mode, for example:

in the pointer input mode, typically a tap with one finger emulates a left click and a tap with two fingers emulates a right click;

in the pointer input mode, pressing a key may emulate a click depending on other activity. As an example, pressing a key that corresponds to a previously detected touch position (e.g. the endpoint of a previous gesture) may emulate a click, whereas pressing a key that does not correspond to a previous position inputs a character and/or has no effect. In some embodiments, in order to emulate a click a finger (and/or an input device) may need to be lifted from the endpoint of a previous gesture before the key is pressed.

in the pointer input mode, the depression of a key may operate a function, e.g. pressing the spacebar may emulate a mouseclick; the function operated may depend on a touch input, for example pressing the spacebar using a single finger may emulate a left click, while pressing the spacebar using two fingers may emulate a right click. Similarly, pressing the spacebar while one finger is near the touch sensor layer 2060 may emulate a left click, pressing the spacebar while two fingers are near the touch sensor layer 2060 may emulate a right click, and pressing the spacebar while no fingers are near the touch sensor layer 2060 may input a spacebar keypress;

in the keypress mode, a scrolling gesture (e.g. a vertical scrolling gesture and/or a horizontal scrolling gesture) may operate a case switching function which switches the keyboard between upper case and lower case.

in the keypress mode, a scrolling gesture (e.g. a vertical scrolling gesture and/or a horizontal scrolling gesture) may complete a word, e.g. a scrolling gesture may be used to select a word from a list of possible words based on one or more entered characters.

in the keypress mode, a horizontal gesture may operate a layout switching function which switches the keyboard between layouts (e.g. between the layouts for different languages).

a scrolling function may be achieved by scrolling with two fingers;

a zoom function may be achieved using a pinching motion;

a drag and drop function may occur on the presence of three fingers on the keyboard 2000 being detected.

In a selection mode, movements on the touch pad may emulate a directional pad (e.g. the up, down, left, and right arrows). In particular this enables simple scrolling between a matrix of options. As an example, an emoji selection mode may be entered by using a grabbing motion and an emoji may then be selected from a matrix of emojis by using a touch input to emulate a directional input.

The function operated by a gesture may vary dependent on the mode or may be the same for multiple modes, so that a scrolling gesture may operate a scrolling function in each mode, where the zoom function may only be useable in the pointer input mode. Equally, the same gestures may operate different functions in different modes, so that a pinching gesture may operate a zoom function in the pointer input mode and a keypress in the keypress detection mode.

An alteration to the number of fingers detected by the touch sensor layer 2060 may be ignored, so that if a scrolling function has been started, the addition of removal of a finger may not halt the scrolling function (it may be necessary to remove all fingers, or to slow or stop the motion of fingers in order to halt the scrolling function.

In some embodiments, one or more touch inputs is ignored depending on a detected gesture. As an example, if a scrolling gesture is detected in a first area of the keyboard 2000, touch inputs in other areas of the keyboard 2000 may be ignored. In various embodiments, the ignoring of touch inputs is dependent on one or more of: a detected gesture; the location of a detected gesture; the location of a further detected gesture; and the time between the detection of two or more gestures.

The completion of a gesture determined by the touch sensor layer 2060 may be detected, so that another gesture can immediately be initiated. For example, when a scrolling gesture is stopped, the removal of a finger may result in immediately switching to a pointer moving function. The determination of the completion of a gesture and/or the ignoring of a gesture may depend on a detected gesture and/or a speed of a detected gesture. As an example, during a fast scrolling gesture, the removal of a finger may not result in the ending of the fast scrolling operation; during a slow scrolling gesture, the removal of a finger may result in the ending of the slow scrolling operation and/or a change of the mode of the keyboard 2000.

In some embodiments the keyboard is arranged to determine and/or ignore false touch inputs, where the user touches the keyboard inadvertently without intentionally performing a gesture; such false touch inputs may occur in particular when the user is typing or when the user is resting their hands on the keyboard 2000.

In order to determine and/or ignore false touch inputs, there may be a minimum gesture time for a gesture to be detected; for example, a touch input of less than a second may be ignored. In some embodiments, there is a minimum time and/or distance required for a gesture to be detected and/or a minimum time and/or maximum distance difference for gestures.

In some embodiments, machine learning algorithms and/or artificial intelligence are used to prevent the detection of false touch inputs, to determine gestures, and/or to determine mode-switching gestures. In particular, a neural network may be trained to identify touch false inputs that relate to incidental movements across the keyboard 2000 so that these incidental movements can be ignored. The neural network may be retrained based on a particular keyboard or a particular user. In order to help this retraining, in some embodiments, a user is able to identify false touch inputs (e.g. by pressing a button on the keyboard when a false input is detected as an intentional input). False inputs may also be determined based on the behaviour of the user without explicit input (e.g. if a detected gesture results in a word being typed and the user immediately deletes this word it is likely that the detected gesture was a false input).

The keyboard 2000 may be arranged to update false input detection algorithms based on the user so that false input detection can be personalized. In some embodiments, the keyboard 2000 (and/or software relating to the keyboard 2000) is arranged to store a user profile relating to a user of the keyboard 2000; this user profile may comprise information relating to characteristics of false inputs of a user.

In some modes, the user depressing the keycap 2050 may result in a click function being operated.

In these modes, one or more of the following conditions may need to be met:

The pointer input mode may need to have been active for a certain duration.

The keystroke may need to be in the same location (or approximately the same location) as a related touch input (e.g. the endpoint of a previous gesture).

The finger may need to be lifted before making a click (and pressing without lifting the finger afterwards may result in a normal keypress and a character being typed). In practice, this may involve detecting the end of a gesture, the subsequent lifting of a finger from the endpoint of that gesture, and then a tapping gesture occurring nearby that endpoint.

In some embodiments, the keyboard 2000 has a number of modes relating to different programs—for example, there may be separate modes for media programs, word processing programs, and image editing programs. There may also be separate modes for, for example, Netflix™ and Amazon Prime™.

The modes of the keyboard 2000, and the functionality of gestures/keypresses in each mode may be controlled by the user of the keyboard 2000. For example, the user may be able to add new modes and/or new gestures. In some embodiments, the keyboard comprises a recording mode, where the user is able to record a gesture and connect this gesture to a function. The detection of this gesture at a later time then operates the connected function.

In some embodiments, there are one or more programmable gestures, where these gestures are arranged to be allocated to certain functions. As an example, three finger and four finger scrolling motions may be arranged to only be applicable to certain functions, e.g. these scrolling motions may be arranged to comprise mode changing gestures.

The keyboard 2000 may be arranged to receive modes and/or gestures from a program, application, or external storage device so that, for example, the installation of a program may result in the modes of the keyboard being updated.

In some embodiments, the keyboard 2000 is arranged to start in a certain mode. For example, when a computing device is turned on or when a keyboard is first plugged into an external device a default mode may be selected (e.g. the keypress mode). The default mode may be set by a user of the keyboard 2000.

In some embodiments, the operation of the keyboard 2000, and in particular the operation of the touch sensor layer 2060, depends on a feature, e.g. an application, of a device to which the keyboard 2000 is attached. As an example, the keyboard 2000 may be arranged to transmit only certain gestures in dependence on an application of the device (e.g. only scrolling gestures). Similarly, the ignoring of gestures and/or the sensitivity of the touch sensor layer 2060 may depend on the feature of the device. This operation (e.g. the transmittal of gestures) may also depend on a user input.

Typically, the keyboard 2000 is arranged to detect touch points and determine that a gesture has been performed based on these touch points. The keyboard may then transmit the gesture data or a function relating to the gesture data to an external device (e.g. the keyboard may directly transmit a command to scroll down a page).

In some embodiments, the keyboard 2000 is arranged to also, or alternatively, send touch point data to an external device (e.g. a location of a touch, a time of a touch, and/or an indication of the touching implement such as the finger(s) being used). This enables the keyboard 2000 to be used with a wide range of external devices where the external device may then interpret the touch point data. In these embodiments, the keyboard 2000 may still process the touch point data before transmission. As an example, the keyboard 2000 may be arranged to determine and remove false touch inputs before transmission to the external device.

In some embodiments, the keyboard 2000 is arranged to detect gestures and to modify the touch point data before transmission based on the detected gestures; for example the keyboard 2000 may detect a scrolling gesture and may modify the detected touch point data to remove any points unrelated to the scrolling gesture (e.g. further touches detected while the scrolling gesture is occurring or touches from a hand that is not performing the scrolling gesture). Furthermore, the keyboard 2000 may modify the touch point data to relate to a specified gesture so that an external device can easily determine that gesture that has been performed, e.g. where a scrolling gesture is detected the keyboard 2000 may output a set of touchpoints that relates to an idealized scrolling motion that is easily interpretable by a range of external devices.

In some embodiments, the keyboard 2000 is arranged to selectively send touch point data and gesture data to an external device. The keyboard 2000 may be arranged to send either touch point data or gesture data depending on a mode, e.g. touch point data may be sent in a pointer input mode while gesture data may be sent in a scrolling mode.

In some embodiments, the touch point data is converted to touchpad coordinates (e.g. Microsoft Precision Touchpad coordinates), HID mouse coordinates, and/or HID commands before transmission.

The interpretation of the data and the operation of the keyboard may be driven by an application/interface (e.g. a driver) relating to the keyboard 2000. Specifically, there may be provided an interface that enables interpretation of gestures by applications on a device connected to the keyboard. In various embodiments, third parties are able to access raw touch data or gesture data via this interface in order to enable operation with third party applications. Similarly the keyboard 2000 may access information relating to the device via the interface; this enables the keyboard 2000 to determine, e.g., applications that are open on the device and applications that are currently in use.

The interpretation of gestures (e.g. the conversion from raw touch data to gesture data) may be performed by the keyboard 2000 itself or may be performed by a separate (possibly third party) application on a connected device.

In some embodiments, the response to a gesture depends on the area of the keyboard (and the mode) in which the gesture is detected. For example, in one or more modes:

Certain areas of the keyboard may be "touch only", where keypresses are ignored, or are used to operate touch functions (e.g. mouse clicks).

Certain areas of the keyboard may be "keypress only", where touch inputs are ignored.

Certain areas may be reserved for certain functionality, e.g. an area may be useable only for scrolling gestures. Any other gestures may be interpreted as a scrolling gesture, or may be ignored. More generally, the function operated by a gesture may depend on an area of the keyboard 2000 in which the gesture is performed As an example, a certain area may be designated as a scrolling area, a different area may be designated as a pointer movement area, and a third area may be designated as a function input area (where gestures operate functions).

These areas (e.g. the size and/or functionality of these areas) may be controlled by a user, an application, and/or a mode.

Figure 25:
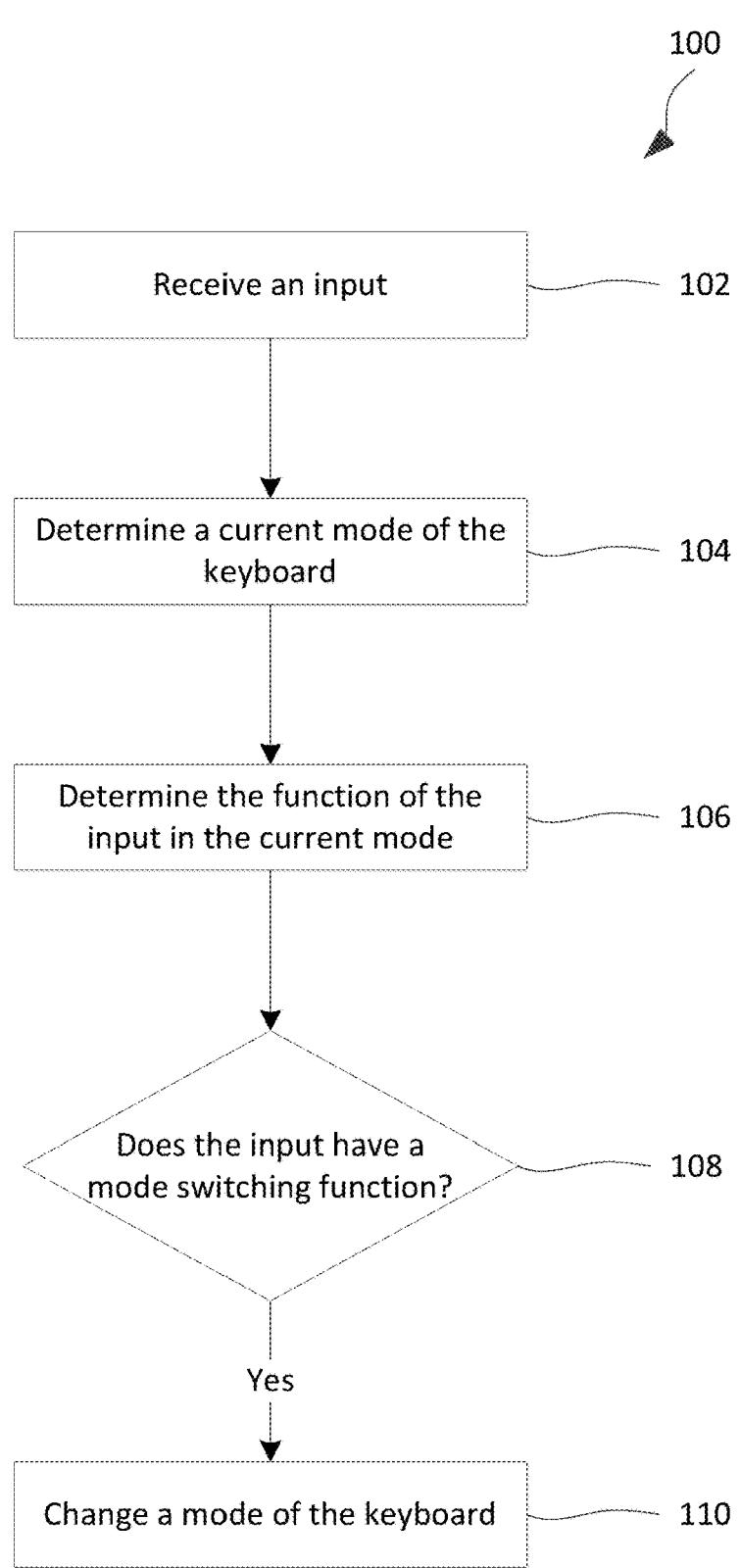
FIG. 25 shows a method of switching between modes of the keyboard.

Referring to FIG. 25, there is shown a method 100 of operating the keyboard 2000 in dependence on a mode of the keyboard.

In a first step 102, a control unit of the keyboard receives an input, specifically either a touch input from the touch sensor layer 2060 or a keypress input from the keypress sensor layer 2020 and/or touch sensor layer 2060.

In a second step 104, the control unit determines a current mode of the keyboard 2000. This mode may for example, be a pointer input mode, a keypress mode, and/or an application specific mode.

In a third step 106, the control unit determines a function relating to the input and the current mode. The function may, for example, be a keypress or a pointer input (e.g. a click or a pointer movement). There may be certain inputs, such as certain gestures, that do not have a defined function for the current mode. Typically, these inputs are ignored.

In a fourth step 108, the control unit determines whether the input has a mode switching function. In a fifth step 109, if the input does have a mode-switching function, the control unit switches a mode of the keyboard 2000 based on the input.

In this regard, the keyboard 2000 may be capable of operating in a number of modes simultaneously, where there may be a primary mode out of the modes. As an example, a keyboard may be placed in both a graphic design mode and a keypress detection mode; this combination enables the use of gestures relating to graphic design while also detecting any keypresses as a keypress input (and so typing the character). Where the graphic design mode is a primary mode, certain keypresses may operate a function relating to this mode instead of typing a character.

The present disclosure relates in part to a method of switching between modes of the keyboard 2000 based on an input gesture. In particular, the control unit may be arranged to determine whether the input has a function for the current mode; if the input does not have a function for the current mode, the control unit determines whether the input has a function for another mode of the keyboard. If the input does have a function for another mode, the control unit may:

Alter a current mode of the keyboard, in particular switch the keyboard to another mode in dependence on the input.

Determine whether the input is a mode switching input. There may be certain inputs for each mode that are able to cause a switch between modes. Typically, these are inputs that are unlikely to be accidentally used, e.g. gestures that use a certain number of fingers, or a specific motion of fingers.

Query the user on whether to switch between modes, e.g. by providing a prompt on the user interface corresponding to the keyboard 2000.

As an example, a user scrolling making a scrolling gesture with all five fingers may operate a scrolling function in a scrolling mode; if the user makes this same gesture when the keyboard 2000 is not in the scrolling mode, the keyboard switches to the scrolling mode.

This gesture may have a related function in another mode (e.g. this function may move a cursor in the pointer input mode); therefore, the control unit first checks whether the gesture has a related function in the current mode of the keyboard 2000 and only switch modes if the gesture does not have a related function in the current mode. The gesture may have a mode-switching function in relation to only certain modes, for example, the five finger scrolling gesture may have a related function in both the scrolling and pointer input modes, but may only act as a mode-switching function for the scrolling mode (so that if the keyboard 2000 detects this gesture when in a keypress detection mode, the keyboard 2000 is switched to the scrolling mode as opposed to the pointer input mode).

The mode to which the keyboard 2000 is switched may depend on the current mode of the keyboard 2000, so that the same gesture may switch to a first mode in a first situation, and a second mode in a second situation. For example, the five finger scrolling function may switch to a scrolling mode if the present mode is a keypress detection mode, and to a pointer input mode if the present mode is a gaming mode.

Exemplary modes, and mode-switching gestures, are as follows:

A "mouse"/"pointer input" mode, where a movement on the touch sensor layer 2060 controls a cursor of the user interface. To switch into this mode, the user may make a swiping gesture over the touch sensor layer, where this swiping gesture may comprise the user of a certain number of fingers (e.g. 3, 4, or 5 fingers). Equally, the user may place a single hand on the keyboard 2000, e.g. in the centre of the keyboard 2000, and remove the other hand from the keyboard.

A "scrolling" mode, which enables scrolling through webpages and documents. An exemplary mode-switching signal comprises the movement of a plurality of fingers along the keyboard 2000 in a swiping motion.

A "typing"/"keypress detection" mode, where the depression of a keycap causes a character to be typed on the user interface. This mode may be activated by the depression of a keycap.

Application and/or situation specific modes, such as:

a gaming mode, and a role-playing gaming mode. In this mode, a movement detected by the touch sensor layer 2060 may cause a movement of a character or map in a certain direction or the casting of a spell/action in a certain direction. Keypress may be treated conventionally, e.g. with WASD being useable to move the character.

A word processing mode. In this mode gestures may be used to perform common functions relating to word processing, for example certain gestures may cause text to change to bold, or italics, may save a document, or may move the location of the text input.

An image design mode. In this mode, a gesture using five fingers may be used to rotate a design. Similarly, tapping the keyboard with different numbers of fingers may be used to add different types of shapes (e.g. lines, circles, etc. Further, sliding over a certain area of the touch sensor layer 2060 may change a value such as a transparency of a model or the size of a brush. Such a mode is particularly useful for computer automated design and image manipulation.

A web browser mode. In this mode, horizontal scrolling motions (e.g. using two fingers) may enable users to move backwards or forwards through the history of a tab. Scrolling motions using additional fingers (e.g. using three fingers) may enable scrolling through tabs.

As described above, a number of modes may be defined by the user, with mode-switching gestures also defined by the user. Mode switching may also occur in dependence on the opening or closing of an application, on a specific time, or on the receipt of an external command (e.g. via the communication interface).

Focusing on a specific example, there is envisaged a scenario where on the opening of an image processing application the keyboard switches into the image design mode. The user is then able to make a certain gesture (e.g. a half-circle gesture) in a certain area to open a tool menu. The tool menu that is opened may depend on the area, so making the gesture over the 'B' key may open a brush tool menu and making the gesture over the 'S' key may open a selection tool menu. The tool menu may also depend on the gesture and/or the direction of the gesture (e.g. an anticlockwise half-circle gesture may open a hardness selection menu and a clockwise half-circle gesture may open a size selection menu). The user is then able to select an option from the tool menu by making a second gesture, e.g. a vertical swiping gesture, to scroll between options for a brush (e.g. to select a brush size or transparency). The user is further able to modify this option by making a third gesture, e.g. a horizontal swiping gesture, to choose between a range of brush sizes. A fourth gesture (and further gestures), e.g. another horizontal swipe, may then be used to further refine the selection.

As suggested by the above example, in some embodiments a user or a third party is able to define a combination of gestures, where the gestures are performed one after the other to operate a certain function. Sticking with the specific example above, a combination of a half-circle gesture, then a vertical swipe, then a horizontal swipe is disclosed. Typically, the combination comprises a combination of gestures that are performed without the user's finger leaving the keyboard 2000; once the user does lift their finger the combination is completed (and, e.g. a brush size is selected).

In some embodiments, the function of a gesture depends on the key on which the gesture is performed. In this way gestures can be used much like hotkeys to enable the user to quickly define and/or perform functions. The same gesture and/or combination of gestures may be used to perform related functions depending on the area in which these gestures are performed. For example, a scrolling gesture may always result in the user scrolling through a menu of options, where the menu depends on the area in which the gesture is performed.

Typically, the performance of gestures results in feedback (e.g. visual feedback on a monitor) being provided to a user so that a user is able to easily control a gesture and determine the result of their making a gesture. In particular, the performance of certain gestures may cause a (preferably translucent) popup to appear on a monitor and to indicate to the user an option that is currently selected. This has particular utility for situations where a user is selecting an option from a menu or a range.

In some embodiments, the keyboard 2000 comprises a feedback means (e.g. a display) to indicate a selected option.

In some embodiments, the keyboard 2000 is arranged to provide tactile feedback—such as a vibration—to the user, e.g. in dependence on a gesture input by the user. In particular, the tactile feedback may be used to indicate a switch between modes, such as a switch between a typing mode and a pointer input mode. In order to provide tactile feedback, a vibration mechanism may be integrated with the baseplate 2010. Equally, a vibration mechanism may be integrated within one or more of the keys of the keyboard 2000 or within one of the other layers of the keyboard 2000.

The feedback provided to the user may vary throughout the course of a gesture. Typically, a gesture requires a certain distance or duration to be identified (e.g. a swiping gesture may need to travel more than 2 mm before being identified as a swiping gesture). The feedback may then indicate the nearing of a gesture and then the completion of a gesture. Where a mode switching gesture is used, the vibration may provide feedback before the mode switch gesture has been completed (to give the user an opportunity to abort the gesture) and the vibration may then provide feedback to confirm that the gesture has been completed and the mode has been switched.

In some embodiments, a mode switching gesture, e.g. to enter the pointer input mode, comprises a gesture that is of a threshold duration, speed, and/or distance (this may be any touch gesture, one of a number of touch gestures, or a specific touch gesture). This duration, speed, and/or distance may depend on a user decision, an application, and/or the gesture being made.

In some embodiments, the detection of a gesture may relate in an output that illustrates or aids a function of that gesture. As an example, in some modes a scrolling gesture may control a transparency; the detection of such a gesture may result in a, optionally semi-transparent, scroll bar appearing on a display relating to the keyboard 2000 so that the current transparency and the minimum/maximum transparency can be seen by a user.

While the above description has primarily described keyboard modes and functions as being related to the keyboard 2000, it will be appreciated that the modes and/or functions of the keyboard 2000 may be enacted by a device connected to the keyboard 2000 (e.g. a processor). As an example, the signals transmitted by the keyboard may comprise touch inputs and/or keypress inputs where these inputs are interpreted by the connected device. In such situations, the modes may still be considered to be implemented by the keyboard 2000, since the connected device is dependent on the keyboard 2000 and so is effectively a part of the keyboard 2000 for the duration of the connection.

While the above description has primarily considered an input that is a keypress and/or a touch input, more generally the input used for mode switching maybe any signal generated by the keyboard 2000 and/or a connected device. In particular, the mode switching may occur in dependence on an activity on a connected computer device. Exemplary activities that may send a mode switching signal to the keyboard 2000 comprise:

The keyboard being connected to and/or disconnected from a device;

an application being opened;

an application becoming active, or being focused on (e.g. where a cursor is located over the application);

an application being closed;

an application being maximised; and an application has been minimised.

In general, the activity of a user on a connected computer device may be evaluated to determine an appropriate mode for the keyboard 2000. The evaluation may comprise an evaluation of a user's current behaviour; a current status of the connected device; and/or previous behaviour or statuses. In some embodiments, artificial intelligence and/or machine learning is used in order to determine patterns of behaviour that enable the pre-emptive switching of a keyboard mode.

In some embodiments, the control unit is arranged to identify a user of the keyboard 2000 and switch a mode of the keyboard 2000 in dependence on the user. Identifying the user may comprise receiving an input from the user and/or determining a login relating to the user (e.g. the user signing into a computer account). Equally, identifying a user may comprise determining characteristic behaviour relating to the user, e.g. a typing speed and/or typing profile.

Switching a mode in dependence on an activity enables the switching of a mode without an explicit user input. To avoid undesired switching, the switch may require confirmation, e.g. a user pressing a key of the keyboard, to confirm that the control unit should indeed switch a mode of the keyboard.

In some embodiments, the keyboard 2000 is arranged to work alongside a mouse; this enables a pointer input to be manipulated using the mouse and the touch sensor layer 2060 of the keyboard 2000 can then be used to provide further functionality based on touch gestures.

Figure 26:
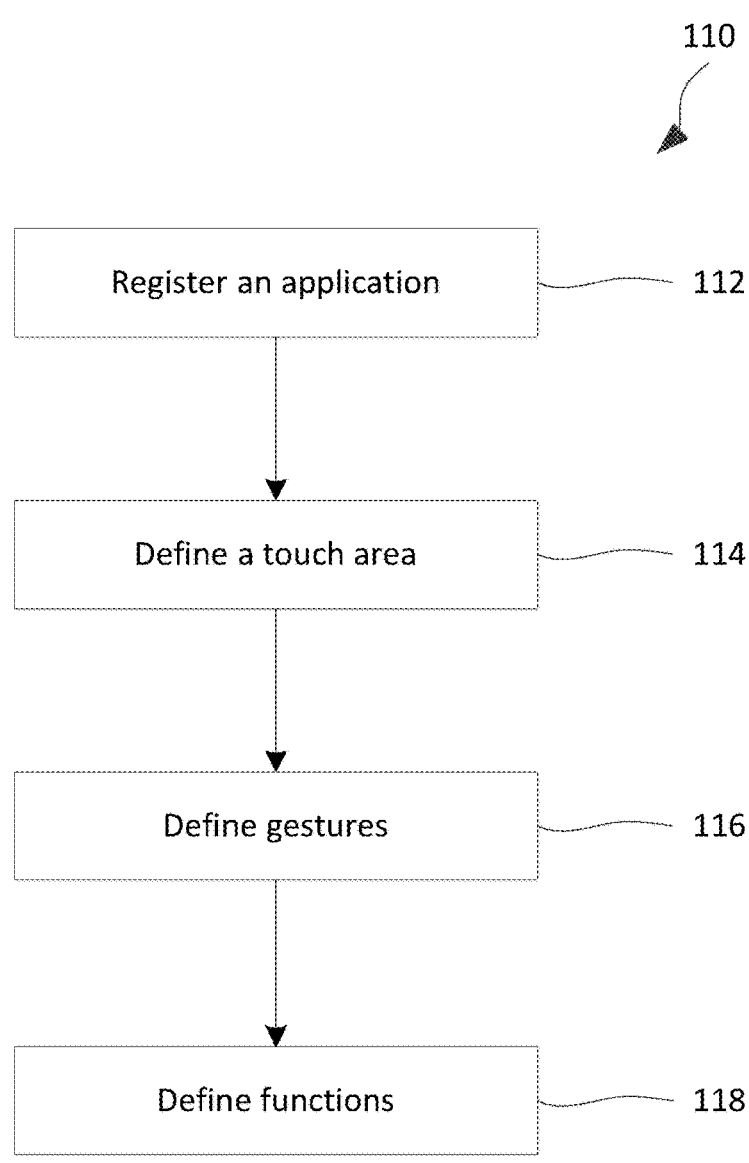
FIG. 26 shows a method of defining a mode of the keyboard.

Referring to FIG. 26, there is provided an exemplary method 110 for defining a mode of the keyboard 2000 based on the usage of an application. It will be appreciated that in practice any combination of the below steps may be performed and any of these steps may not be performed.

In a first step 112, an application is registered. This involves defining an application, or a set of applications, with which the mode can be used. More generally, this may involve defining a context, or a set of conditions, with which the mode can be used, where this context may for example relate to a user of the keyboard 2000 or a feature of a file that is being considered. The conditions may be determined by the user or may depend on the application.

This step may also comprise defining conditions for entering the defined mode. As examples, the mode may be arranged to be selected upon the opening of a particular application or upon certain conditions being met, such as a toolbar being opened within an application.

In a second step 114, a touch area is defined. Typically, the default setting for the touch area is allowing use of the whole of the touch sensor for gestures; the user may however be able to define only a subset of the touch sensor as being useable for any set of gestures. In some embodiments, the user is able to define a plurality of touch areas, where each touch area may behave differently; for example, the interpretation of a gesture may depend on the touch area in which it is performed.

The definition of touch areas may comprise the selection of a limited area in which gestures are detected. Alternatively or additionally, the definition of touch areas may comprise the selection of a starting area and a finishing area, where typically the finishing area encompasses the starting area. The starting area is an area in which a gesture can be started and the finishing area is an area in which that gesture must be finished. During the performance of the gesture the user may exit the starting area so long as they remain within the finishing area.

Typically, where numerous touch areas are defined the starting areas for each touch area are not allowed to overlap; this prevents ambiguity of gestures (since the same gesture may have a different meaning in each touch area). However, the finishing areas are typically allowed to overlap to provide a large space for performing gestures.

Touch areas may be required to:

be a certain shape (e.g. rectangular);

encompass an integer number of keys;

be selected from a predetermined list of possible touch areas.

In a third step 116, one or more gestures are defined. This may comprise selecting gestures from a list of existing gestures or defining new gestures. New gestures may be defined by these gestures being performed by the user and recorded by the keyboard 2000.

Defining a gesture may comprise: selecting a category of the gesture (e.g. is it a 'movement' parallel to the keyboard 2000 or a 'tap' perpendicular to the keyboard); selecting configuration parameters, such as a required speed or distance; selecting an output; selecting a priority; and/or defining a tolerance (e.g. how similar a gesture needs to be to a model gesture to be registered). Exemplary parameters for gestures are shown in Table 1 below:

TABLE 1

| | | | | |
|---|---|---|---|---|
| exemplary gesture parameters | | | | |
| Name | Category | Configuration parameters | Output | Default reaction |
| One finger moving | moving | Axis magnet, acceleration (on/off), speed, inertia | x, y | Pointer |
| Two fingers | moving | "flow", axis magnet, acceleration (on/off), speed, inertia | x, y | Scroll (default) |
| Three fingers moving | moving | "flow", axis magnet, acceleration (on/off), speed, inertia | x, y | Drag (default) |
| Four fingers moving | moving | "flow", axis magnet, acceleration (on/off), speed, inertia | x, y | |
| On finger tap | taps | | Event (press, release, tap) | Left click |
| Two fingers tap | taps | Event | Event (press, | Right click |

TABLE 1-continued

| | | | exemplary gesture parameters | |
|---|---|---|---|---|
| Name | Category | Configuration parameters | Output | Default reaction |
| | | | release, tap) | |
| Three fingers tap | taps | Event | Event (press, release, tap) | |
| Four fingers tap | taps | Event | Event (press, release, tap) | |
| One finger swipe | swipes | | Direction (left, right, up, down), length (one keycap, two keycaps . . . ) | |
| Two fingers swipe | swipes | | Direction, length | |
| Three fingers swipe | swipes | | Direction, length | |
| Four fingers swipe | swipes | | Direction, length | |
| Pinch two fingers | pinch | | Length between fingers | zoom |
| Pinch three fingers (1 + 2 fingers) | pinch | | Length between fingers | |
| Grab in/out | grab | | | |
| Rotate | rotate | | | |

Gestures may comprise mode-switching gestures and/or function operating gestures.

Gesture parameters typically relate to the performance of the gesture and may also comprise:

a flow, that is how the gesture interacts with other gestures (e.g. what happens if a third finger is added when scrolling with two fingers—does this change to a three finger scrolling gesture?)

an inertia (e.g. once a gesture has started, when does it end?)

an axis dependence (e.g. a scrolling gesture may be able to cause scrolling in each direction or may be limited to cause scrolling in only one of the x and y direction).

In a fourth step 118, one or more functions are defined in relation to the defined gestures. Typically, this comprises linking a function to the gesture, where this may comprise performing a gesture and then selecting a function that should be triggered by the gesture.

The method may further comprise defining a type of output; for example, the user may be able to determine whether the keyboard 2000 outputs gesture data or touch point data (where a device connected to the keyboard 2000 may need to interpret this touch point data).

Exemplary functions that may be associated with a gesture include: pointer movement; directional pad input; scrolling; dragging an object; zooming; clicking (left/right/middle clicks); operating shortcuts. More generally, any function performable by an external device may be associated with a gesture.

Figure 27A:
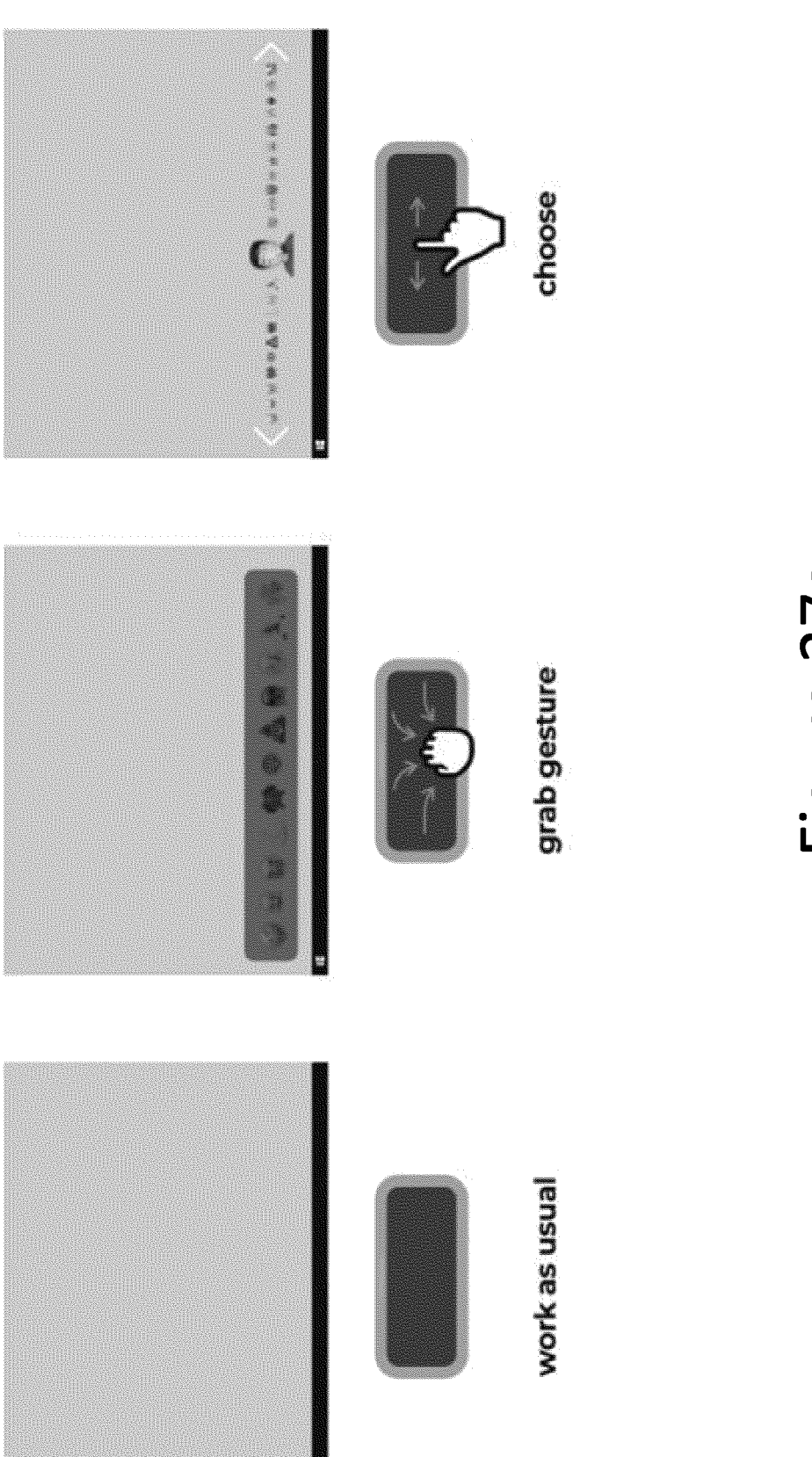
FIGS. 27*a*-27*c* show exemplary operations that may be carried out using the touch sensor of the keyboard.
Figure 27B:
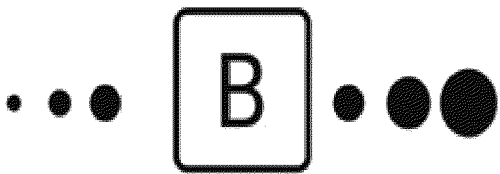
Figure 27C:
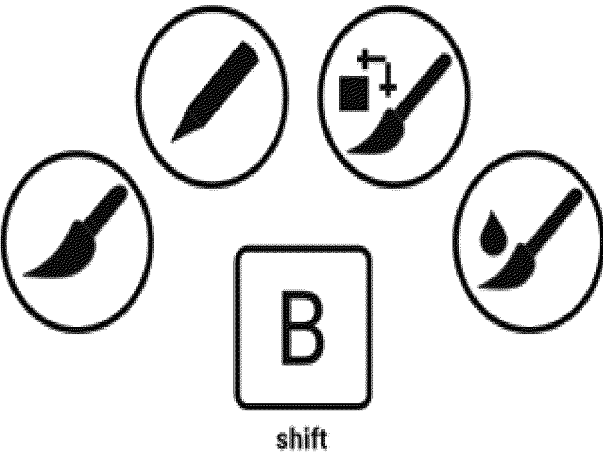

Referring to FIGS. 27a-27c, there are shown exemplary gestures that may be used with the keyboard 2000.

Referring to FIG. 27a, the use of the keyboard 2000 to select an emoji from a list is shown. Here a grabbing gesture is useable to select an emoji mode and a scrolling gesture is thereafter useable to select an emoji from a list.

Referring to FIGS. 27b and 27c, the use of the keyboard 2000 to operate an image processing program is shown. Here a hotkey is used to select a function, e.g. 'B' may open a brush size menu, and a scrolling gesture is then useable to select a brush size. A different hotkey, e.g. 'shift+B', opens a different menu. The same scrolling gesture (or a similar gesture) is then useable to select a type of brush. These selections can be performed wholly using the keyboard 2000, which enables quicker selection than the conventional method of using hotkeys to open the menus and then selecting an option using a separate touchpad or mouse.

In some embodiments, the touch areas are indicated to the user. This indication may comprise the use of coloured keys, and/or or transparent or translucent keys that enable the user to see a touch area of the keyboard 2000. In some embodiments, the backlight is arranged to indicate one or more touch areas; in embodiments with multiple different touch areas different colours and/or patterns may be used to indicate different touch areas. The use of the backlight enables a variety of sizes and shapes of touch areas to be indicated, where the indication method (e.g. the colour) may be selected by a user.

In some embodiments, the active mode is indicated to the user. Typically, this comprises using the backlight to indicate the mode. Different indications, e.g. different colours, may be used for each modes, e.g. a pointer input mode may be indicated by a red backlight where a keypress mode is indicated by a green backlight. Typically, the user is able to select the indication.

In some embodiments, touch gestures are indicated to the user by the keyboard 2000; as an example, the backlight may be used to indicate gestures by leaving a light trail as the user touches the keyboard 2000.

Exemplary Layers

Figure 28A:
Figure 28A:
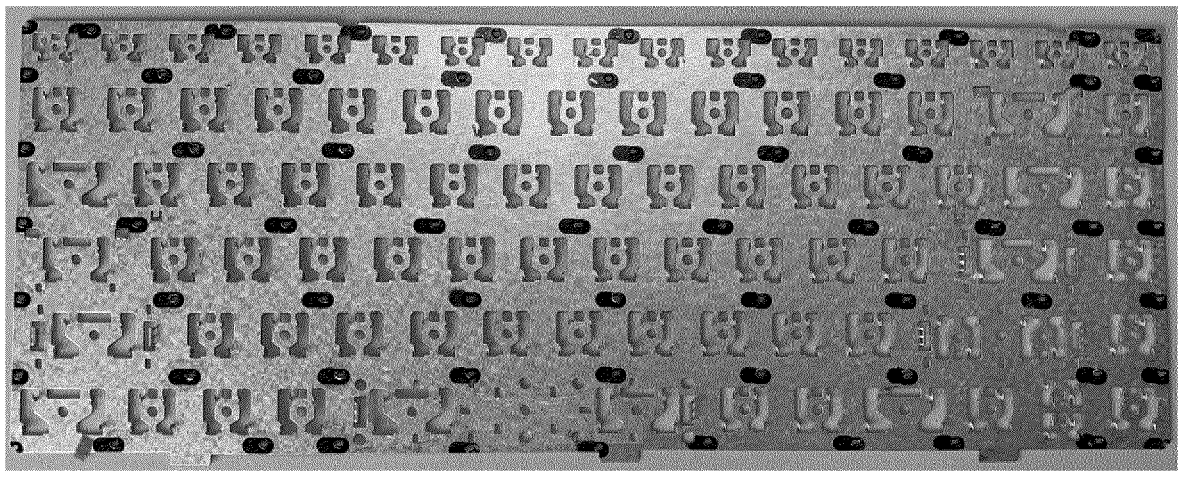
Figure 28B:
Figure 28B:
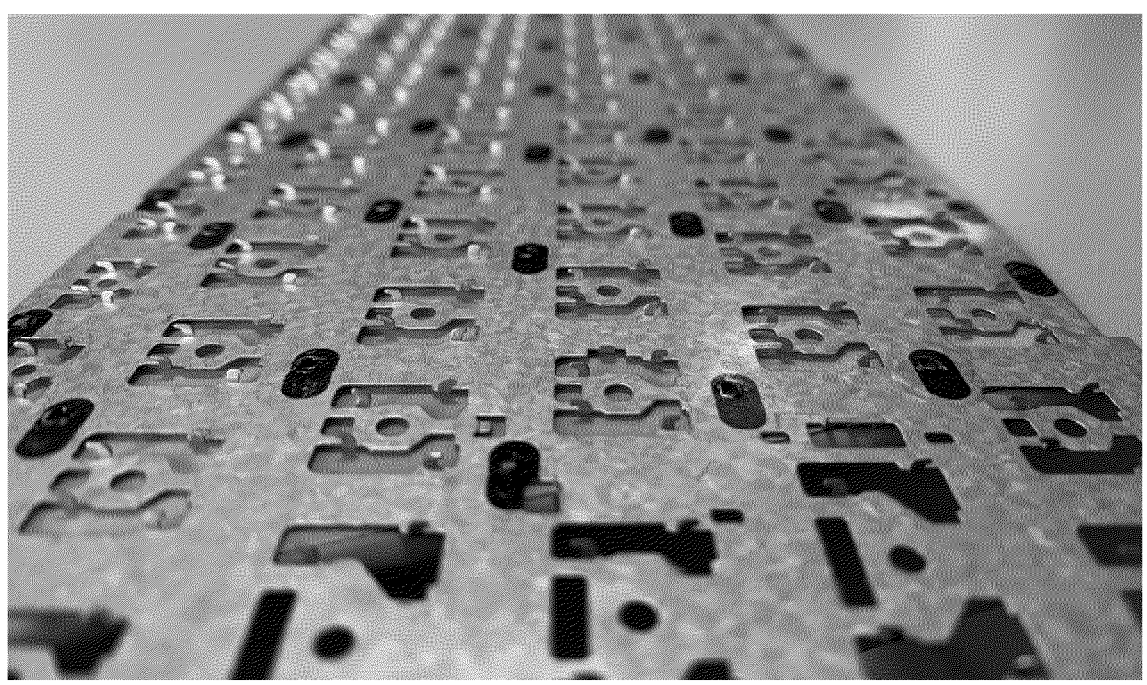

Referring to FIGS. 28a-28l, there are shown views of various exemplary layers of the keyboard 2000, specifically:

Referring to FIGS. 28a and 28b, an example of the base plate 2010 is shown, where this base plate comprises the hook mounts 2012 for mounting the keypress mechanisms.

Figure 28C:
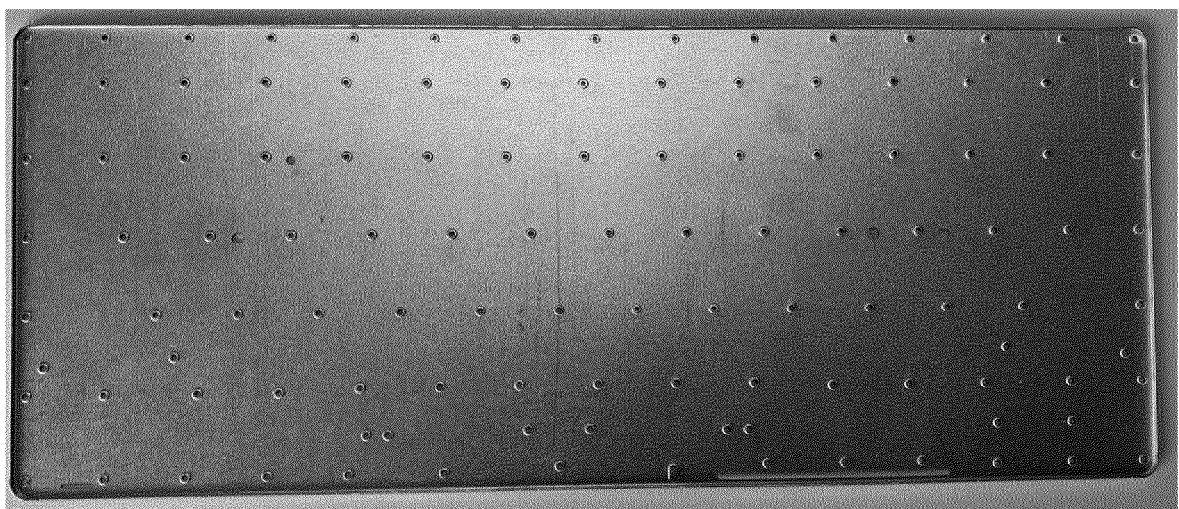

Referring to FIG. 28c, an example of the base plate 2010 is shown, where this base plate does not comprise hook mounts. This base plate is suitable for use with a keyboard that comprises a separate mounting layer on which the keypress mechanisms 2040 are mounted.

Figure 28D:
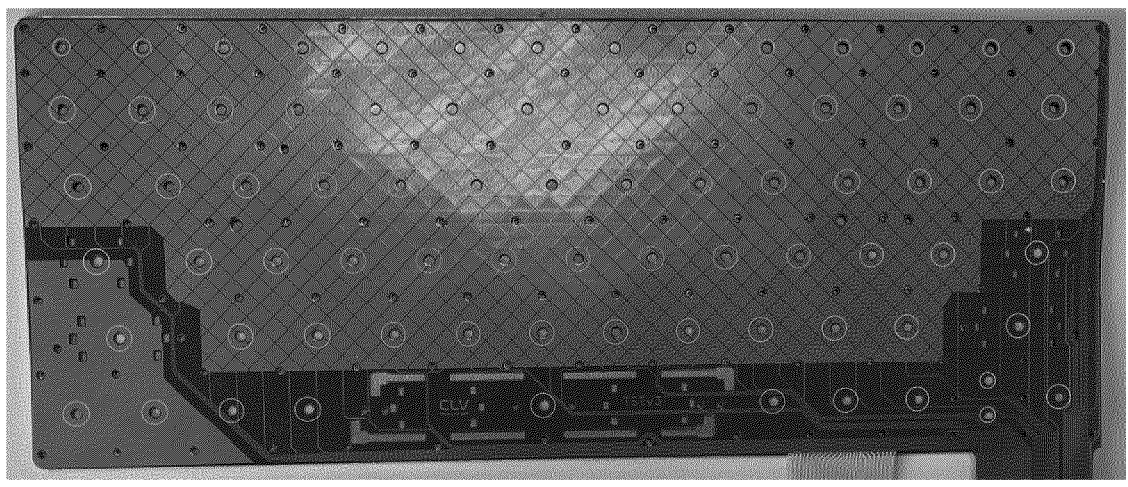

Referring to FIG. 28*d*, an example of the touch layer 2060 is shown. The touch layer 2060 comprises holes, e.g. holes for the hook mounts 2012 of the base plate 2010.

Figure 28E:
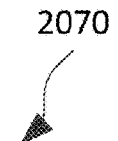
Figure 28E:
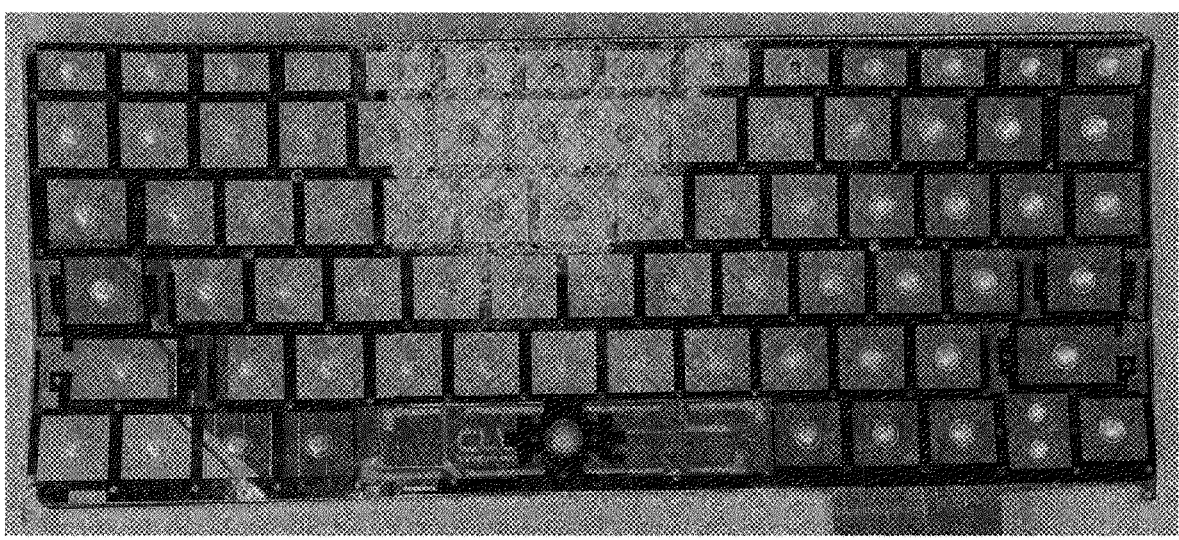

Referring to FIG. 28*e*, there is shown an example of the transmittal layer 2030 of silicone domes 2032 affixed to the touch sensor layer 2060. In this figure it can be seen that the silicone domes 2032 are coincident with the holes of the touch sensor layer 2060, and the holes of the touch sensor layer 2060 are arranged to be located underneath the centre of the keys 2002 of the keyboard 2000.

Figure 28F:
Figure 28F:
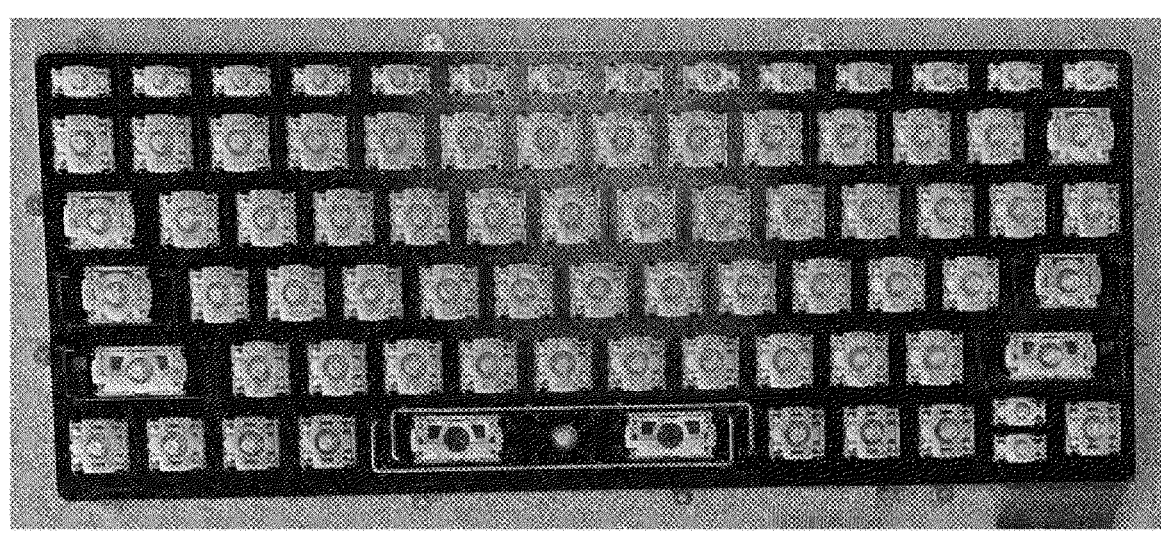

Referring to FIG. 28*f*, there is shown an example of the keypress mechanisms 2040 affixed to the touch sensor layer 2060. From this figure it can be seen that the spacebar comprises a further wire keypress mechanism (along with the two 'normal' plastic keypress mechanisms. This further keypress mechanism is useable to improve the user experience of larger keys, where the normal keypress mechanism alone is not sufficient to ensure consistent, stable travel. The wire keypress mechanism may affect the operation of the touch sensor layer 2060, and so the touch sensor layer 2060 may be sized so as to not pass beneath the wire keypress mechanism.

Figure 28G:
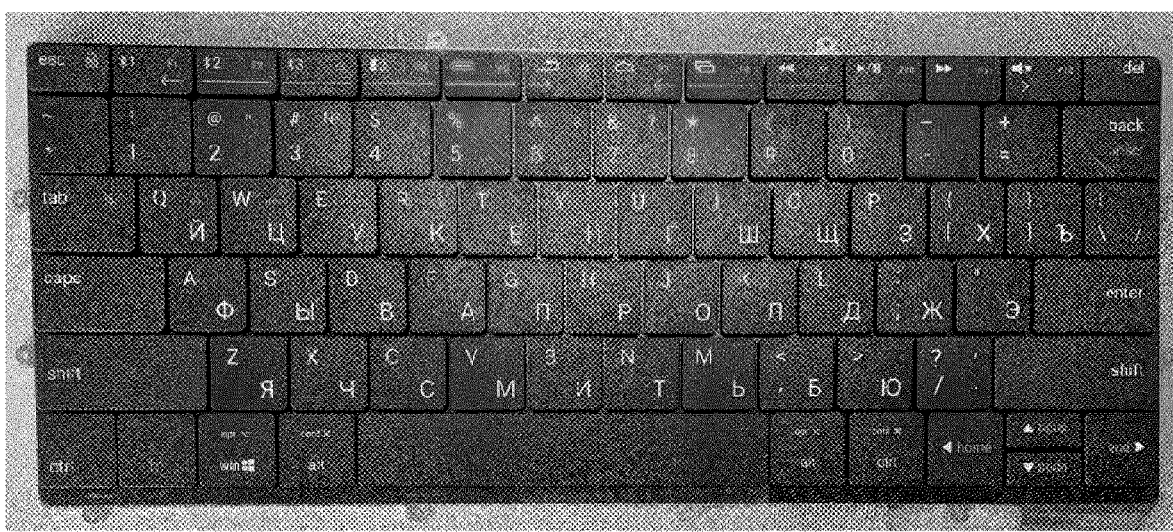

Referring to FIG. 28*g*, there is shown an example of the keycaps 2050 attached to the keypress mechanisms 2040. In the bottom right of FIG. 28*h*, there is also shown two control connections—these control connections connect the keypress sensor layer 2020 and the touch sensor layer 2040 to a control unit of the keyboard 2000.

Figure 28H:
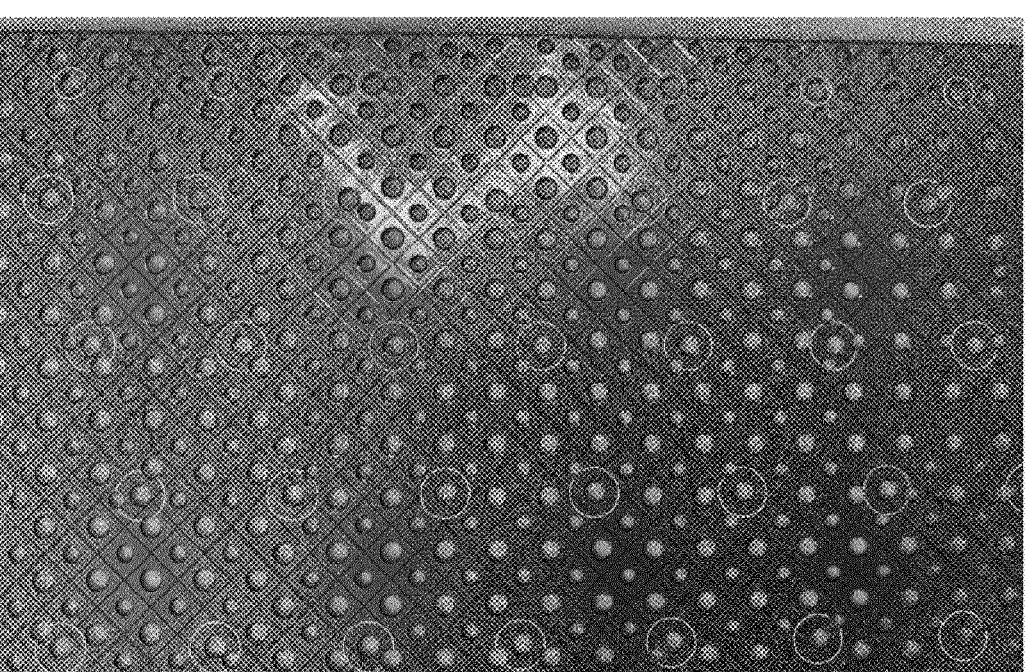

Referring to FIG. 28*h*, there is shown another example of the touch sensor layer 2060. As compared to the example shown in FIG. 28*d*, the example of FIG. 28*h* contains more holes. These further holes may improve e.g. the passage of light through the touch sensor layer 2060.

Figure 28I:
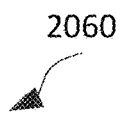
Figure 28I:
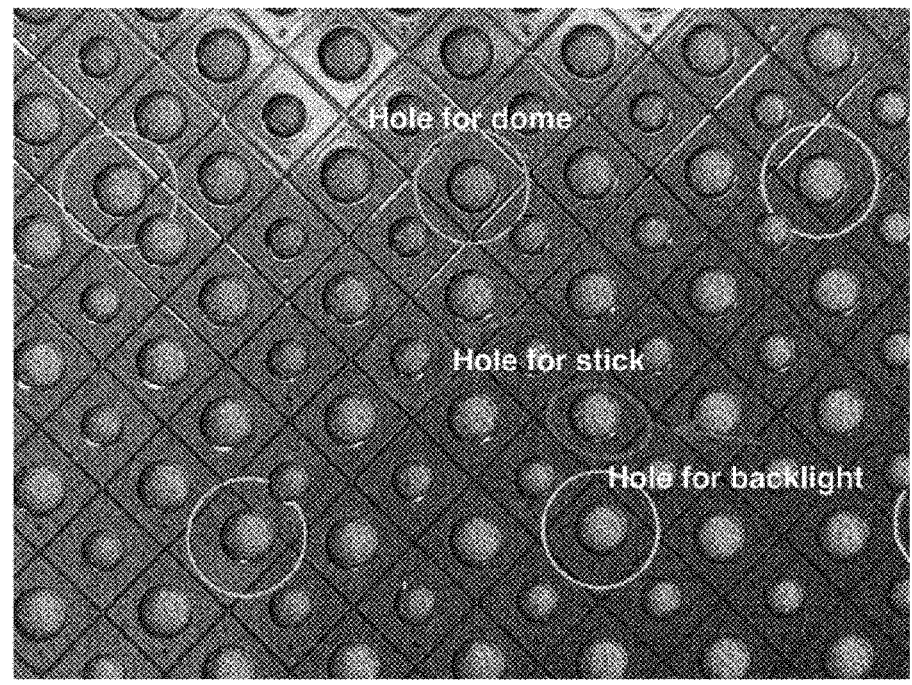

Referring to FIG. 28*i*, the touch sensor layer 2060 of FIG. 28*h* is shown in more detail. In particular, FIG. 28*i* shows how holes may be provided for different purposes, and these holes may differ (e.g. be of different sizes). In particular, FIG. 28*i* shows:

holes for transmittal mechanisms 2030 ('domes');

holes for attachment mechanisms, such as hook mounts 2012, ('sticks'); and holes for light ('backlight').

FIG. 28*i* also shows how the holes are arranged so as to not overlap with the edges or intersections of the electrodes of the touch sensor layer 2060. While in the example of FIG. 28*i*, there exist certain holes that do overlap with the edges of electrodes, it will be appreciated that according to the present disclosure a touch sensor may be provided where each hole does not overlap the edge of an electrode. This being said, preferably the touch sensor is arranged so that none of the holes of the touch sensor overlaps the edge of an electrode.

Figure 28J:
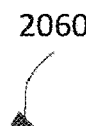
Figure 28J:
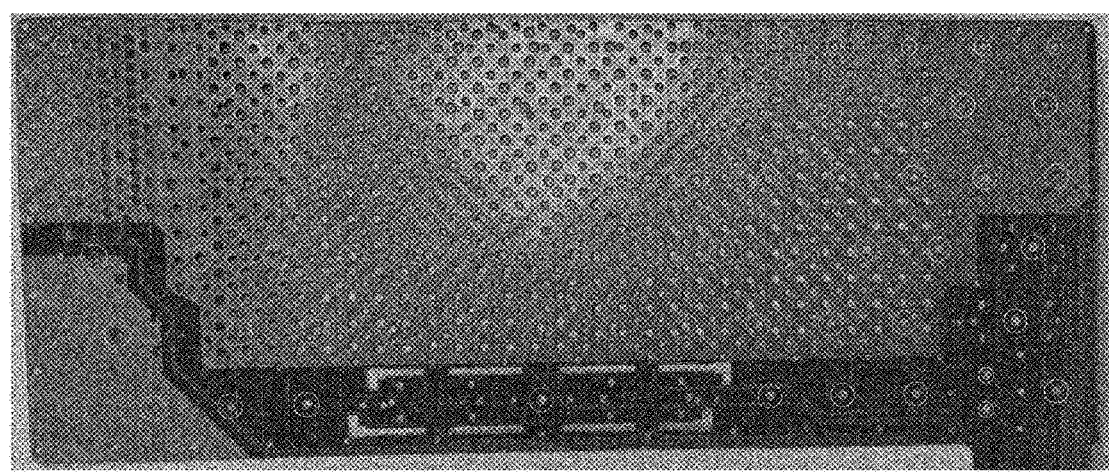

Referring to FIG. 28*j*, the touch sensor layer 2060 of FIGS. 28*h* and 28*i* is shown again. In the view of FIG. 28*j*, it can be seen that the holes of the touch sensor layer 2060 may be arranged in different patterns depending on the area of the keyboard 2000. For example, in areas with fewer keys, fewer holes are needed for transmittal mechanisms.

Figure 28K:
Figure 28K:
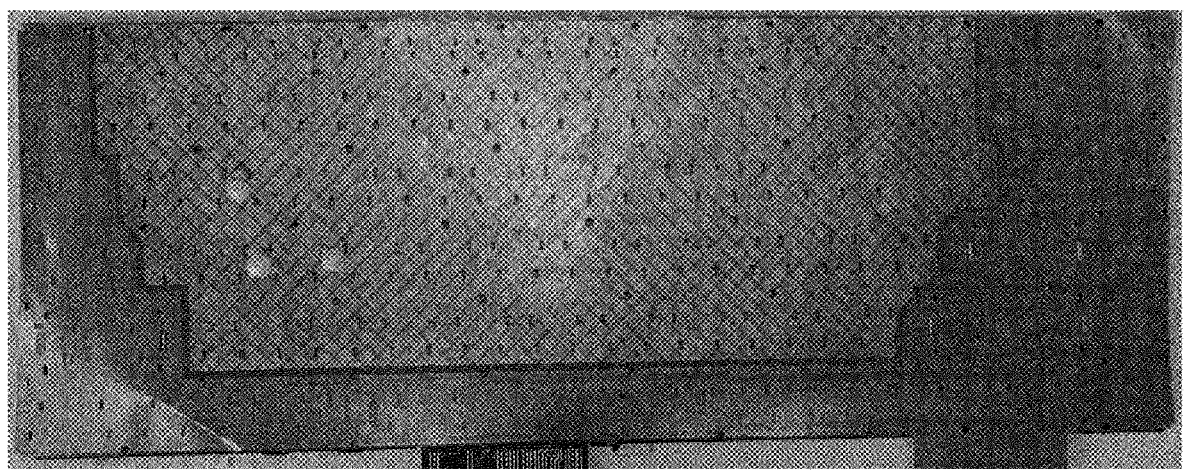

Referring to FIG. 28*k*, there is shown an example of the touch sensor 2060 that contains holes for the hook mounts 2012 of the base plate 2010. As shown by FIG. 28*k*, the holes for hook mounts are typically of an oval shape. In general, the holes for each purpose may be of any shape and/or size. Typically, the holes for the transmittal mechanisms 2030 and/or the holes for the backlight are circular; typically, the holes for the hook mounts 2012 depend on the shape of the hook mounts 2012, and may be rectangular.

Figure 28L:
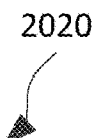
Figure 28L:
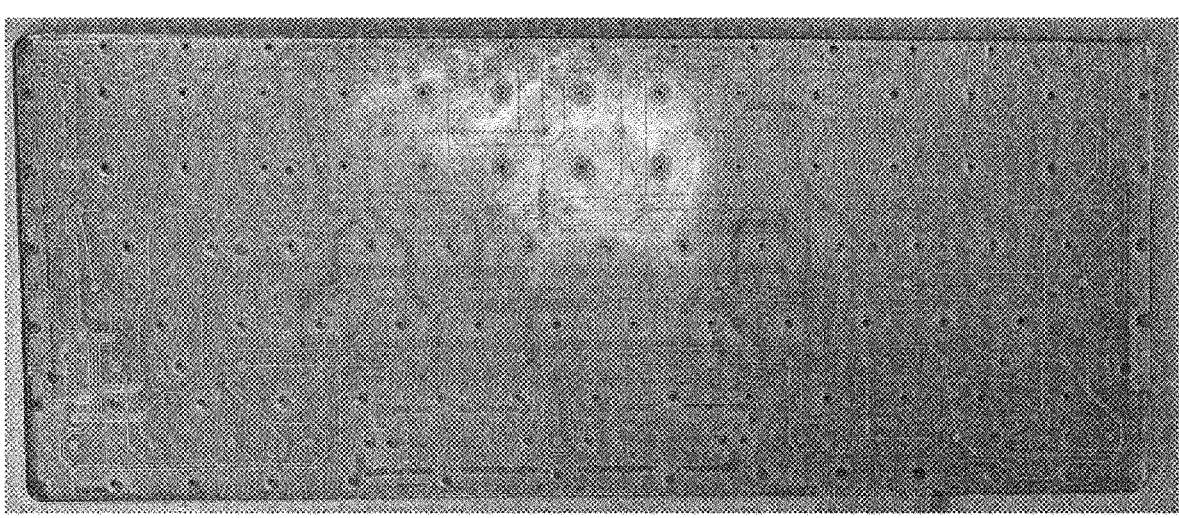

Referring to FIG. 28*l*, there is shown an example of the keypress sensor 2020. FIG. 28*l* shows the individual keypress sensor elements arranged in a grid corresponding to the layout of the keys 2002 of the keyboard 2000.

Figure 29A:
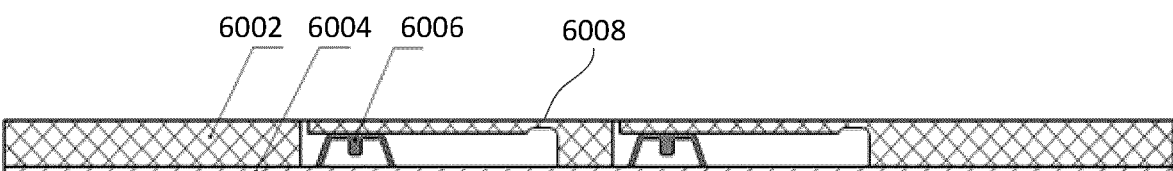
FIGS. 29*a*-29*c* show an exemplary embodiment of the keyboard comprising a flat key plate.
Figure 29B:
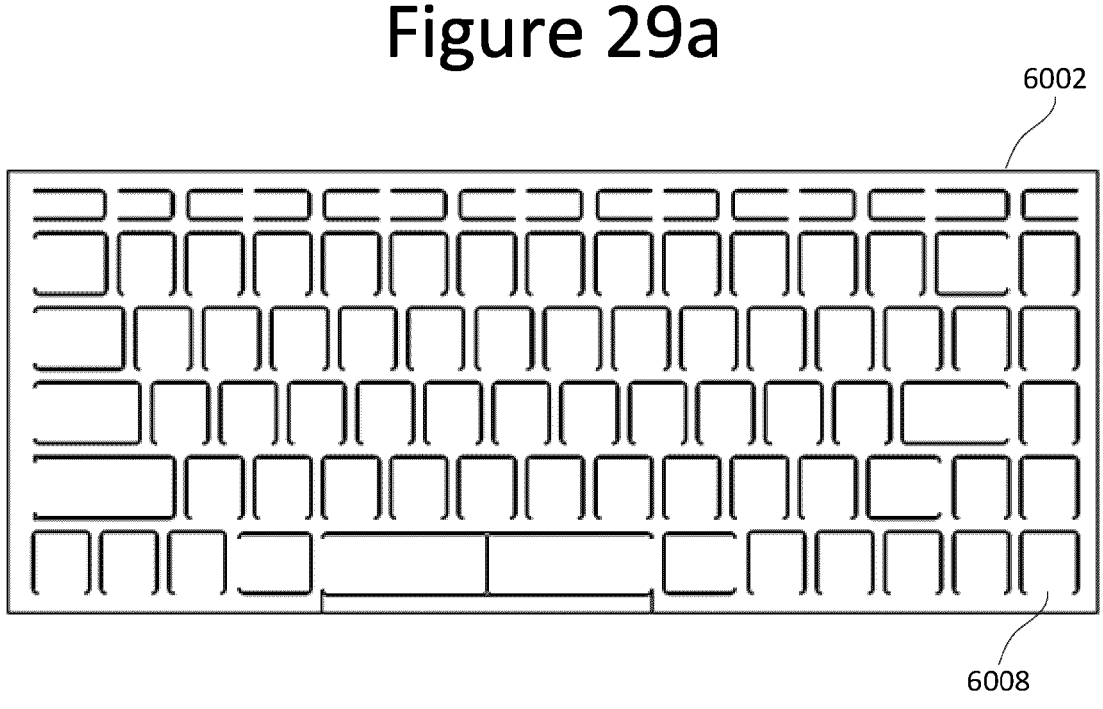

Referring to FIGS. 29*a* and 29*b*, there is described an embodiment of the keyboard in which the keys are provided as a part of a plate; this arrangement enables the provision of a flat surface for the keys, which can also be used as a flat touch surface.

Referring to FIG. 29*a*, there is provided a key plate 6002 comprising one or more keys, a keypress sensor structure 6004 below the key plate 6002, and an actuation mechanism 6006 between each of the keys and the keypress sensor structure 6004.

The keypress sensor structure 6004 typically comprises the keypress sensor layer 2020 described above; equally, the keypress sensor structure 6004 may comprise the touch sensor layer 2060, which touch sensor layer 2060 may be arranged to detect keypresses as has been described above.

The actuation mechanism 6006 typically comprises the keypress mechanism 2040 and/or the transmittal mechanism 6030, which is arranged to interact with the keypress sensor structure 6004 (e.g. by contacting the keypress sensor structure 6004) and/or to provide a return force to a key once that key has been pressed. The actuation mechanism 6006 may also and/or alternatively comprise the coating 2034, which coating is arranged to interact with the touch sensor layer 2060 so as to register a keypress.

In some embodiments, the actuation mechanism 6006 is not provided. Here a keypress may be sensed by a portion of a key interacting with the keypress sensor structure 6004 and/or the touch sensor layer 2060 detecting that a user's finger has passed beneath the plane of the key plate 6002.

In the embodiment shown in FIGS. 29*a* and 29*b*, each key is attached to the key plate 6002 along only a single side, this enables the key to resiliently rotate about this single side of attachment so as to depress the actuation mechanism 6006. The keys comprise a resiliently deformable material so that once the user has released a key it will return to its original position (e.g. without substantial plastic deformation). The keys may be attached to the key plate 6002 along the entirety of this single side and/or along only a subset of the single side.

Typically, the keys are an integral part of the key plate 6002, where this plate may be formed of a thin metal and/or plastic. The stiffness of the metal or plastic (or more generally the stiffness of any material that is used to form key plate 6002) may be arranged to provide a pleasant user experience, where depressing the key takes an amount of force comparable to conventional keyboards (e.g. in the range of 1 to 100 gram forces depending on user preferences).

By having each key attached to the key plate 6002 at an attachment point 6008 that is along only a single side of the key, the unattached end of the keys can be arranged to be depressed below the level of the keyplate by a substantial distance (e.g. by at least 0.5 mm, at least 1 mm, and/or at least 2 mm), which may reduce the acclimation period for a user that is used to more conventional keyboards. This attachment point may comprise a single pieces of material and/or a plurality of pieces of material (e.g. two pieces that are spaced from each other).

Typically, the keys are attached to the key plate 6002 along a short side and/or so as to maximise the depression distance of the keys; as an example, rectangular keys are typically attached to the key plate 6002 along one of their short sides. For particularly elongated keys (e.g. the space-bar) this may result in excess depression of the keys and/or a lack of stiffness in the keys. Therefore, some keys may be attached along their longer side and/or some keys that are typically provided as a single key may be provided as a plurality of keys.

Figure 29C:
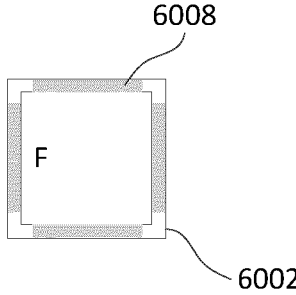

More generally, the keys may be attached to the plate around any and/or all of the perimeter of the keys, where the keys are formed of a resiliently deformable material that enables the keys to be depressed. Typically, each of the keys is attached to the key plate 6002 around only a subset of the perimeter of the key as is shown in FIG. 29c. More specifically, FIG. 29c shows an 'F' key attached to the key plate 6002 at a plurality of attachment points 6008 along the sides of the key. When the key is pressed, these attachment points 6008 resiliently deform; when the user releases the key, the key then raises, e.g. due to a return force exerted at these attachment points 6008 and/or due to a return force provided by the actuation mechanism 6006.

As in the example of FIG. 29c, the key may be attached to the key plate 6002 along each side of the key (and/or a subset of each side of the key) and/or along a plurality of opposing sides of the key. These attachment structures can be used to provide a key that resists lateral movement as it is being pressed.

With these embodiments, the key is level with, or beneath, the plane of the key plate 6002 at all times so that the key plate 6002 is user friendly for a user entering a touch input (e.g. running their hand across the keys to scroll).

To provide a thin keyboard, the keys may be arranged to be depressed below the level of the key plate 6002 by distance of less than 1 mm, less than 0.5 mm, and/or less than 0.2 mm. Furthermore, the keyboard 2000 may be provided without the keypress mechanisms 2040 and/or the transmittal mechanisms 2030 (where the keys themselves provide the return force).

In some embodiments, the attachment between each key and the key plate 6002 is arranged to have a lower stiffness than the key plate 6002; this may comprise the attachment having a lower cross-sectional area than the remainder of the key plate 6002 and/or the attachment being formed of a different material.

Typically, the keys are formed as an integral part of the key plate 6002. In some embodiments, in order to enable replacement of damaged keys, the keys are removably attached to the key plate 6002, e.g. using an attachment mechanism (e.g. a push fit) that enables the keys to move relative to the plate.

The distance of travel of each key is typically limited by the actuation mechanism 6006. Equally, the distance of travel may be limited by the keyboard impacting another component (e.g. the protective layer 2070) and/or by dedicated key stops.

Typically, the keys are arranged to be level with an upper plane of the key plate 6002 in a raised position; this provides a flat plate that is pleasant to use as a touch sensor. The keys may alternatively be raised slightly above this flat plate in the raised position so that the force required to depress the key increases as the key is initially depressed (and the attachment points 6008 are compressed). The depression force may then decrease as the key is further depressed as the key moves beneath the plane of the key plate 6002. Equally the keys may remain above the key plate throughout the keypress. A similar feel can be achieved by locating the attachment points 6008 for each key beneath the uppermost plane of the key plate 6002 (where the keys may be are flush with the key plate in a raised position).

In some embodiments, the attachment points comprise a first part that located on the uppermost plane of the key plate 6002 (to provide a flat plate) and a second part that is offset from this uppermost plane. The second part may be thicker than the first part (so that initial depression is resisted until the key passes beyond the second part of the attachment points.

Equally, the return force may be provided using another component, e.g. the actuation mechanism 6006, where this other component may be arranged to provide a similar return force profile.

The key plate 6002 and the keys may be manufactured as single, integral, component. For example, the key plate 6002 may comprise a sheet of metal that is cut to provide the keys (and then, optionally, engraved to add characters to the keys). This may comprise cutting material away from the attachment points 6008 to provide areas of reduced stiffness and/or cross-sectional area as well as cutting material away from one or more sides of each key so that the key can be depressed.

Typically, the key plate is formed so as to minimise any gap between the keys and the mounting plate when the keys are in the raise position (e.g. the gaps along the sides of the key that are not attached to the key plate 6002). These gaps may be less than 1 mm, less than 0.5 mm, and/or less than 0.1 mm.

Alternatives and Modifications

It will be understood that the present invention has been described above purely by way of example, and modifications of detail can be made within the scope of the invention.

In some embodiments, the keyboard 2000 comprises buttons relating to click functions, for example a left click and a right click. These buttons may be separated from the keys of the keyboard and/or integrated with the keys of the keyboard. For example, there may be a left click and/or right click button located under the space bar. These buttons may be operable only in certain modes of the keyboard. Similarly, there may be provided apart from the keys 2002 of the keyboard 2000 specific buttons for certain functions, such as media buttons. These buttons may only be operable in certain keyboard modes, or may have functions that depend on a mode of the keyboard.

Reference numerals appearing in the claims are by way of illustration only and shall have no limiting effect on the scope of the claims.

The invention claimed is:

1. A keyboard comprising:

a base plate;

a touch sensor comprising one or more holes; and one or more keys, wherein each key is associated with a corresponding keypress mechanism;

wherein the touch sensor is located between the base plate and the keypress mechanisms;

wherein the keypress mechanisms are connected to the base plate via one or more connection structures; and wherein the connection structures pass through the holes in the touch sensor.

2. The keyboard of claim 1, wherein the holes are arranged in dependence on the sensor elements and/or wherein the holes are arranged so as not to disrupt the operation of the sensor elements.

3. The keyboard of claim 1, wherein the holes are arranged so as to not overlap the edges of the sensor elements.

4. The keyboard of claim 1, wherein the holes are arranged so as to be contained entirely within the sensor elements.

5. The keyboard of claim 1, wherein the holes are arranged so as to not overlap any intersection of two or more sensor elements.

6. The keyboard of claim 1, wherein one or more of the holes are arranged so as to allow the passage of light from a backlight layer.

7. The keyboard of claim 6, comprising the backlight layer.

8. The keyboard of claim 1, wherein one or more of the holes are arranged so as to allow the passage of a transmittal mechanism that is depressed when one of the keys is pressed.

9. The keyboard of claim 1, wherein the holes are arranged so as to allow the draining of a liquid from the keyboard.

10. The keyboard of claim 1, wherein the touch sensor comprises a plurality of holes of different sizes.

11. The keyboard of claim 10, wherein the size of each hole depends on a purpose of that hole.

12. The keyboard of claim 1, wherein the touch sensor comprises a capacitive touch sensor.

13. The keyboard of claim 1, wherein the touch sensor comprises a plurality of rows and columns of sensor elements.

14. The keyboard of claim 13, wherein the sensor elements comprise electrodes.

15. The keyboard of claim 14, wherein the touch sensor is arranged so that each key of the keyboard relates to an integer number of rows and columns of sensor elements.

16. The keyboard of claim 15, wherein the keyboard comprises gaps between two or more keys of the keyboard; and wherein the touch sensor is arranged so that each key and a corresponding gap relates to an integer number of rows and columns of electrodes.

17. The keyboard of claim 1, wherein the holes are arranged in a regular pattern and/or a rhombus pattern.

18. The keyboard of claim 1, comprising one or more transmittal mechanisms located on the touch sensor, the transmittal mechanisms being arranged to deform when pressed.

19. The keyboard of claim 18, wherein transmittal mechanisms are located on top of at least a subset of the holes.

20. The keyboard of claim 1, wherein the touch sensor comprises a single sheet of material that is sized so as to lie beneath a plurality of keys of the keyboard.

\* \* \* \* \*